United States Patent
Ishihara

(10) Patent No.: US 6,771,867 B2
(45) Date of Patent: Aug. 3, 2004

(54) OPTICAL MEMORY DEVICE AND METHOD FOR FABRICATING OPTICAL MEMORY DEVICE, AND METHOD AND APPARATUS FOR LAMINATION WITH FILMY MEMBER

(75) Inventor: Kei Ishihara, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 10/356,632

(22) Filed: Feb. 3, 2003

(65) Prior Publication Data

US 2003/0178118 A1 Sep. 25, 2003

(30) Foreign Application Priority Data

Feb. 5, 2002 (JP) ........................... 2002-028605
Feb. 5, 2002 (JP) ........................... 2002-028686
Feb. 7, 2002 (JP) ........................... 2002-031471

(51) Int. Cl.$^7$ ............................................. G02B 6/10
(52) U.S. Cl. .................. 385/129; 385/147; 369/108; 356/73.1
(58) Field of Search ................. 385/14–15, 39, 385/50, 1, 29–132, 147; 427/457; 398/100; 600/145, 117; 369/118, 108; 250/231.12, 231.18; 356/27, 28, 149, 73.1; 358/474, 475, 479, 480

(56) References Cited

U.S. PATENT DOCUMENTS 5,283,777 A * 2/1994 Tanno et al. ............... 369/108
5,982,957 A * 11/1999 DeCaro et al. ............ 382/312
6,465,771 B2 * 10/2002 Ohsawa ................. 250/231.12
6,466,310 B2 * 10/2002 Nguyen et al. ............ 356/73.1
6,689,545 B2 * 2/2004 Kasama et al. ............. 430/321
2002/0118907 A1 * 8/2002 Sugama et al. .............. 385/14
2002/0183592 A1 * 12/2002 Suzuki et al. .............. 600/145
2003/0053043 A1 * 3/2003 Nguyen et al. ............ 356/73.1
2003/0128939 A1 * 7/2003 Nguyen et al. .............. 385/85

FOREIGN PATENT DOCUMENTS

| JP | 9-101735 | 4/1997 |
| JP | 11-345419 | 12/1999 |
| JP | 2000-19940 | 1/2000 |
| JP | 2002-1738 | 1/2002 |

* cited by examiner

Primary Examiner—Akm Enayet Ullah
(74) Attorney, Agent, or Firm—Oblon, Spivak, McClelland, Maier & Neustadt, P.C.

(57) ABSTRACT

An optical memory device is specifically so designed that, when an reference beam is applied thereto, the entire information area of its core layer can receive the reference beam all at a time to surely reconstruct a correct image. The optical memory device includes a core layer and a cladding layer laminated on both surfaces of the core layer. In this device, at least one interface between the core layer and the cladding layer has a concave and convex pattern for information to form a waveguide and a reference beam is introduced into the core layer through the end of the waveguide for reconstructing the information recorded in the concave and convex pattern for information, and the degree of bending, $\Delta t$, of the core layer at the end of the information area in which the concave and convex pattern for information is formed satisfies the condition represented by $\Delta t \leq d - t$, in which d indicates the vertical width of the reference beam, and t indicates the thickness of the core layer in the information area.

81 Claims, 16 Drawing Sheets

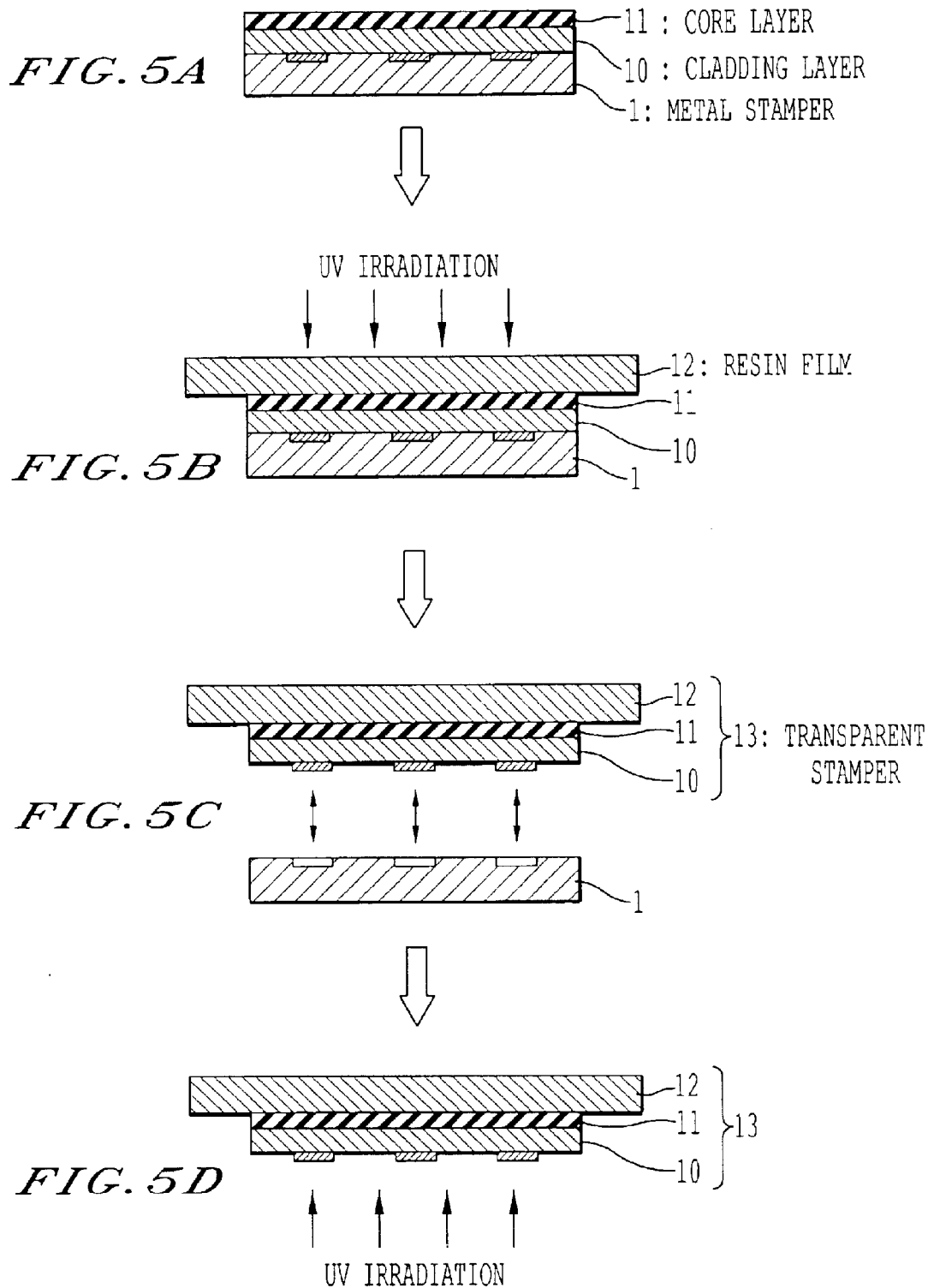

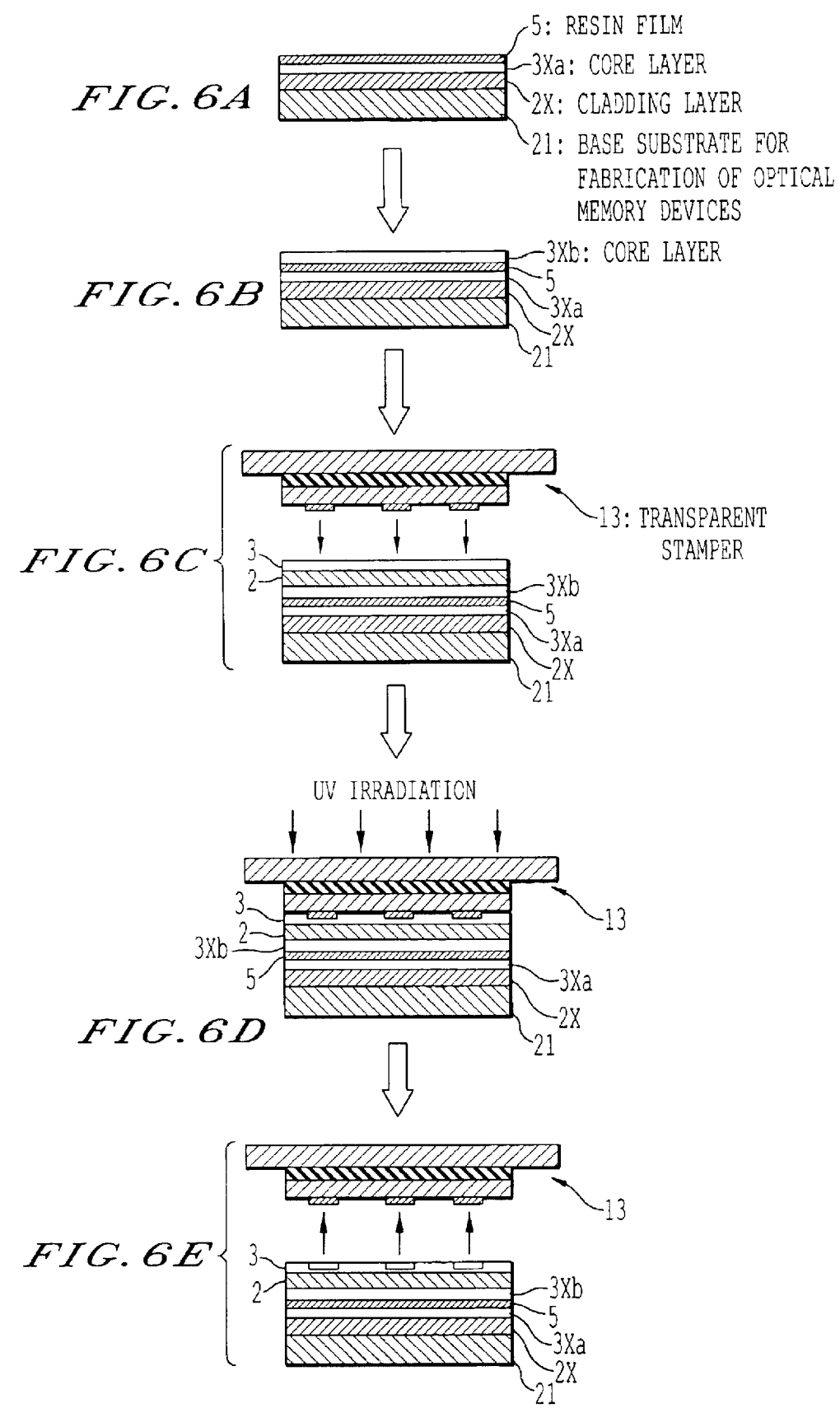

OPTICAL MEMORY DEVICE AND METHOD FOR FABRICATING OPTICAL MEMORY DEVICE, AND METHOD AND APPARATUS FOR LAMINATION WITH FILMY MEMBER

BACKGROUND OF THE INVENTION

1. Field of the Invention

The present invention relates to an optical memory device with optical waveguide fitted therein and to a method for fabricating such device, and more particularly relates to a method and an apparatus for lamination with a filmy member that is useful in fabricating such an optical memory device.

2. Description of the Related Art

One technique recently proposed in the art comprises introducing light into a flat (card-size) waveguide device that has a pattern formed therein for predetermined light scattering to reconstruct the intended image in an area outside the waveguide device (see, for example, *IEEE Photon. Technol. Lett.*, Vol. 9, pp. 958–960, July 1997).

Concretely, FIG. 18 is to schematically show one example of a card-size slab waveguide device 100 that comprises a core layer 101 and two cladding layers (first and second cladding layers) 102 disposed on both sides (both faces) of the core layer 101 to put it between them. In this, the refractive index and the thickness of the core layer 101 are specifically so controlled that the core layer functions as an optical waveguide. When a fine concave and convex pattern is formed in the interface between the core layer 101 and the cladding layer 102 and when light (incident ray, reference beam, laser ray) is introduced into the core layer (waveguide) 101 via a lens 103, as in FIG. 18, then a part of the light having entered the device scatters at the concave and convex pattern, and the scattered light goes out through the cladding layer 102 as shown by the arrows in FIG. 18.

Accordingly, when the parameters of light scattering intensity and phase for reconstructing a specific image at a predetermined distance from the face of the waveguide device 101 are computed, and when a fine concave and convex pattern (for information and for information recording) is formed in the core layer 101 in accordance with the thus-computed data, then a desired image can be reconstructed in any desired area outside the waveguide device. To that effect, therefore, the core layer 101 in this device functions as an information-recording layer.

In addition, for example, when a CCD image-receiving unit 104 capable of receiving the scattered light having gone out of the waveguide device is disposed in the predetermined site and when the reconstructed image is digitized into a two-dimensional digital pattern signal (for example, into a light/dark binary pattern, or into a brightness (gray scale-based multi-level pattern), then the reconstructed image may be processed and analyzed in any desired manner with an existing digital image processor (not shown).

FIG. 19 is to schematically show another example of a conventional optical memory device. This comprises a stacked structure of multiple cladding layers 102 and core layers 101 that are alternately laminated to form multiple waveguide layers (recording layers) 101. In this, the light having scattered at a certain waveguide layer 101 shall cross the other waveguide layers 101. In general, since the refractive index difference between the core layer 101 and the cladding layer 102 is extremely small, the light having once scattered at a certain waveguide layer 101 re-scatters little in the concave and convex pattern formed in the other waveguide layers 101, and therefore the reconstructed image is disordered little. Accordingly, in the illustrated device, a large number of images and patterns can be reconstructed in proportion of the number of the stacked layers.

This means that the waveguide device 100 can be used as an optical memory device (for recording media such as ROM), of which the capacity is proportional to the number of the stacked layers of the device. In theory, the optical memory device 100 may have a capacity of about 1 Gigabyte or so per one layer, and it is said that about up to 100 layers may be stacked up in the device. Given that situation, the waveguide device of the type is considered as a hopeful device in the future for mass-storage ROM for moving image recording.

Some other proposals have been made for improving the device. For example, the core layer and the cladding layer of the device are made of resin so as to facilitate the concave and convex patterning on the resin layers. This realizes easy and inexpensive fabrication of optical memory devices having a limited volume, but having a larger capacity for increased mass storage of information therein (for example, as in Japanese Patent Application Nos. 11-131512 and 11-131513).

Now back to FIG. 18. In a case where the information recorded in the optical memory device 100 is reconstructed, an incident ray (incident laser ray) is led into the core layer 101, as shown in FIG. 18. If the cross width of the incident laser ray (incident cross width, or that is, the width of the reference beam irradiation area in the cross direction) is too narrow, only a part of the information area where the concave and convex pattern is formed receives the incident laser ray but the other part could not, and therefore, only a part of the information recorded in the information area could be reconstructed. Accordingly, the cross width of the incident laser ray must be broader than the width of the information area.

On the other hand, if the vertical width of the incident laser ray (incident vertical width, or that is, the width of the reference beam irradiation area in the vertical direction) is broad (namely, if the incident laser ray is thick in the vertical direction), the neighboring multiple core layers shall receive the incident laser ray at the same time. Accordingly, the vertical width of the incident laser ray must be as narrow as possible so that it does not cover the neighboring core layers. Therefore, in general, the spot form of the incident laser ray is long oval, which is long in the lateral direction and is as narrow as possible in the vertical direction In conventional optical memory devices, the width of the information area is relatively narrow, and therefore, even when the device (especially the core layer therein) is warped or bent, it does not cause any serious problem in reconstructing the information recorded in the device. However, the recent tendency in the art is toward the demand for broadening the information area in optical memory devices in order to increase the quantity of information to be recorded in the devices, and, as a result, the width of the information are a in which the concave and convex pattern is formed is being broadened so as to satisfy the requirement of increasing the quantity of information to be recorded in optical memory devices.

If the width of the information area is broadened as in the above, the optical memory device (especially the core layer therein) shall naturally face the problem that it is readily warped or bent, as compared with the conventional devices where the width of the information area is narrow. As a result, the information recorded in the device having a broad information area is difficult to reconstruct.

Specifically, when the optical memory device (especially the core layer therein) is warped or bent, the entire information area where the concave and convex pattern is formed therein could not receive the incident laser ray all at a time even though the cross width of the incident laser ray is satisfactorily broad. In such a case, only a part of the information area receives the incident laser ray but the other part thereof could not, therefore resulting in image reconstruction failure.

In particular, when the information recorded in an optical memory device is reconstructed, the vertical width of the incident laser ray to be applied to the device is made narrow so that the incident laser ray does not reach the neighboring core layers of the device, as so mentioned hereinabove. Therefore, if the optical memory device (especially the core layer therein) is warped or bent, it will be more difficult to make the incident laser ray reach the entire information area of the device all at a time, and if so, the possibility of image reconstruction failure will increase.

The present invention has been made in consideration of the problems noted above, and its object is to provide an optical memory device which is so designed that the entire information area thereof can receive the reference beam applied thereto all at a time for correct image reconstruction.

In the optical memory device 100 mentioned above, it is desired to increase as much as possible the number of layers to be stacked therein for increasing the recording capacity of the device (that is, for increasing the quantity of information to be recorded in the device).

However, increasing the number of layers to be stacked makes it more difficult to reduce the inclination of the individual core layers 101 in the optical memory device 100 being fabricated. As so mentioned hereinabove, the vertical width of the incident laser ray for the device is made as narrow as possible and the form of the ray is long oval. Therefore, if the inclination of the core layers in the optical memory device 100 increases, it becomes difficult to make the entire region of one core layer 101 where the convex and concave pattern is formed (information area, information recording area) receive the incident ray (reference beam) all at a time through the end of the device 100. This means that every information recorded in one core layer 101 of the optical memory device 100 could not be reconstructed all at a time. Accordingly, it is necessary to increase the number of the layers to be stacked in the device while the inclination of each core layer 101 is reduced as much as possible.

On the other hand, when the information recorded in the multi-layered optical memory device 100 is reconstructed, the optical memory device 100 is fitted to a drive (information-reconstructing device for optical memory devices), and a flat incident ray (reference beam, such as laser ray) is led into the device 100 through its end. In that case, if the irradiation conditions of the incident ray (e.g., the irradiation position, irradiation angle, focal length, inclination of reference beam) are not good, the core layer 101 of the device 100 could receive only a part of the incident ray, and if so, the reconstructed image will be dark (its brightness will be low) and only a part of the recorded information could be reconstructed to give a defective image.

To solve the problem, it is a matter of great importance to improve the alignment accuracy of the incident ray relative to the end of the optical memory device 100. Specifically, when the information recorded in the multi-layered optical memory device 100 is reconstructed to give an intended image, it is a matter of great importance to accurately control the alignment, the angle and the inclination of the incident ray output side of the drive (e.g., the laser ray head) so that the irradiation conditions of the incident ray (e.g., the focal length, irradiation position, irradiation angle, inclination of reference beam) could be optimized relative to the optical memory device 100 fitted to the predetermined position in side the drive.

In general, for appropriately controlling the irradiation conditions of the incident ray (reference beam) (e.g., the focal length, irradiation position, irradiation angle, inclination the incident ray) relative to the optical memory device 100, the alignment, the angle and the inclination of the incident ray (from laser source or through lens) must be suitably controlled relative to the optical memory device 100. The alignment control includes, for example, <1> vertical alignment control (Z-directional alignment control), <2> spacing alignment control (Y-directional alignment control—alignment control between the optical memory device 100 and the light source, or alignment control in the direction parallel to the incident ray-running direction), <3> horizontal alignment control (X-directional alignment control—alignment control in the direction perpendicular to the incident ray-running direction), <4> elevation angle control (angle control, alignment control for rotation direction), <5> vertical inclination control, and <6> horizontal inclination control, as shown by the corresponding circled numbers in FIG. 18. For controlling the alignment, the angle and the inclination of the incident ray, the laser source and the lens system may be moved together. For simplified description herein, however, only the lens 103 is shown in FIG. 18.

However, if the inclination θ to the vertical direction of the incident ray is controlled for every core layer 101 in every reading operation, the controlling operation is complicated and troublesome, and the reading operation will be difficult to automate. For example, in case where the incident ray is first moved in the vertical direction (Z-direction) so that a part of the incident ray may reach the core layer 101 and thereafter the incident ray is rotated to thereby control its inclination θ in the vertical direction so that the entire incident ray may reach the core layer 101 which is for information reconstruction, if the rotation center for the incident ray rotation is not positioned in the center of that core layer 101 for information reconstruction (both in the center in the thickness direction and in the center in the cross direction), the incident ray irradiation area will be off the core layer 101 when the incident ray is rotated.

In such a case, the incident ray must be again moved in the vertical direction for vertical alignment control and then it must be rotated for the inclination θ control in the vertical direction. This means that the inclination θ control in the vertical direction of the incident ray requires the repeated operation of controlling the vertical alignment of the incident ray and controlling the vertical inclination θ of the incident ray to thereby control the vertical alignment of the incident ray so that the thus-controlled incident ray is not off the core layer. Controlling the vertical inclination θ of the incident ray for every core layer 101 of a multilayer device is complicated and troublesome, and after all, reading automation from the device is difficult to attain.

In controlling the vertical inclination θ of the incident ray in the above-mentioned case, the rotation center must be all the time positioned in the center of the core layer 101 which is for information construction. For this, for example, it is necessary to detect the rotation center and to move that core layer 101 so that the center of the layer 101 is to be the rotation center. However, the apparatus for this is too much complicated and is therefore not realistic.

The present invention has been made in consideration of the problems noted above, and its object is to provide an optical memory device which is so designed that the reference beam applied thereto can reach the entire information area of every core layer to thereby correctly and accurately reconstruct the information recorded therein, not requiring any operation of controlling the incident ray inclination θ for every one of the stacked core layers, and to provide a method for fabricating the device. Another object of the invention is to provide a method and an apparatus for lamination with a filmy member that are useful in fabricating such an optical memory device.

Still another object of the invention is to provide an optical memory device which is so designed that the information recorded therein can be correctly and surely reconstructed by simple control in reading the information, not requiring any complicated reading device constitution and which is therefore suitable to reading automation, and to provide a method for fabricating the device.

Still another object of the invention is to provide a method and an apparatus for lamination with a filmy member that are effective for reducing as much as possible the inclination of an increased number of stacked layers in optical memory devices for increased mass storage.

In the optical memory devices mentioned above, it is desired to increase as much as possible the number of layers to be stacked therein for increasing the recording capacity of the devices (that is, for increasing the quantity of information to be recorded in the devices).

However, the increased number of stacked layers increases the degree of warping of the optical memory devices fabricated. As so mentioned hereinabove, the vertical width of the incident laser ray for optical memory devices is made as narrow as possible and the form of the ray is long oval. Therefore, if the warping of the core layers in the optical memory devices fabricated increases, it becomes difficult to make the entire region of one core layer where the convex and concave pattern is formed (information area, information recording area) receive the incident ray (reference beam) all at a time through the end of the device. This means that every information recorded in one core layer of the optical memory device could not be reconstructed all at a time.

Accordingly, it is necessary to increase the number of the layers to be stacked in the device while the warping of each core layer is reduced as much as possible. For this, for example, a stiff substrate may be used in fabricating the optical memory device or the thickness of the substrate may be increased so as to reduce the degree of warping of the device fabricated. For example, when 100 layers are stacked up and when the thickness of one core layer is 1.8 μm and that of one cladding layer is 30 μm, then the resin thickness to constitute the stacked core layers and cladding layers shall amount to about 3.2 mm. In such a case, even though a stiff substrate of glass is used for preventing the stacked layers from being warped, the substrate must be thick (for example, having a thickness of at least 5 mm).

If such a stiff substrate or a thick substrate is used for preventing the stacked layers from being warped, not only the thickness of the substrate increases but also the weight of the device fabricated increases. This is unfavorable since it results in the increase in the cost of the apparatus for fabricating optical memory devices (apparatus for fabricating recording media).

In addition, even if the number of the layers to be stacked could be increased while the stacked layers are prevented from being warped according to the method as above, the increase in the number of the layers to be stacked inevitably reduces the productivity of the devices to be fabricated. For example, when 100 layers are continuously stacked up, the productivity of the devices with the stacked layers therein inevitably reduces. The problem of the productivity reduction will be more serious when the number of the layers to be stacked is increased further.

The present invention has been made in consideration of the problems noted above, and its object is to provide an optical memory device of which the advantages are that the device warps little even when the number of the layers to be stacked therein is increased so as to increase the recording capacity of the device, the information recorded in the device can be correctly and accurately reconstructed, and the productivity of the device is high.

SUMMARY OF THE INVENTION

To solve the problems as above and to attain the objects as above, the invention provides the following:

An optical memory device that comprises a core layer and a cladding layer laminated on both surfaces of the core layer, wherein at least one interface between the core layer and the cladding layer has a concave and convex pattern for information to form a waveguide and a reference beam is introduced into the core layer through the end of the waveguide for reconstructing the information recorded in the concave and convex pattern for information, and wherein the degree of bending of the core layer at the end of the information area in which the concave and convex pattern for information is formed satisfies the condition represented by the following formula:

$$\Delta t \leq d - t$$

in which $\Delta t$ indicates the degree of bending of the core layer at the end of the information area,
d indicates the vertical width of the reference beam, and
t indicates the thickness of the core layer in the information area;

An optical memory device that comprises a core layer and a cladding layer laminated on both surfaces of the core layer, wherein at least one interface between the core layer and the cladding layer has a concave and convex pattern for information to form a waveguide and a reference beam is introduced into the core layer through the end of the waveguide for reconstructing the information recorded in the concave and convex pattern for information, and wherein the degree of bending, at the end of the device, of the width that corresponds to the width of the information area in which the concave and convex pattern for information is formed in the uppermost face or the lowermost face of the device satisfies the condition represented by the following formula:

$$\Delta tx \leq d - t$$

in which $\Delta tx$ indicates the degree of bending, at the end of the device, of the width that corresponds to the width of the information area in the uppermost face or the lowermost face of the device,
d indicates the vertical width of the reference beam, and
t indicates the thickness of the core layer in the information area.

Preferably, the optical memory device comprises a core layer of resin and a cladding layer of resin laminated on both surfaces of the resinous core layer, and comprises at least five waveguide blocks each having a concave and convex pattern for information formed in at least one interface between the resinous core layer and the resinous cladding layer, and in which the stacked structure of the waveguide blocks is sandwiched between thin-film base layers.

Also preferably, the optical memory device comprises a core layer and a cladding layer laminated on both surfaces of the core layer and comprises at least five stacked waveguide blocks each having a concave and convex pattern for information formed in at least one interface between the core layer and the cladding layer, wherein the stacked structure of the waveguide blocks has an end through which the reference beam is introduced into the core layer for reconstructing the information recorded in the concave and convex pattern for information, and wherein the degree of inclination of the core layer at the end of the device and relative to the standard face of the information area in which the concave and convex pattern for information is formed satisfies the condition represented by the following formula:

$$|a| \leq d-t$$

in which a indicates the degree of inclination of the core layer at the end of the device and relative to the standard face of the information area,
d indicates the vertical width of the reference beam, and
t indicates the thickness of the core layer in the information area.

Also preferably, the optical memory device comprises a core layer of resin and a cladding layer of resin laminated on both surfaces of the resinous core layer and comprises at least two stacked structure units, wherein each stacked structure unit comprises one or more waveguide blocks sandwiched between base layers and each waveguide block has a concave and convex pattern for information formed in at least one interface between the resinous core layer and the resinous cladding layer.

The invention also provides a method for fabricating an optical memory device by stacking a core layer and a cladding layer, which comprises a coating step of coating a base substrate with a photocurable resin to form thereon a core layer or a cladding layer, and a laminating step of laminating the core resin or the cladding resin with a transparent stamper which has a concave and convex pattern formed on its surface and which transmits light for curing the photocurable resin, by the use of a laminate roll applied to the transparent stamper, and which is characterized in that the transparent stamper is laminated onto the core resin or the cladding resin while the distance between the surface of the base substrate coated with the core resin or the cladding resin and the laminate roll is kept constant in the laminating step.

The invention further provides a method for fabricating an optical memory device by stacking a core layer and a cladding layer, which comprises a coating step of coating a base substrate with a resin to form thereon a core layer or a cladding layer, and a laminating step of laminating the core resin or the cladding resin with a resin film by the use of a laminate roll, and which is characterized in that the resin film is laminated onto the core resin or the cladding resin while the distance between the core resin or the cladding resin and the laminate roll is kept constant in the laminating step.

Preferably, the lamination method comprises a step of coating a base substrate with a resin material, and a step of laminating the resin layer with a filmy member by the use of a roll, and in which the filmy member is laminated onto the resin-coated base substrate while the distance between the resin-coated surface of the base substrate and the roll is kept constant in the laminating step.

The invention still provides an apparatus of lamination with a filmy member which is for laminating a base substrate with a filmy member via a resin layer therebetween, and which comprises a stage for mounting thereon the base substrate to be laminated with the filmy member, a laminate roll by which the filmy member is laminated onto the resin layer formed on the surface of the base substrate to be laminated with the filmy member, and an alignment controller for controlling the height of the laminate roll from the stage so that the distance between the stage and the laminate roll is not lower than a predetermined level.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is to show one process of fabricating a transparent stamper for use in one embodiment of the invention, illustrating schematic cross-sectional views of the stamper being fabricated. FIG. 5A is a step of forming a cladding layer and a core layer; FIG. 5B is a step of sticking a resin film to the core layer; FIG. 5C is a step of peeling (separating) the transparent stamper from the metal stamper; and FIG. 5D is a step of overcuring the transparent stamper.

FIG. 6 is to show one process of fabricating an optical memory device of one embodiment of the invention, illustrating schematic cross-sectional views of the device being fabricated. FIG. 6A is a step of laminating a resin film on a base substrate for an optical memory device; FIG. 6B is a step of forming a core layer on the resin film; FIG. 6C is a step of forming a cladding layer and a core layer on the core layer; FIG. 6D is a step of replicating a concave and convex pattern from a transparent stamper; and FIG. 6E is a step of peeling (separating) the transparent stamper from the stacked structure for the optical memory device being fabricated.

FIG. 7 is to show the overall structure of the optical memory device fabricated according to the process of fabricating the device of one embodiment of the invention, illustrating cross-sectional views of the device fabricated.

DESCRIPTION OF THE PREFERRED EMBODIMENTS

Preferred embodiments of the invention are described in detail with reference to the drawings attached hereto.

Specifically, the optical memory device (optical memory, multi-layered optical memory) of the invention and the method of the invention for fabricating the device, as well as the method and the apparatus of the invention for lamination with a filmy member are described with reference to FIGS. 1 to 27.

Figure 2:
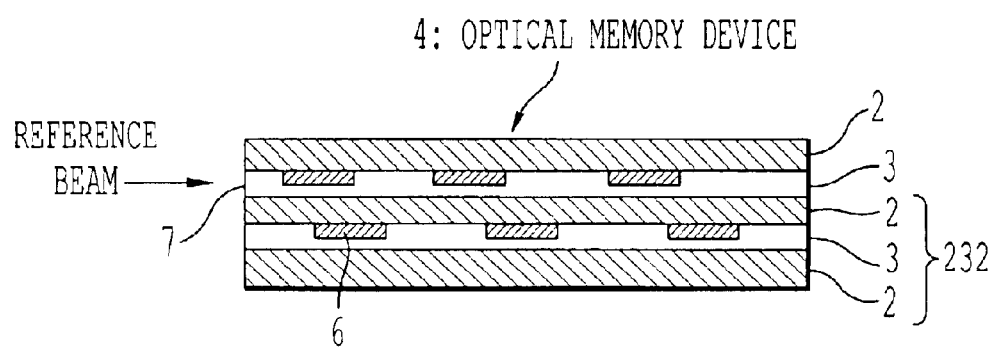
FIG. 2 is a schematic view showing the constitution of the optical memory device of one embodiment of the invention.

First Embodiment of the Invention:

FIG. 2 shows the first embodiment of the optical memory of the invention. As illustrated, the waveguide block 232 comprises a core layer 3 and a cladding layer 2 laminated on both surfaces of the core layer 3, and has a concave and convex pattern for information 6 in at least one interface between the core layer 3 and the cladding layer 2. This has an end 7 through which a reference beam is led into the core layer 3 for reconstructing the information recorded in the concave and convex pattern for information 6. Thus designed, the optical memory device 4 is constructed to have one or more other waveguide blocks 232 stacked into a stacked structure. The optical memory device 4 shown in FIG. 2 is designed to have two waveguide blocks 232 laminated into a stacked structure.

Especially for obtaining correctly reconstructed images, it is a matter of importance that the reference beam applied to the device for image reconstruction uniformly reaches the entire information area (information-recording area, data area) of the concave and convex pattern 6 for information of the core layer 3 in which the data recorded shall be reconstructed by exposure to the reference beam.

Figure 1:
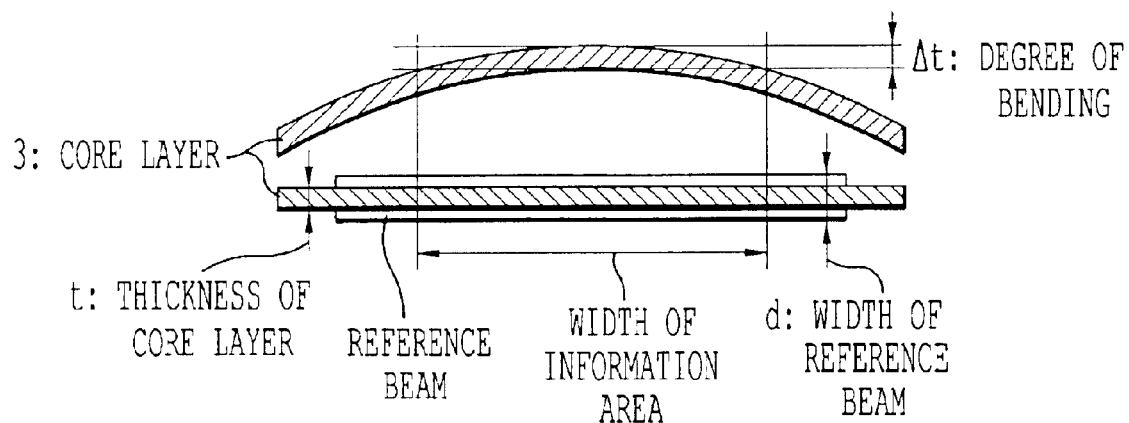
FIG. 1 is a schematic view for explaining the degree of bending of the core layer of an optical memory device of one embodiment of the invention.

For this, the present inventors have found that the "degree of bending" of the core layer 3 (especially the information area of the core layer) at the end of the optical memory device 4 shall satisfy a predetermined condition. Concretely, the degree of bending of the core layer 3 at the end 7 of the information area in which the concave and convex pattern 6 for information is formed shall satisfy the condition represented by the following formula (1):

$$\Delta t \leq d-t \qquad (1)$$

in which $\Delta t$ indicates the degree of bending of the core layer 3 at the end 7 of the information area, d indicates the vertical width of the reference beam (reference beam width), and t indicates the thickness of the core layer 3 in the information area as shown in FIG. 1.

More preferably, it shall satisfy the condition represented by the following formula (2):

$$\Delta t \leq (d-t) \times 0.9 \qquad (2)$$

even more preferably, the condition represented by the following formula (3):

$$\Delta t \leq (d-t) \times 0.8 \qquad (3)$$

The optical memory device 4 shall satisfy the condition of formula (1) as above at least while it is clamped on a reconstruction device (drive), but preferably satisfies the condition of formula (1) while it is statically mounted on the horizontal surface of the drive with no clamping force or the like applied thereto.

The "degree of bending" referred to herein indicates the expanding width of the core layer 3 in the vertical direction of the reference beam (incident beam, incident ray) within the width of the information area of the core layer 3, as shown in FIG. 1. Concretely, when the device is seen along the direction in which the reference beam runs and when the information area of the core layer 3 is considered as the simply-supported beam, then the "degree of bending" indicates the bending of the information area of the core layer between the end supports (that is, the degree of displacement in the center part of the information area of the core layer 3)

In this embodiment, the degree of bending, At shall satisfy the condition of formula (1) as above. This means that, when a predetermined face is defined as a standard face, the degree of displacement in the direction vertical to the standard face of the boundary that is above (or below) the core layer 3 within the width of the information area satisfies the condition that it is at most the width, (d−t).

In this, the standard face shall be a face relative to which the degree of bending of the core layer 3 maybe the smallest. The standard face may be any and every one capable of being defined in a three-dimensional coordinate system, and may include various faces (for example, it may be a virtual face). However, since the degree of bending of the core layer varies depending on the angle to the standard face. Therefore, in this embodiment, the standard face on the basis of which the degree of bending of the core layer 3 is determined shall be such that the degree of bending of the layer thus measured on the basis of the standard face could be the smallest. The degree of bending of the core layer 3 relative to the standard face thus defined in the manner as above is therefore defined as the degree of bending of that layer. The reference beam is led into the optical memory device in the direction parallel to the standard face.

In this case, the reference beam shall have a thickness in the direction vertical to the standard face. Therefore, the thickness of the reference beam in that vertical direction is herein defined as the vertical width of the reference beam. The vertical width, d, of the reference beam may be, for example, the half-value width of the reference beam intensity distribution.

According to the definition as above, even when the core layer 3 is inclined, the "degree of bending" of the layer can be expressed without the factor of inclination of the layer.

In this embodiment described as in the above, the relationship between the degree of bending (the degree of warping) of the core layer 3 in the information area and the irradiation area of the reference beam (incident laser ray) is specifically defined to be in a specific range so that the reference beam applied to the device may reach the entire information region of the core layer 3 which is for image reconstruction, all at a time, to thereby obtain a correct reconstructed image.

The degree of bending of the core layer 3 in the information area mentioned above may be defined by the degree of bending of the uppermost face (or the lowermost face) of the optical memory device 4. This is because the optical memory device is so fabricated that the uppermost face or the lowermost face of thereof is parallel to the core layer 3. Accordingly, it may be considered that the "degree of bending" of the core layer 3 at the end of the optical memory device 4 corresponds to the degree of bending of the uppermost face (or the lowermost face) of the device 4.

In that situation, it maybe further considered that, when the degree of bending, at the end of the optical memory device 4, of the width that corresponds to the width of the information area in which the concave and convex pattern 6 for information is formed in the uppermost face (or the lowermost face) of the device 4 satisfies the condition represented by the following formula (4), then the device 4 satisfies the condition of formula (1) as above.

$$\Delta tx \leq d-t$$

in which $\Delta tx$ indicates the degree of bending, at the end of the device, of the width that corresponds to the width of the information area in the uppermost face (or the lowermost face) of the device, d indicates the vertical width of the reference beam (the reference beam width), and t indicates the thickness of the core layer in the information area (core thickness).

In general, when the optical memory device 4 fabricated has a narrow information area width (for example, 1 mm wide) the device an readily satisfy the condition of formula (1). However, when the optical memory device 4 fabricated has a broad information area width (for example, 2 mm wide or 1 cm wide) the device could hardly satisfy the condition of formula (1) This is because of the following reasons. If the optical memory device 4 is presumed to be bent to a certain curvature, the degree of bending in the information area width is not so large when the information area width is narrow (for example, having a width of 1 mm). Of this case, therefore, the device 4 readily satisfies the condition of formula (1) and reconstructs correct images. As opposed to this, however, when the information area width is broad (for example, having a width of 2 mm or more), the degree of bending in the information area width increases, and, as a result, the device could hardly satisfy the condition of formula (1). In the device of this case, the entire information area of the core layer 3 could not uniformly receive the reference beam applied to the device all at a time, and this means that the device of this type could not reconstruct correct images.

However, the device having a broader information width may read more data at a time and is favorable for realizing more practicable memory storage. Accordingly, when such an optical memory device 4 having a broad information area width of 2 mm (especially 5 mm or more) or more is fabricated, it is a matter of great importance that the device fabricated satisfies the condition of formula (1). There is no uppermost limitation on the information area width in the device of the invention. For example, the information are a width in the device of the invention may be at most 100 mm or so.

The degree of bending may be measured, for example, by observing the end of the optical memory device 4 with a microscope.

As so mentioned hereinabove, when the information area width of the optical memory device 4 is broadened for realizing more practicable memory storage, the device 4 shall be fabricated so that its "degree of bending" satisfies the condition of formula (1) for correct image reconstruction. For more easy and inexpensive fabrication of the optical memory device 4, it is desirable that the core layer 3 and the cladding layer 2 are made of resin. In particular, it is more desirable that the core layer 3 and the cladding layer 2 are made of curable resin such as acrylic curable resin or epoxy curable resin.

In general, however, curable resin such as photocurable resin and thermosetting resin has the property of shrinking after cured. Accordingly, when core layers 3 and cladding layers 2 of curable resin are alternately stacked on the base layer 5 to construct an optical memory device 4, as in FIG. 20, and when the number of the core layers 3 and the cladding layers to be stacked is increased, then the optical memory device 4 may warp in one direction owing to the internal stress of the resin having shrunk after cured. If the device 4 has warped as illustrated, the degree of bending of the core layer 3 could not satisfy the condition of formula (1).

To solve this problem, the mechanical strength of the base layer 5 may be increased to thereby prevent the optical memory device 4 from warping. For this, however, the thickness of the base layer 5 must increase to fall between 1 and 3 mm, and the base layer 5 must be made of a stiff material such as glass or silicon. If so, the thickness of the optical memory device 4 increases and the weight thereof also increases, and it is difficult to fabricate optical memory devices 4 for practical use.

On the other hand, when photocurable resin such as UV-curable resin is used for the layers, a method may be taken into consideration of using epoxy monomers for the resin. This is because the resin formed through polymerization of such epoxy monomers does not so much shrink when cured, as compared with the resin formed through polymerization of acrylic monomers. However, the epoxy monomers capable of giving the desired resin that does not so much shrink when cured are extremely expensive, and therefore increase the production costs of the optical memory device 4 if used therein.

Even when such epoxy monomers are used in fabricating the device, the degree of cure shrinkage could not be zero. On the other hand, when the core layers and the cladding layers 2 are alternately stacked on the base layer 5 to fabricate the asymmetrically-structured optical memory device 4 which has the base layer 5 only on its one side, as in FIG. 20, the device 4 will warp even though it receives only a little internal stress. Accordingly, when such an asymmetrically-structured optical memory device 4 is fabricated, it is difficult to stably prevent the device 4 from warping even though epoxy monomers are used therein.

Even such a warped optical memory device 4 could be clamped by applying suitable force thereto while the data are read from it. That is, the warped optical memory device 4 is flattened and then the data may be read from it. However, this method is unfavorable since the drive requires an additional mechanism for the warped optical memory device 4, and, for example, the road mechanism of the drive will be complicated. In addition, the warped optical memory device 4 is inconvenient for carrying the device.

To solve such various problems, it is desirable that the stacked structure (waveguide block 232) of the resinous core layers 3 and the resinous cladding layers 2 alternately stacked to fabricate the optical memory device 4 is sandwiched between thin-film base layers 5 formed on both surfaces (upper and lower surfaces) of the stacked structure. In this sandwich structure, it is further desirable that the degree of warping and bending of the core layers 3 is reduced as much as possible to satisfy the condition of formula (1).

Figure 3:
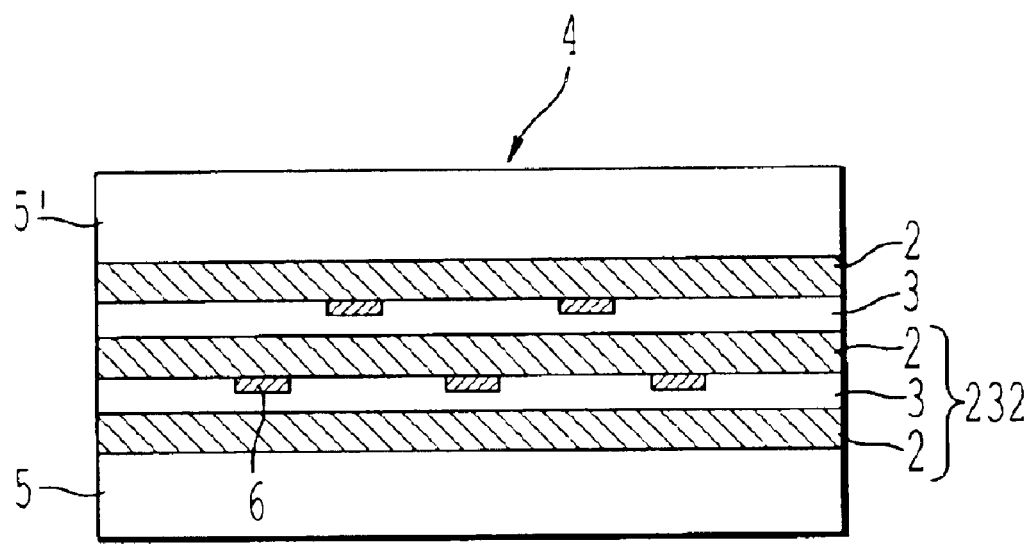
FIG. 3 is a schematic view showing the overall structure of the optical memory device of one embodiment of the invention.

Accordingly, in this embodiment, the optical memory element [stacked (flat) optical memory element, stacked waveguide hologram device, MWH device] 4 is so designed that it comprises a resinous core layer 3 and a resinous cladding layer 2 laminated on both surfaces of the core layer 3 and comprises one or more waveguide blocks (in the illustrated embodiment, two waveguide blocks) 232 each having a concave and convex pattern 6 for information for image reconstruction formed in at least one interface between the resinous core layer 3 and the resinous cladding layer 2, and in which the stacked structure of the waveguide blocks is sandwiched between thin-film base layers 5, 5' (to form a sandwich structure), as in FIG. 3.

The concave and convex pattern 6 for information is constructed to include various information of amplitude, phase, angle, etc. For example, the concave and convex pattern 6 for information may include amplitude information and phase information; or may include amplitude information and angle information; or may include amplitude information alone. The image to be reconstructed by the device is not specifically defined and may be any and every information that is formed by the optical-density from the light scattered by the concave and convex pattern 6 for information.

Having the constitution illustrated, the degree of warping (bending) of the optical memory device 4 can be reduced even when curable resin that may shrink when cured is used in forming the core layer 3 and the cladding layer 3 therein, and, as a result, the quality of the optical memory device 4 thus fabricated is high and the production costs for the device 4 can be reduced. In addition, since the optical memory device 4 has a symmetric structure (this is symmetric in the vertical direction), it may be stably prevented from warping even when epoxy monomers are used in fabricating it.

Having this structure, the optical memory device 4 is prevented from warping (bending) even though the base layer is formed of a thin film, and the condition of formula (1) is readily satisfied.

As so mentioned hereinabove, when the information area width of the optical memory device 4 is narrow, the degree of bending of the core layer 3 may well satisfy the condition of formula (1) in many cases even though any specific attention is not paid for specifically preventing the bending (warping) of the layer 3. Therefore, the sandwich structure as above is significantly meaningful in fabricating the optical memory device 4 having a broad information area width (2 mm or more, for example, 5 mm or 1 cm wide) in order that the device 4 fabricated can satisfy the condition of formula (1) in point of the degree of bending of the device 4 (especially the core layer 3 therein).

When the optical memory device 4 having the sandwich structure as illustrated is warped in one direction, one thin-film base layer 5 (or 5') expands while the other thin-film base layer 5' (or 5) shrinks. In that condition, the strength (bending strength) against the stress in the bending direction of the thin-film base layers 5, 5' is not so important, but the strength (tensile strength, compression strength) against the stress in the compression or tensile direction thereof is a matter of importance.

In general, the strength of the thin-film base layers 5, 5' against the stress in the bending direction is low, but that against the stress in the compression or tensile direction is high. Therefore, such thin-film base layers 5, 5' will be satisfactory for preventing the device 4 from warping. Preferably, however, the thin-film base layers 5, 5' have an elastic coefficient (Young's modulus) of at least $9.8 \times 10^7$ Pa, more preferably at least $4.9 \times 10^8$ Pa. Also preferably, the thin-film base layers 5, 5' are transparent in the wavelength range of the reference beam to be applied to the device 4.

Concretely, the thin-film base layers 5, 5' may be made of resin films, glass, dielectrics, etc. Of those, preferred are resin films as elastic in fabricating the device 4. For the resin films for use herein, preferred are thermoplastic resin films having good optical properties, for example, polycarbonates, amorphous polyolefins such as ARTON™ (by JSR), as well as PET (polyethylene terephthalate) and PEN (polyethylene naphthalate). Of those, PEN has good heat resistance. In particular, PET and PEN are more preferred as they readily give good films of uniform thickness.

Of the thin-film base layers 5, 5' formed of such resin films, the strength against the stress in the compression or tensile direction is good. The optical memory device 4 that comprises the resinous thin-film base layers of the type may be thinned and lightweight and is good for practical use.

The thin-film base layers 5, 5' are not limited to resin films but maybe formed of any other material such as glass capable of functioning as base layers that are effective for preventing the stacked structure (optical memory device 10) from warping (and bending) and, as the case may be, for keeping the bent structure as such.

Depending on the process of fabricating the device, however, if the base layers are desired to be flexible in laminating the other constitutive layers between them, the base layers are preferably made of resin. The resinous thin-film base layers may be formed by applying a curable resin onto a base substrate followed by drying it; or by dissolving a resin in a solvent, then applying the resulting resin solution onto a base substrate and thereafter drying it. More preferred for the base layers are resin films in view of the productivity and the workability thereof. Concretely, stampers may be repeatedly attached to and detached from the base layers made of resin films.

In order that the overall thickness of the optical memory device 4 is reduced and that the device 4 is easy to carry, it is desirable that the base layers 5, 5' are as thin as possible. For this, the thickness of the base layers 5, 5' is preferably at most 500 $\mu$m, more preferably at most 250 $\mu$m, even more preferably at most 100 $\mu$m. However, in order that the base layers must be strong enough to prevent the optical memory device 4 from warping, the thickness of the base layers will have to be at least 10 $\mu$m, more preferably at least 20 $\mu$m. In short, it is desirable that the thickness of the base layers 5, 5' falls between 10 $\mu$m and 500 $\mu$m (e.g., between 10 $\mu$m and 250 $\mu$m, 10 $\mu$m and 100 $\mu$m, 20 $\mu$m and 500 $\mu$m, 20 $\mu$m and 250 $\mu$m, 20 $\mu$m and 100 $\mu$m).

In particular, when the base layers 5, 5' are formed of a resin film, the resin film may be a thermally-stretched resin film of polycarbonate as above, or it may be formed in a mode of solvent casting of resin. For example, the resin film for the base layers may have a thickness of from 10 $\mu$m (preferably from 20 $\mu$m) to 500 $\mu$m.

Preferably, the refractive index of the base layers 5, 5' is as near as possible to the refractive index of the core layer 3 and the cladding layer 2. This is because, if there is a significant difference in the refractive index between the base layers 5, 5' and the core layer 3 (or the cladding layer 2) that constitute the stacked structure, the output light (signal light) will reflect on the interface between the base layers 5, 5' and the stacked structure, and if so, the energy of the signal light (output light) will lower and the ratio S/N will thereby lower.

Accordingly, it is desirable that the difference in the refractive index between the core layer 3 (or the cladding layer 2) that constitutes the stacked structure, and the material to form the base layers 5, 5' is at most 0.2. Precisely, it is desirable that the refractive index difference between the core layer 3 and the base layers 5, 5' is at most 0.2 and the refractive index difference between the cladding layer 2 and the base layers 5, 5' is also at most 0.2.

In fabricating the optical memory device 4 having the sandwich structure formed between the thin-film base layers 5, 5' as illustrated, the resinous cladding layers 2 and the resinous core layers 3 are alternately formed on the first thin-film base layer 5, and finally the stacked structure is covered with the second thin-film base layer 5'.

In this case, the stacked structure of the core layers and the cladding layers alternately stacked on the first thin-film base layer 5 is, before covered with the second thin-film base layer 5', asymmetric and is apt to warp in one direction. When the stacked structure has warped before it is covered with the second thin-film base layer 5' and when the thus-warped structure is covered with the second thin-film base layer 5' as it is, the warped condition will be kept as such.

If so, even if the stacked structure is formed to have a sandwich structure, the optical memory device 4 having the sandwich structure will be still warped. Even though having the sandwich structure, the warped optical memory device 4 could not satisfy the condition of formula (1) in point of the degree of bending of the device.

In order that the degree of bending of the optical memory device 4 is made to satisfy the condition of formula (1), it is desirable that the sandwich-structured optical memory device 4 is fabricated according to a process of using a transparent stamper. However, the process of fabricating the optical memory device of the invention is not limited to that of using such a transparent stamper.

The constitution and the preparation method of the transparent stamper are described below with reference to FIG. 4 and FIG. 5. As will be mentioned hereinunder, the transparent stamper 13 illustrated is used in fabricating the optical memory device 4 and is so designed that it may transmit light (e.g., UV ray) for curing the core resin and the cladding resin to constitute the device 4.

Figure 4:
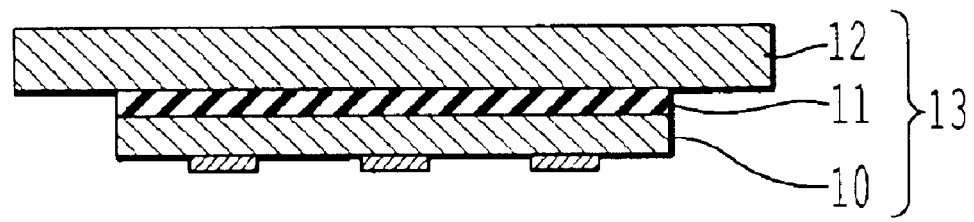
FIG. 4 is a schematic cross-sectional view showing the overall structure of a transparent stamper for use in one embodiment of the invention.

The transparent stamper (stamper for fabricating optical memory devices) 13 has a three-layered structure that comprises a cladding layer 10 which serves as a stamper layer having a stamper face with a desired concave and convex pattern (pits) formed on its surface in accordance with the information of the image to be reconstructed, a core layer 11 which serves as an adhesive layer, and a resin film (resin film layer, resinous base layer, base film layer) 12 that serves as a base (base layer), for example, as shown in FIG. 4. As illustrated, the resin film 12 is stuck to the cladding layer 10 via the core layer 11.

In this embodiment, the transparent stamper 13 is composed of the cladding layer 10, the core layer 11 and the resin film 12, and this is a flexible film stamper. In this, the cladding layer 10, the core layer 11 and the resin film 12 are all transparent to the light for use in fabricating the optical memory device of the invention (precisely, to the light (e.g., UV ray) to which the core resin and the cladding resin are exposed to cure to form the optical memory device), or that is, they all transmit light. Therefore, the cladding layer 10 will be referred to as a transparent cladding layer (e.g., UV-transmitting cladding layer), the core layer 11 will be referred to as a transparent core layer (e.g., UV-transmitting core layer), and the resin film 12 will be referred to as a transparent resin film (e.g., UV-transmitting resin film).

Of those, the cladding material for the cladding layer 10 may be a UV-curable resin material (a type of photocurable resin material) that cures when exposed to UV rays. A metal stamper (e.g., nickel stamper) 1 is prepared, which has, on its surface, a desired concave and convex pattern (pits) that corresponds to the information of the image to be reconstructed. A UV-curable resin is applied onto the patterned surface of the metal stamper, and exposed to UV rays to be cured. Thus cured, this is the resinous cladding layer 10.

For the resin film (base film) 12, preferred are thermoplastic resin films having good optical properties, for example, polycarbonates, amorphous polyolefins such as ARTON™ (by JSR), as well as PET (polyethylene terephthalate) and PEN (polyethylene naphthalate). Of those, PEN has good heat resistance. In particular, PET and PEN are more preferred as they readily give good films of uniform thickness. PET and polycarbonates are preferred to ARTON™, as stiffer.

In this embodiment, cut pieces of film are used for the resin film 12. Apart from these, a continuous film may also be used for it. Concretely, for example, a cladding resin and a core resin are applied onto the film with a die coater, a microgravure coater, a bar coater or the like, and then they are cured with a stamper applied thereto under pressure. According to the combined process, the core layer and the cladding layer are laminated on the base film that serves as a base layer to thereby construct the transparent stamper 13.

The core layer 11 functions as an adhesive to bond the cladding layer 10 to the resin film 12, and this is formed of a UV-curable resin (a type of photocurable resin). This is because the core layer 11 may serve as it is in the optical memory device fabricated herein, and it is desirable that the same material is used in forming the core layer 11 in the stamper 13 and in forming the core layer 3 in the optical memory device 4. Another advantage of the core layer 11 formed of a photocurable resin or a thermosetting resin is that the core layer 11 is highly adhesive to the resin film 12.

In the transparent stamper 13, used are the terms of core layer (core resin) 11 and the cladding layer (cladding resin) 10. However, these terms are merely used so herein, since the same resin as that for the core layer (core resin) and the cladding layer (cladding resin) to constitute the optical memory device of the invention may be used for these layers and resins 10 and 11 and, in addition, these layers 10 and 11 can be formed in the same manner of forming and curing the core layer and the cladding layer of the optical memory device, and since the same equipment may be used in forming the layers 10 and 11 of the transparent stamper and in forming the layers 2 and 3 of the optical memory device. Accordingly, the terms of the core layer 11 and the cladding layer 10 that constitute the transparent stamper 13 are not whatsoever limited to those having a specific refractive index like the core layer (core resin) and the cladding layer (cladding resin) of the optical memory device.

In this embodiment, the concave and convex pattern of the metal stamper 1 is replicated onto the cladding layer 10, which is then stuck to the resin film 12 via the core layer 11 serving as an adhesive. However, this process is not limitative. Apart from it, other various processes may be employed herein. For example, the concave and convex pattern of the metal stamper 1 is replicated onto the cladding layer 10, and this is directly stuck to the resin film 12 (in this case, the cladding layer 10 serves as an adhesive, and the resulting transparent stamper has a two-layered structure of the cladding layer and the resin film); the concave and convex pattern of the metal stamper 1 is replicated onto the core layer, and this is then stuck to the resin film via the cladding layer that serves as an adhesive; or the concave and convex pattern of the metal stamper 1 is replicated onto the core layer, and this is directly stuck to the resin film (in this case, the core layer serves as an adhesive, and the resulting transparent stamper has a two-layered structure of the core layer and the resin film).

The resin for the core layer 11 and the cladding layer 10 may be any and every one that is liquid (fluid) while applied to a base substrate and then curable. It may be any curable resin, including, for example, photocurable resins except the above-mentioned UV-curable resin, and thermosetting resins that are curable when heated. If desired, hot-melting resins are also employable for these.

In particular, the resin for the cladding layer 10 that is to be pressed with the metal stamper 1 for pattern replication thereon is not required to have a specific refractive index. For it, for example, preferred are UV-curable resins mentioned above. More preferred are acrylic, epoxy or thiol resins.

Similarly, the resin for the core layer 11 that serves as an adhesive (adhesive layer) is also not required to have a specific refractive index. For it, usable is any and every material that is transparent in the wavelength range of the light for service and does not easily peel off after stuck to the resin film 12. For example, employable are photocurable, thermosetting, cold-curable, hot-melting or two-pack adhesives, and the adhesives may be formed of any of acrylic, epoxy, cyanoacrylate, urethane or olefin resins. However, the resin for the core layer 11 is preferably so selected that its adhesiveness and compatibility with the resin film and the cladding layer to be combined with it is good.

The base layer to support the transparent stamper 13 is formed of the resin film 12. This is because the resin film 12 is readily attached to and detached from the metal stamper and is favorable in view of the productivity and the workability. However, the base layer is not limited to only the resin film 12. For it, for example, any of various curable resins may be applied to a base substrate and then cured thereon; or a resin is dissolved in a solvent, and the resulting resin solution may be applied to a base substrate and then dried thereon to form the resinous base layer.

The transparent stamper 13 that comprises the cladding layer 10, the core layer 11 and the resin film 12 has a filmy structure, but its structure is not limited to such a filmy one. For example, the stamper 13 may also be a plate stamper, and its thickness does not have any specific value.

As so mentioned hereinabove, the transparent stamper 13 is not specifically defined in point of its material and thickness, so far as it transmits light (e.g., UV ray) to which the core resin and the cladding resin are exposed for curing them in fabricating the optical memory device of the invention. For example, the material capable of transmitting UV rays to which the core resin and the cladding resin are exposed for curing them in fabricating the optical memory device of the invention includes resin, glass and quartz, and any of these may be used in constructing the transparent stamper 13. However, when the transparent stamper 13 must be laminated on a base substrate and therefore it must be flexible in the process of fabricating the optical memory device, or when the transparent stamper 13 is fabricated in the same manner as that for fabricating the optical memory device, it is desirable that the transparent stamper 13 is formed of resin.

In this embodiment, UV-curable resin is used for the core layer 11 and the cladding layer 10. Therefore, the transparent stamper 13 that comprises these layers 10 and 11 may be at least a UV-transmitting stamper capable of transmitting UV rays.

In this embodiment, the transparent stamper (film stamper, plate stamper) 13 is flat, but its shape is not limited to that illustrated herein. For example, a flexible, transparent film stamper may be wound around a roll to construct a roll stamper for use herein. The roll stamper is advantageous, as it increases the productivity in the replication process from the stamper.

Next described is a method for producing the transparent stamper 13 having the structure as above. First referred to is FIG. 5A. As illustrated, a metal stamper (original hard stamper such as nickel stamper) 1 is processed to have a concave and convex pattern (concave and convex form; pit) thereon. The concave and convex pattern formed on it corresponds to that of the image (information) to be reconstructed by the use of the optical memory device of the invention. On the patterned surface of the stamper 1, applied is a cladding resin (liquid cladding resin), and this is cured thereon to form a cladding layer having a predetermined thickness (e.g., about 6 $\mu$m). After thus cured, the concave and convex pattern of the metal stamper 1 is replicated on the cladding layer (stamper layer) 10, and the resinous cladding layer has the thus-replicated concave and convex pattern thereon (replication process). If desired, any other resin capable of functioning as the cladding layer 10 may be dissolved in a solvent, and the resulting resin solution may be applied onto the metal stamper and dried to form the intended cladding layer 10. In fact, the concave and convex pattern thus replicated on the cladding layer 10 scatters in the face of the layer like pits, for example, as in CD (compact disc).

Next, a core resin (liquid core resin, liquid photocurable resin) 11 of a UV-curable resin (a type of photocurable resin) that serves as an adhesive is applied onto the surface of the cladding layer 10 and then imperfectly cured to thereby form a core layer having a predetermined thickness (for example, about 1.8 µm after cured), as shown in FIG. 5B. If desired, any other resin capable of functioning as the core layer 11 maybe dissolved in a solvent, and the resulting resin solution may be applied to the cladding layer 10 and dried thereon.

Imperfect curing referred to herein means that the entire core resin having been applied to the cladding layer is imperfectly cured. Thus imperfectly cured, the viscosity of the core resin film to form the core layer 11 is increased and, as a result, the thickness of the adhesive layer to be made of the core resin 11 is prevented from varying in the next step of laminating the resin film 12 onto the core layer 11.

In this embodiment, the core resin 11 is imperfectly cured so as to prevent the thickness of the adhesive layer from varying in the next step of laminating the resin film 12 on the surface of the core layer 11, but the operation of imperfectly curing the core resin 11 is not in dispensable and this step may be omitted.

For example, when the resin film 12 is laminated on the core layer 11, it is pressed against the layer 11 with a laminate roll. So far as the lamination system is provided with an additional holder mechanism that keeps the resin film 12 not in contact with the core layer 11 for an adhesive layer just before the resin film 12 is pressed against the core layer 11 by the roll, the core resin 11 is not always required to be imperfectly cured. In that condition, even though the core resin 11 is not imperfectly cured, the thickness of the core layer 11 to serve as an adhesive layer is prevented from varying in the next step of laminating the resin film 12 on the core layer 11.

For forming the core layer 11 and the cladding layer 10, for example, herein employable is any coating method of spin coating, blade coating, gravure coating or die coating so far as it satisfies the desired film thickness and the film uniformity.

Next, the resin film (resin film layer, base film) 12 that serves as a base layer is attached to the surface of the core layer 11 with a laminate roll or the like so that no bubble is between the two, as shown in FIG. 5B. In short, this step is to laminate the resin film 12 to the cladding layer 10 via the core layer 11.

Next, the thus-stacked structure is exposed to UV rays on the side of the resin film 12 (that is, on the side opposite to the metal stamper 1) to thereby cure the core resin 11 to give a resinous core layer 11, and the resin film 12 is thus laminated on the cladding layer 10 via the core layer 11, as shown in FIG. 5B. This is a laminating process in which the resin film 12 is laminated to the cladding layer with the concave and convex pattern replicated thereon.

Next, the stacked structure of the core layer 11, the cladding layer 10 and the resin film 12 is separated (released) from the metal stamper 1, as shown in FIG. 5C. This is a separating step. The process of FIG. 5A to FIG. 5C gives a transparent stamper (film stamper) 13 to be used in fabricating optical memory devices, which comprises the resin film 12 serving as a resinous base layer, the resinous core layer 11 formed thereon, and the resinous cladding layer 10 further formed thereon, as shown in FIG. 5D. In this, the resinous cladding layer 10 has the concave and convex pattern having been replicated (formed) from the metal stamper 1.

In this embodiment, the transparent stamper 13 is exposed to UV rays on the side of the resinous cladding layer 10 that has the concave and convex pattern having been replicated from the metal stamper 1, as shown in FIG. 5D. This is for further curing the resinous layers to thereby lower the adhesiveness of the concave and convex pattern (pits) formed in the cladding layer 10; this is overcure treatment. Thus overcured, the transparent stamper 13 is preferably heated at a high temperature of, for example, at about 120° C. Also preferably, the high-temperature treatment takes about 1 hour or so. This is to further lower the adhesiveness of the pattern; this heat treatment is also referred to as overcure. The overcure treatment is effective for improving the peelability of the transparent stamper 13 from the core resin and the cladding resin that constitute the optical memory device to be fabricated by the use of the stamper 13.

Next described is a process of using the thus-prepared transparent stamper 13 in fabricating an optical memory device in which the thin-film base layer is a resin film 5 (this is a process for fabricating optical memory devices). The outline of the process of fabricating optical memory devices is as follows: First provided is a thin-film base layer 5 on a substrate (this differs from the base layer) of glass or the like. Next, a resinous core layer 3 and a resinous cladding layer 2 are alternately stacked on the base layer 5. Finally, another thin-film-base layer 5 is applied to the stacked structure to complete a sandwich structure. Thus completed, the sandwich-structured optical memory device 4 formed between the thin-film base layers 5 is peeled away from the substrate.

The process of fabricating the optical memory device as above is described in more detail with reference to FIG. 6A to FIG. 6E. First, a cladding resin (liquid cladding resin) 2X is applied onto a base substrate 21 for optical memory devices, to thereby form thereon a layer having a predetermined thickness (e.g., about 5 µm after cured), as shown in FIG. 6A. In this embodiment, the cladding resin 2X is a UV-curable resin (a type of photocurable resin) that is curable when exposed to UV rays. This is applied onto the surface of the base substrate 21, and then exposed to UV rays to be cured. Thus cured, this forms a resinous cladding layer 2X. If desired, any other desired resin capable of functioning as the cladding layer 2X may be dissolved in a solvent, and the resulting resin solution may be applied to the substrate and dried thereon to form the cladding layer 2X.

In the embodiment of FIG. 6, the base substrate 21 is a stiff substrate, for example, a glass substrate, a polycarbonate substrate or an amorphous polyolefin substrate of ARTON (by JSR) of the like having a thickness of a few mm. Concretely, it may have a thickness of from about 0.1 mm to about 3 mm or so, preferably about 1 mm or so. One reason of using such a stiff substrate is as follows: While resinous core layers 3 and resinous cladding layers 2 are stacked on the substrate 21, the internal stress inside the resin to form the core layers 3 and the cladding layers 2 will act to warp the substrate in one direction, as will be so mentioned hereinunder, since the stacked layers do not as yet have a sandwich structure. In this stage, if the mechanical strength of the substrate 21 is unsatisfactory, the substrate 21 will warp, and if it warps too much, it could not be coated with further resin and could not be laminated with a resin film in the subsequent process.

On the other hand, if the warped substrate 21 with the constitutive layers stacked thereon is covered with a thin-film base layer 5 to finish the intended sandwich structure, and if it is peeled from the substrate 21, the sandwich-structured optical memory device 4 thus fabricated will be kept warped.

To overcome the problems noted above, the substrate 21 should be a stiff substrate in order that it is prevented from warping while the resinous core layers and the resinous cladding layers are stacked thereon. Accordingly, since its mechanical strength is high, the stiff substrate 21 is prevented from warping (curving, curling) even though the UV-curable resins having been applied thereonto have shrunk after cured to form thereon the resinous cladding layers 2 and the resinous core layers 3. As a result, the optical memory device 4 thus fabricated may have a sandwich structure that satisfies the condition of formula (1) in point of the degree of bending of the device 4, and the device 4 is good for practical use.

One reason of being able to use the stiff substrate 21 as above is as follows: The substrate is finally released from the optical memory device 4. Therefore, the thickness and the weight of the substrate do not have any influence on the thickness and the weight of the optical memory device 4. Accordingly, even if the substrate 21 is thick and heavy, the optical memory device 4 fabricated by the use of such a thick and heavy substrate does not lose its practicability. Therefore, the substrate to be used in this embodiment may be any one having a satisfactorily high strength enough to prevent it from warping.

In case where a metal stamper is used in fabricating the optical memory device, it is difficult to bend the stamper. In this case, therefore, it is difficult to peel (release) the stacked structure that comprises the cladding layer and the core layer from the metal stamper, if the base substrate for the optical memory device is stiff. For this reason, a stiff base substrate could not be used in fabricating the optical memory device. As opposed to this, however, since a soft (flexible) transparent resin stamper (film stamper) 13 is used in this embodiment, the stamper 13 is easy to peel (release) from the stacked structure. Therefore in this embodiment, a stiff substrate may be used for the base substrate.

The base substrate 21 for fabricating optical memory devices may be any and every one that is resistant to shrinkage of the UV-curable resin cured through exposure to UV rays to form the cladding layers 2 and the core layers, and has a mechanical strength enough to prevent the cladding layers 2 and the core layers stacked thereon from warping.

Next, after the cladding resin 2X has been cured, a core resin (liquid core resin) 3Xa of a UV-curable resin (a type of photocurable resin) is applied thereon to form a layer having a predetermined thickness (e.g., about 1.8 µm or so after cured), and exposed to UV rays so as to imperfectly cure the resin 3Xa, as shown in FIG. 6A. If desired, any other resin capable of functioning as the core layer 3Xa may be dissolved in a solvent and the resulting resin solution may be applied onto the cladding layer 2X and dried to form thereon the intended core layer 3Xa.

Imperfect curing referred to herein means that the entire core resin having been applied to the cladding layer is imperfectly cured to a degree of 50% or so. Thus imperfectly cured, the viscosity of the core resin 3Xa to form the core layer 3Xa is increased and, as a result, the thickness of the adhesive layer to be made of the core resin 3Xa is prevented from varying in the next step of laminating the base resin layer onto the core layer 3Xa.

In this embodiment, the core resin 3Xa is imperfectly cured so as to prevent the thickness of the adhesive layer from varying in the next step of laminating the resin film 5 on the surface of the core layer 3Xa, but the operation of imperfectly curing the core resin 3Xa is not indispensable and this step may be omitted. For example, when the resin film 5 is laminated on the core layer 3Xa, it is pressed against the layer 3Xa with a laminate roll. So far as the lamination system is provided with an additional holder mechanism that keeps the resin film 5 not in contact with the core layer 3Xa for an adhesive layer just before the resin film 5 is pressed against the core layer 3Xa by the roll, the core resin 3Xa is not always required to be imperfectly cured. In that condition, even though the core resin 3Xa is not imperfectly cured, the thickness of the core layer 3Xa to serve as an adhesive layer is prevented from varying in the next step of laminating the resin film 5 on the core layer 3Xa.

Next, after the core resin 3Xa has been imperfectly cured, a resin film (resin film member, base film) 5 to be a thin-film base layer is laminated on the surface of the core layer 3Xa under pressure with a laminate roll or the like with no bubble being between the two, as shown in FIG. 6A. This is for laminating the resin film 5 on the cladding layer 2X via the core layer 3Xa. In that condition, the thus-stacked structure is exposed to UV rays to thereby cure the core resin 3Xa to form the resinous core layer 3Xa, and the resin film 5 is adhered to the core layer 3Xa.

In this embodiment, it is desirable that the resin film 5 is transparent in the wavelength range of the light for use to the optical memory device (that is, in the wavelength range of the laser ray that passes through the core layer 3 of the device), therefore capable of transmitting scattered light, and is as thin as possible, so far as it has good optical properties, its thickness is uniform and its mechanical strength is high. This is in order that the light having scattered on the concave and convex pattern finally goes out of the device and that the optical memory device 4 finally fabricated herein could be as thin as possible. In this embodiment, in addition, the specific structure is in order that the core layer 3Xa between the resin film 5 and the cladding layer 2X receive few bubbles from the outside.

The advantage of the thin resin film 5 is as follows: When the resin film 5 is thin, it is soft and flexible. Therefore, in the step of laminating the thin resin film 5 onto the cladding layer 2X coated with the core layer 3Xa, the resin film 5 may be gradually kept in contact with the stacked structure while it is bent, and, as a result, the contact area between the two can be gradually increased. Accordingly, bubbles are prevented from entering the cladding layer 2X to have some negative influence on the layer 2X to thereby change the refractive index and the thickness of the layer 2X.

Therefore, for the resin film 5, preferred are thermoplastic resin films having good optical properties, for example, polycarbonates, amorphous polyolefins such as ARTON (by JSR), as well as PET (polyethylene terephthalate) and PEN (polyethylene naphthalate). Of those, PEN has good heat resistance. In particular, PET and PEN are more preferred as they readily give good films of uniform thickness. Any of these films maybe formed through thermal stretching or solvent casting, and it is desirable that the resin film 5 has a thickness of, for example, at most 100 µm.

If the resin film 5 is thicker than this range, its softness (flexibility) will be poor, and some bubbles will enter the interface between the core layer 3Xa and the resin film 5 while the resin film 5 is laminated over the layer 3Xa. On the contrary, if the resin film 5 is extremely too thin, for example, its thickness is smaller than 1 μm, it is unfavorable since it could not support the stacked structure composed of the cladding layers 2 and the core layers 3 for the optical memory device of the invention when the stacked structure is peeled (released) from the base substrate 21.

In the process mentioned above, the cladding layer 2X is formed on the base substrate 21, and then the resin film 5 is laminated thereon via the core layer 3Xa therebetween, to which, however, the invention is not limited. Apart from this, a cladding layer 2X may be formed on the base substrate 21, and then a resin film 5 may be directly laminated on the cladding layer 2X that serves as an adhesive. In this case, the resin film 5 is laminated on base substrate 21 via the cladding layer. In still another modification, a core layer is first formed on the base substrate 21, and then a resin film 5 may be laminated thereon via a cladding resin that functions as an adhesive. In this case, the resin film 5 is laminated on the base substrate 21 via the core layer and the cladding layer. In still another modification, a core layer is formed on the base substrate 21, and a resin film 5 may be laminated on the core layer that serves as an adhesive. In this case, the resin film 5 is laminated on the base substrate via the core layer. All these are for laminating the resin film 5 that serves as a base layer on the base substrate for optical memory devices. Therefore, the process of fabricating these is for base layer lamination.

In this embodiment, the core resin (core layer) and the cladding resin (cladding layer) for the adhesive (adhesive layer) are not always required to have a specific refractive index, and any materials may be suitably combined for these of better adhesion affinity, especially in consideration of the properties of the materials for the resin film 5 and the base substrate 21. For this, for example, various types of adhesives such as photocurable, thermosetting, cold-curable, hot-melting or two-pack adhesives may be used. Concretely, acrylic, epoxy, cyanoacrylate, urethane or olefin adhesives are employable.

Next, a core resin (liquid core resin) 3Xb of a UV-curable resin is applied onto the resin film 5 to thereby form thereon a layer having a predetermined thickness (e.g., about 1.8 μm after cured), and then this is exposed to UV rays to be cured into a resinous core layer 3Xb, as shown in FIG. 6B.

The two core layers 3Xa, 3Xb differ from the core layer 3 to be mentioned hereinunder in that they do not have a concave and convex pattern, and serve exclusively as an adhesive for the cladding layer 2X and the resin film 5. These do not have a function for information reconstruction. Similarly, the cladding layer 2X also differs from the cladding layer 2 mentioned hereinunder. Not functioning as a waveguide, the cladding layer 2X serves exclusively as an adhesive for bonding the core layer 3Xa to the glass substrate 21, a type of base substrate for optical memory devices.

Next, a cladding resin (liquid cladding resin) 2 is applied onto the surface of the core layer 3Xb to form a layer thereon having a predetermined thickness (e.g., from about 15 to about 20 μm after cured), as shown in FIG. 6C. In this embodiment, a UV-curable resin capable of curing through exposure to UV rays is used for the cladding resin, and after this has been applied onto the surface of the core layer 3Xb, this is exposed to UV rays to be cured into a resinous cladding layer 2. If desired, any other resin capable of functioning as the cladding layer 2 may be dissolved in a solvent and the resulting resin solution may be applied onto the core layer 3Xb and dried to form the intended cladding layer thereon.

After the cladding resin 2 has been cured in that manner, a core resin (liquid core resin) 3 of a UV-curable resin, of which the refractive index is larger than that of the cladding layer 2, is applied onto the cladding layer 2 to form thereon a layer having a predetermined thickness (e.g., about 1.8 μm after cured), and then exposed to UV rays to be imperfectly cured, as shown in FIG. 6C. If desired, any other resin capable of functioning as the core layer 3 may be dissolved in a solvent and the resulting resin solution may be applied onto the cladding layer 2 and dried to form the intended core layer 3 thereon.

Imperfect curing referred to herein means that the entire core resin having been applied to the cladding layer is imperfectly cured to a degree of about 50%. Thus imperfectly cured, the viscosity of the core resin film to form the core layer 3 is increased and, as a result, the thickness of the adhesive layer to be made of the core resin 3 is prevented from varying in the next step of laminating the transparent stamper 13 onto the core layer 3.

In this embodiment, the core resin 3 is imperfectly cured so as to prevent the thickness of the adhesive layer from varying in the next step of laminating the transparent stamper 13 on the surface of the core layer 3, but the operation of imperfectly curing the core resin 3 is not indispensable and this step may be omitted.

For example, when the transparent stamper 13 is laminated on the core layer 3, it is pressed against the layer 3 with a laminate roll. So far as the lamination system is provided with an additional holder mechanism that keeps the transparent stamper 13 not in contact with the core layer 3 for an adhesive layer just before the transparent stamper 13 is pressed against the core layer 3 by the roll, the core resin 3 is not always required to be imperfectly cured. In that condition, even though the core resin 3 is not imperfectly cured, the thickness of the core layer 3 to serve as an adhesive layer is prevented from varying in the next step of laminating the transparent stamper 13 on the core layer 3.

Next, after the core resin 3 has been imperfectly cured in the manner as above, a transparent stamper (film stamper, resinous stamper) 13 is put on the core layer 3, as shown in FIG. 6C. The transparent stamper 13 is processed to have a desired concave and convex pattern (pits) on its surface, corresponding to the image (information) to be reconstructed in the device. In that condition, the stacked structure is exposed to UV rays on the side of surface of the transparent resinous stamper 13 (concretely, on the side of the resin film 12 of the stamper 13, or that is on the side opposite to the side of the concave and convex-patterned surface of the stamper 13) to thereby partly imperfectly cure the core resin 3 by the action of the UV rays having passed through the transparent stamper 13, as shown in FIG. 6D.

In this embodiment, partly imperfectly curing the core resin 3 means that the core resin 3 is only partly and imperfectly (or that is, not completely) cured. Concretely, for example, the edges of the core layer that are kept in contact with air are poorly cured as compared with the other part of the layer, and only the edges of the core layer are imperfectly (that is, not completely) cured through exposure to UV rays. In this embodiment, the core layer 3 is not completely cured but is partly incompletely cured in the manner as above. This is because if the core layer 3 laminated with the transparent stamper 13 is completely cured, the stamper 13 could not peeled off from the core layer 3.

Next, the transparent resinous stamper 13 is peeled (released) from the core layer 3 of the stacked structure formed on the base substrate 21, as shown in FIG. 6E. After that, the resinous core layer 3 with the concave and convex pattern replicated (formed) on its surface from the transparent resinous stamper 13 is exposed to UV rays by which the core layer 3 is thereby finally cured. According to the process, the resinous cladding layer 2 is formed on the base substrate 21, and the resinous core layer (recording layer, waveguide) 3 is laminated on the cladding layer 2. In the thus stacked structure, the resinous core layer 3 has the concave and convex pattern replicated from the transparent resinous stamper 13. Thus replicated, the concave and convex pattern is in the plane as pits, for example, like in CD (compact disc).

Next, a cladding resin (liquid cladding resin) 2 of a UV-curable resin, of which the refractive index is smaller than that of the core layer 3, is applied onto the surface of the core layer 3 to thereby form a layer having a predetermined thickness (e.g., from about 15 to about 20 $\mu$m after cured), and then exposed to UV rays to be cured into a resinous cladding layer 2. After this, the same process as above (comprising the steps of FIG. 6C to FIG. 6E) is repeated, whereby a desired number of core layers 3 and cladding layers 2 are alternately stacked (for example, up to around 100 layers each) on the base substrate 21, with no resin film interposed between the stacked layers.

The process of alternately stacking the cladding layers 2 and the core layers 3 on the resin film (base layer) 5 until a desired number of these layers are stacked up thereon in the manner as above is referred to as a process of forming a stacked structure. In this embodiment, after the desired number of the layers have been stacked up in the manner as above, a core resin (liquid core resin) 3Xc of a UV-curable resin is finally applied to the surface of the last-stacked cladding layer 2 (the uppermost cladding layer) to form thereon a layer having a predetermined thickness (e.g., about 1.8 $\mu$m after cured), as shown in FIG. 7a, and then this is exposed to UV rays to be imperfectly cured.

In this embodiment, the core resin 3Xc is imperfectly cured so as to prevent the thickness of the adhesive layer from varying in the next step of laminating the resin film 5' on the surface of the core layer 3Xc, but the operation of imperfectly curing the core resin 3Xc is not indispensable and this step may be omitted.

For example, when the resin film 5' is laminated on the core layer 3Xc, it is pressed against the layer 3Xc with a laminate roll. So far as the lamination system is provided with an additional holder mechanism that keeps the resin film 5' not in contact with the core layer 3Xc for an adhesive layer just before the resin film 5' is pressed against the core layer 3Xc by the roll, the core resin 3Xc is not always required to be imperfectly cured. In that condition, even though the core resin 3Xc is not imperfectly cured, the thickness of the core layer 3Xc to serve as an adhesive layer is prevented from varying in the next step of laminating the resin film 5' on the core layer 3Xc.

Figure 7A:
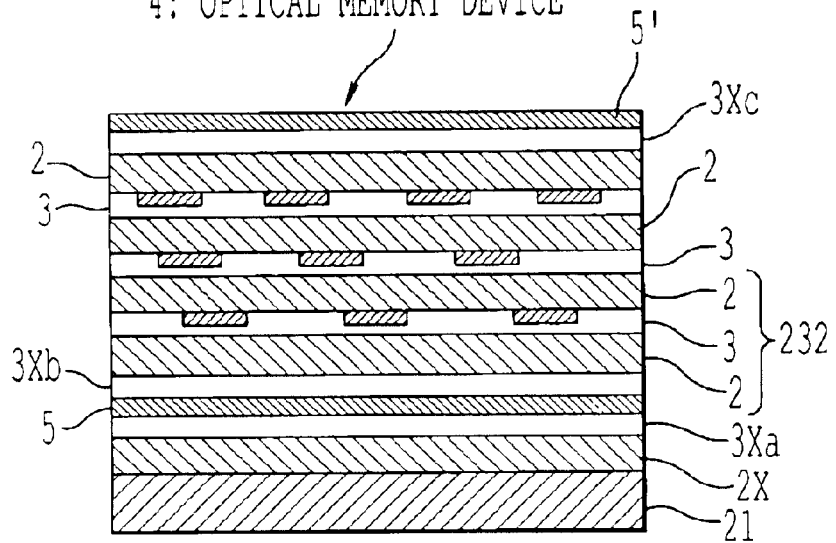
FIG. 7A is the optical memory device fabricated on a base substrate.

Next, after the core resin 3Xc has been imperfectly cured in the manner as above, the resin film (resinous film member, base film) 5' to be a base layer is laminated on the surface of the core layer 3Xc by pressing them with a roll or the like, as shown in FIG. 7A. In this step, the operation is so controlled that no bubble is between the laminated layers. After thus laminated, this is exposed to UV rays whereby the core layer 3Xc is cured. According to the process, the resinous core layer 3Xc is formed and, at the same time, the resin film 5' is stuck to the core layer 3Xc.

Figure 7B:
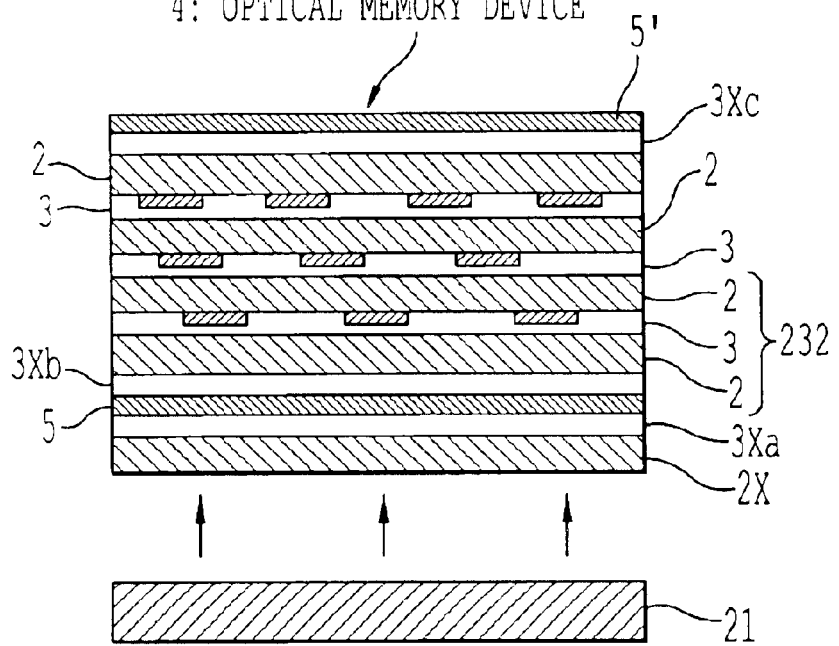
FIG. 7B is the optical memory device having been peeled (separated) from the base substrate.

Next, the thus-fabricated optical memory device (concretely, this has a stacked structure of the cladding layers 2 and the core layers 3 of a UV-curable resin sandwiched between the resin films 5, 5') is peeled (released) from the base substrate 21, as shown in FIG. 7B. Concretely, the stacked structure sandwiched and integrated between the resin films 5, 5' is peeled from the base substrate 21, while being supported by the resin films 5, 5'. This process of separating the stacked structure sandwiched and integrated between the resin films (base layers) 5, 5' from the base substrate 21 is referred to as a process of separating a stacked structure from the substrate.

Thus separated from the base substrate 21, the optical memory device 4 is processed to form an end, and a protective film is attached thereto, or a resin coat is formed on it. Thus processed, the optical memory device is modified into various optical memory media such as optical memory cards, etc.

As so described hereinabove, the core resin 3 may be any and every type of resin so far as it is liquid when used for coating and then it is curable. For the core resin, for example, preferred are curable resins such as UV-curable or photocurable resins or thermosetting resins. However, in case where a pattern is replicated on the resin layer by the use of a stamper as in the above, preferred for the layer are photocurable resins. For example, acrylic photocurable resins (a type of acrylic curable resins), epoxy photocurable resins (a type of epoxy curable resins), and thiol photocurable resins (a type of thiol curable resins) are preferred for the layer.

On the other hand, the cladding resin 2 may be also any and every type of resin, so far as it is transparent and its refractive index is smaller in some degree than that of the core resin 3. Anyhow, resinous cladding layers 2 are preferred as convenient in various aspects. For example, the cladding layer 2 formed of a curable resin, such as a UV-curable or photocurable resin or a thermosetting resin is highly adhesive to the resin film 5, and is therefore favorable to the invention. In particular, photocurable resins are especially preferred for the cladding layer 2. For example, for it, preferred are acrylic photocurable resins (a type of acrylic curable resins), epoxy photocurable resins (a type of epoxy curable resins), and thiol photocurable resins (a type of thiol curable resins).

For forming the core layer 3 and the cladding layer 3, for example, known are various coating methods of spin coating, blade coating, gravure coating or die coating. Any of such coating methods is applicable to the invention so far as it forms even and uniform films.

As so mentioned hereinabove, the number of the cladding layer 2 may be one or may be two or more for further stabilizing the thickness of the device fabricated.

In this embodiment, the stacked core layers 3 and cladding layers 2 are all of resin, and, in addition, the core layer 3 to be processed to have a concave and convex pattern on its surface is formed of a curable resin that may be cured by light or heat, as so mentioned hereinabove. Accordingly, the desired concave and convex pattern 6 may be formed in the interface between the core layer 3 and the cladding layer 2 through replication from a stamper, not requiring a complicated process of exposure and development of photoresist as the conventional techniques.

Thus fabricated as in the above, the optical memory device 4 is then processed to have an end (light-receiving end) via which incident ray (reference beam) applied to the device is led into the resinous core layer 3 therein. Using the light which is led to the core layer 3 in the device, the information recorded in the information-recording area (that is, in the area in which the concave and convex pattern 6 for information is formed in the interface between the resinous core layer 3 and the resinous cladding layer 2) is read.

In this embodiment, the optical memory device 4 fabricated by the use of a circular stamper is cut into individual optical memory devices 4 having a desired size, and the end of every device is cut at 90 degrees (90-degree end). Concretely, the angle formed by the face of the waveguide block 232 and the end of the device 4 is 90 degrees.

The end through which the incident ray is led into the resinous core layer 3 of the device 4 is not limited to that type, but may be in any other various forms. For example, one end of the optical memory device 4 may be cut at an angle of 45 degrees (the angle formed by the face of the waveguide block and the end is 45 degrees), and if desired, a reflective film may be formed on the end face to be a mirror end (inclined end, micromirror). This mirror face may serve as the end (45-degree end) that receive the incident ray applied to the device. In this case, the incident ray is directed toward the 45-degree inclined end of the optical memory device 4 in the direction vertical to the face of the device 4, and it is reflected on the 45-degree inclined end of the device and then led into the resinous core layer 3 thereof.

For example, when incident ray is introduced into the core layer 3 of the thus-fabricated optical memory device 4 via the end of the device 4, the light having entered the device 4 runs through it while scattering in the concave and convex pattern in the interface of the constituent layers of the device. In this stage, the scattered light passes (runs) in the vertical direction relative to the running direction of the incident ray (or that is, the scattered light crosses the incident ray), and finally it is led out through the two ends of the optical memory device to thereby reconstruct the image in accordance with the concave and convex pattern formed in the device.

Regarding the thickness of the core layer 3 and the cladding layer 2, the layers are not specifically defined in point of their thickness so far as they function as waveguides. For example, when visible light is used for the device, the thickness of the core layer 3 may be approximately from 0.5 to 3.0 $\mu$m or so. In this case, the thickness of the cladding layer 2 is not specifically defined. For reducing the overall thickness of the device, the thickness of the cladding layer 2 is preferably at most 100 $\mu$m. Though not specifically defined, the lowermost limit of the thickness of the cladding layer may be at least 0.1 $\mu$m.

Preferably, the thickness of the optical memory device 4 is at least about 0.3 mm in order that the mechanical strength of the device 4 is good. More preferably, it is at least about 0.5 mm. However, in view of the portability of the device for optical memories (information-recording media) such as optical cards, the thickness of the device is preferably at most about 5 mm, more preferably at most about 3 mm.

Regarding the number of the core layers 3 to be staked up, it is desirable that a larger number of core layers 3 are stacked up for increasing the recording capacity of the optical memory device 4. For example, the number of the core layers to be stacked up is preferably at least 10. However, if too many core layers are stacked up, the device fabricated will readily warp. Therefore, for example, at most 200 core layers may be stacked up for practical use.

In the embodiment illustrated herein, cut sheets of film are used for the resin film (thin-film base layer) 5. Apart from these, a continuous film may also be used. In this embodiment where the core layers and the cladding layers are formed on the film in a mode of die coating, microgravure coating, bar coating or the like and the thus-formed core layers and cladding layers are processed with a stamper under pressure and cured, a stacked structure of cladding layers and core layers formed on a support is fabricated. When a roll stamper capable of winding up into a roll is used, the productivity in the replication process from the stamper is further improved.

Accordingly, the optical memory device of this embodiment has the advantage of correct image reconstruction. This is because the degree of bending of the core layer 3 is reduced, the entire information area of the core layer 3 can uniformly receive all the reference beam applied to the device.

In this embodiment described hereinabove, the transparent stamper 13 is laminated on the core layer 3 to thereby replicate the concave and convex pattern of the stamper to the core layer (this is referred to as core replication, or core layer replication process), to which, however, the invention is not limited. Apart from it, for example, a transparent stamper (resin stamper, film stamper) may be laminated on the cladding layer 2 to thereby replicate the concave and convex pattern of the stamper to the cladding layer (this is referred to as cladding replication, or cladding layer replication process).

When the image to be outputted from the optical memory device fabricated according to the cladding layer replication process is compared with that to be outputted from the optical memory device fabricated according to the core layer replication process, the former does not have a virtual image of holography (for example, it is not doubled) and its quality is high. In this embodiment, the core layer is thinner than the cladding layer. In this case, therefore, the core layer replication process is preferred to the cladding layer replication process since the film thickness fluctuates little in lamination and the latitude for the lamination condition is broadened.

However, so far as the condition for lamination is optimized, the cladding layer replication process may be favorable also to the embodiment mentioned herein. Accordingly, so far as the condition for lamination is suitably controlled, good pattern replication is possible irrespective of the thickness of the cladding layer (or that is, even if the cladding layer is thin or thick). For this reason, the cladding layer maybe thick while patterned with a stamper. If desired, a first cladding layer is cured to have a predetermined thickness, and a second cladding layer that is thin for pattern replication is formed on the first cladding layer, and the intended pattern may be replicated on the thin second cladding layer.

Second Embodiment of the Invention:

Next described is the second embodiment of the invention. In this section, the matters that are the same as those in the first embodiment mentioned hereinabove are omitted, for which, therefore, the corresponding description in the section of the first embodiment is referred to.

The optical memory device of this embodiment comprises a core layer 3 and a cladding layer 2 laminated on both surfaces of the core layer 3, wherein at least one interface between the core layer 3 and the cladding layer 2 has a concave and convex pattern 6 for information to form a waveguide block 232 and a reference beam is introduced into the core layer 3 through the end 7 of the waveguide for reconstructing the information recorded in the concave and convex pattern 6, as in FIG. 2.

The optical memory device 4 is so designed that it comprises a stacked structure of multiple (for example, at most 1000) waveguide blocks 232. FIG. 2 shows only two waveguide blocks 232 of the optical memory device 4 that comprises the stacked structure of that type.

Especially for obtaining correctly reconstructed images, it is a matter of importance that the reference beam applied to the device for image reconstruction uniformly reaches the entire information area (information-recording area, data area) of the concave and convex pattern 6 for information of the core layer 3 in which the data recorded shall be reconstructed by exposure to the reference beam.

In addition, the optical memory device is desired to be so modified that it can correctly and surely reconstruct the recorded information through simple control for reading and it is suitable to reading automation, not requiring any complicated reading device.

On the other hand, in order to correctly read the recorded images with no necessity of individual layer control in point of the vertical inclination θ of incident ray, the fluctuation of the inclination of every core layer 3 must fall within a predetermined range.

For this, we, the present inventors have found that the "degree of inclination" relative to the standard face of each core layer (especially the information area of each core layer 3) at the end 7 of the optical memory device 4 shall satisfy a predetermined condition.

Figure 8:
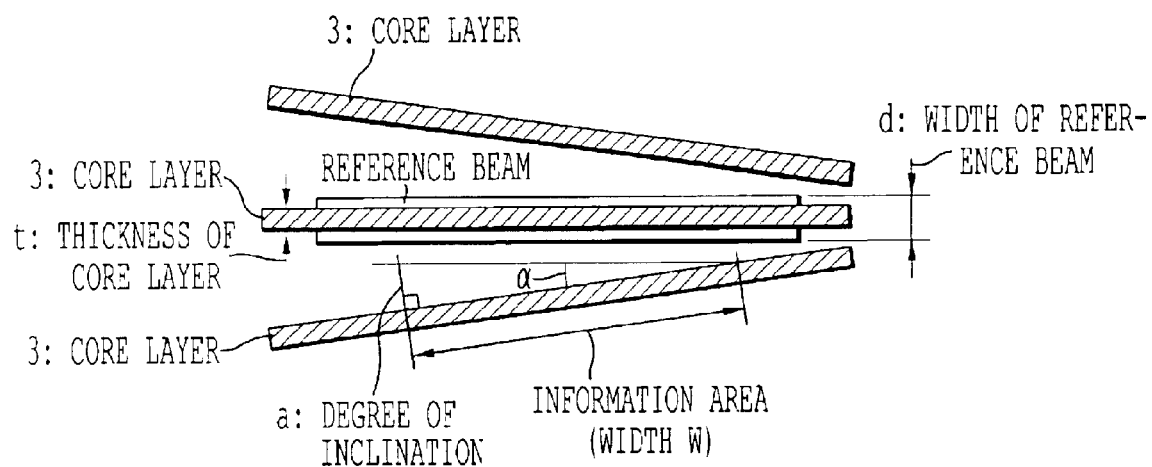
FIG. 8 is a schematic view for explaining the degree of inclination of the core layer of an optical memory device of one embodiment of the invention.

Concretely, the degree of inclination of the core layer 3 at the end 7 of the device and relative to the standard face of the information area in which the concave and convex pattern 6 for information is formed shall satisfy the condition represented by the following formula (5) (see FIG. 8). This means that all the information area in which the concave and convex pattern 6 for information is formed in the core layer 3 at the end 7 shall fall within the irradiation range of the reference beam to which the device is exposed.

$$|a| \leq d-t \quad (5)$$

in which a indicates the degree of inclination of the core layer 3 at the end 7 of the device and relative to the standard face of the information area, d indicates the vertical width of the reference beam, and t indicates the thickness of the core layer 3 in the information area.

More preferably, it satisfies the condition represented by the following formula (6):

$$|a| \leq (d-t) \times 0.9 \quad (6)$$

even more preferably, the condition represented by the following formula (7):

$$|a| \leq (d-t) \times 0.8 \quad (7)$$

In case where the number of the layers to be stacked in the device is increased for increasing the memory capacity of the device, it is difficult to reduce the degree of inclination of every layer. Therefore, with the increase in the number of the stacked layers of the device, it is a matter of more importance that the "degree of inclination" of every layer shall satisfy the condition of formula (5). Accordingly, in case where at least 5 waveguide blocks 232 are stacked up in one device, it is desirable that the "degree of inclination" of every layer satisfies the condition of formula (5).

In the manner as above, when the absolute value of the degree of inclination, |a|, of every core layer 3 is not larger than the value that is obtained by subtracting the thickness of the core layer 3 in the information area (core thickness), t, from the vertical width of the reference beam (incident laser width), d, (that is, when the fluctuation of the degree of inclination of every core layer 3 is controlled to fall within an acceptable range), then the information recorded in every core layer 3 can be correctly read merely by suitably controlling the vertical alignment (Z-directional alignment) of the reference beam with no necessity of specifically controlling the vertical inclination θ of the reference beam (incident ray, incident laser) for every core layer 3.

This enables correct reading with a simple-structured reading device (drive). In particular, the necessary operation for correct reading is that the reading device (drive) shall find out the standard face of the optical memory device that satisfies the condition of formula (5) for all the core layer 3, while only once controlling the vertical inclination θ of the reference beam to the individual optical memory devices 4. This means that the device control is significantly simplified.

In particular, for realizing more practicable optical memory devices 4, the width of the information area is preferably as broad as possible for increasing the quantity of data that can be inputted into the device in one operation. However, when the width of the information area is broadened, it becomes difficult to control the degree of inclination of each core layer 3 to fall within the range of formula (5). In other words, even though the angle of each core layer 3 is kept constant, the "degree of inclination" of each core layer 3 shall increase when the width of the information area is broadened, and, as a result, the "degree of inclination" of every core layer 3 shall thereby increase. Accordingly, in case where the width of the information area falls between 2 mm and 100 mm at the end of the resinous core layer 3, it is a matter of importance that the condition of formula (5) is surely satisfied. Preferably, the width of the information area falls between 5 mm and 100 mm.

The "degree of inclination" referred to herein is meant to indicate how and to what degree the core layer 3 inclines in the width of the information area (data-recording area, information-recording area, image-recording area), and this indicates how and to what degree the core layer 3 is shifted from the standard face of the device.

Concretely, when the inclination angle of the core layer 3 to the standard face (or the face parallel to the standard face—this is a horizontal face in this case) is represented by α and when the width of the information area is represented by w, as in FIG. 8, then the degree of inclination a is represented by the following formula:

$$a = w \times \tan \alpha.$$

In this embodiment, when the core layer clockwise rotates relative to the standard face (or the face parallel to the standard face—this is a horizontal face in this case), or that is, when the core layer so inclines that its left-side edge is higher than its right-side edge as in FIG. 8, then the degree of inclination is plus, while contrary to this, when the core layer anticlockwise rotates relative to the standard face (or the face parallel to the standard face—this is a horizontal face in this case), or that is, when the core layer so inclines that its left-side edge is lower than its right-side edge as in FIG. 8, then the degree of inclination is minus.

The situation that the degree of inclination of every core layer 3 satisfies the condition of formula (5) means that the device has a standard face to which the degree of inclination of every core layer 3 satisfies the condition of formula (5).

However, the standard face relative to which the degree of inclination of the core layer 3 is defined may be in any site. In other words, it may be any and every one that can be defined in a three-dimensional coordinate system, and it is not always required that the standard face should be the actual face of the device. For example, the standard face may be a virtual face. However, the standard face for which the degree of inclination of the core layer 3 is defined may be the face that the device actually has. For example, it may be the upper face or the lower face of the core layer 3, or the outer face of the optical memory device 4, or may be a face vertical to the side face of the optical memory device 4.

In particular, in the optical memory device 4 having multiple core layers 3, the standard face is preferably the upper face or the lower face of the core layer 3 that is positioned in the most outside site (that is, the outermost core layer), or the uppermost or lowermost face of the optical memory device 4. Accordingly, the data written in the device can be read with a simple-structured reading device (drive).

For example, one example of the case where the standard face is outside the device is a case where the uppermost or lowermost face of the optical memory device 4 is the standard face. In that manner, when the standard face is the uppermost or lowermost face of the optical memory device 4, the drive (reading device) may be based on the standard face that is the lowermost face (stage face) or the uppermost face (face that is spaced from the stage face by a predetermined distance) of the optical memory device 4 on a stage. In that case, therefore, it is unnecessary to control the vertical inclination θ of the reference beam for every optical memory device 4 for image reconstruction so as to find out the standard face, and it is possible to realize a reading device (drive) having a more simplified structure (mechanism) for the memory device. In that case, the reading device may readily be driven for reading operation merely on the basis of the standard face that is outside the memory device, not requiring the control of the vertical inclination θ of the reference beam.

In this embodiment, the degree of inclination |a| is defined to satisfy the condition of formula (5). This means that the degree of inclination of the core layer 3 relative to the standard face of the upper (or lower) boundary of the core layer 3 in the width of the information area satisfies, when the standard face is a predetermined face, the requirement that it is not larger than the vertical width, (d−t). The reference beam shall be parallel to the standard face.

In this case, the reference beam shall have a thickness in the direction vertical to the standard face. Therefore, the thickness of the reference beam in that vertical direction is herein defined as the vertical width of the reference beam. The vertical width, d, of the reference beam may be, for example, the half-value width of the reference beam intensity distribution.

Concretely, the degree of inclination of the core layer 3 is, for example, preferably at most 10 μm. For example, when the core thickness is 2 μm and the incident laser width is 5 μm, then the acceptable degree of inclination of the core layer 3 may be 3 μm. This will be converted into inclination (angle) of the core layer 3. When the information area width is 5 mm, the inclination angle is not larger than 0.034 degrees; and when the information area width is 10 mm, it is not larger than 0.017 degrees. In consideration of the application of the device to optical cards, etc., it is desirable that the degree of inclination of the core layer 3 is at most 5 μm.

On the other hand, the lowermost limit of the degree of inclination of the core layer 3 is not specifically defined, but is, for example, preferably at least 0.1 μm.

In the manner as above, even if the inclination of each core layer 3 varies, the degree of inclination of every core 3 shall fall within the range of from 0.1 μm to 10 μm (preferably at most 5 μm). This is because if the inclination fluctuation of each core layer 3 is reduced more than the necessary level, longer time will be needed for fabricating the devices and more expensive equipment will be needed for it, and, as a result, the production costs of the devices will thereby increase. For these reasons, the degree of inclination of each core layer 3 is defined to fall within the range, and it will save any superfluous costs in fabricating the optical memory device 4.

The "degree of inclination" maybe measured, for example, by observing the end of the optical memory device 4 with a microscope.

Alternatively, it may be indirectly obtained from the inclination of the incident ray. Concretely, light is led into the core layer, and the inclination of the incident ray is so controlled that the output from the core layer may be uniform and bright. The fact that the output light is uniform and bright means that the inclination of the core layer is the same as the inclination of the incident ray. Accordingly, in that condition, the degree of inclination of the core layer may be computed from the data of the inclination of the incident ray relative to the standard face.

For the reasons of cost reduction and process limitation in fabricating the devices, a case may be taken into consideration where the fluctuation of the degree of inclination of the core layer 3 could not be reduced to a predetermined level or less. In such a case, the incident laser width and the information area width shall be controlled so that the condition of formula (5) could be thereby satisfied.

For realizing more practicable memory storage as so mentioned hereinabove, the optical memory device 4 shall be so fabricated that its "degree of inclination" satisfies the condition of formula (5). For more easily and more inexpensively fabricating the optical memory device 4, it is desirable that the core layer 3 and the cladding layer 2 are made of resin. In particular, it is more desirable that the core layer 3 and the cladding layer 2 are made of curable resin such as acrylic curable resin or epoxy curable resin.

In this embodiment, the optical memory element [stacked (flat) optical memory element, stacked waveguide hologram device, MWH device] 4 is so designed that it comprises a resinous core layer 3 and a resinous cladding layer 2 laminated on both surfaces of the core layer 3 and comprises one or more waveguide blocks (in the illustrated embodiment, two waveguide blocks) 232 each having a concave and convex pattern 6 for information for image reconstruction formed in at least one interface between the resinous core layer 3 and the resinous cladding layer 2, and in which the stacked structure of the waveguide blocks is sandwiched between thin-film base layers 5, 5' (to form a sandwich structure), as in FIG. 3.

The sandwich structure of the optical memory device 4 in which the thin-film base layer 5 is formed on both face (upper and lower faces) of the stacked structure (waveguide block 232) of the stacked resinous core layers and resinous cladding layers and in which the stacked structure is thus sandwiched between the two thin-film base layers 5 is favorable, since the degree of warping and bending of the core layers can be controlled to a predetermined level or lower.

For the thin-film base layers 5, 5', preferred are resin films. Preferred examples of the resin films for these are thermoplastic resin films having good optical properties, for example, polycarbonates, amorphous polyolefins such as ARTON (by JSR), as well as PET (polyethylene terephthalate) and PEN (polyethylene naphthalate). Of those, PEN has good heat resistance. In particular, PET and PEN are more preferred as they readily give good films of uniform thickness. The thin-film base layers 5, 5' must be transparent to the reference beam to which the device is exposed for image reconstruction.

The thin-film base layers 5, 5' are not limited to resin films alone. For example, employable is any and every material capable of functioning as a base layer that prevents the stacked structure (for the optical memory device 4) from warping (or bending) or that may keep the bent structure of the layer as such. For example, various materials such as glass and dielectrics are usable for the layers 5, 5'.

However, when the layers are desired to be soft (flexible) for their lamination in fabricating the intended device, the layers are preferably made of resin. Various curable resins may be applied to the stacked structure and cured thereon; or a suitable resin is dissolved in a solvent and the resulting solution may be applied thereto and dried to form a resinous thin-film base layer thereon. More preferred is using a resin film for the base layer. The base resin may be repeatedly attached to or detached from the stamper from which the necessary pattern for information is replicated onto the stacked structure for the memory device, and it is preferred in view of the productivity and the workability of the optical memory device to be fabricated herein.

For its better portability, the overall thickness of the optical memory device 4 is preferably as thin as possible. For it, it is desirable that the base layers 5, 5' are also as thin as possible. Concretely, the thickness of the base layers 5, 5' is preferably at most 500 $\mu$m, more preferably at most 250 $\mu$m, even more preferably at most 100 $\mu$m. However, for ensuring the mechanical strength of the optical memory device 4 so that it does not readily warp, the thickness of the base layers will have to be at least 10 $\mu$m, more preferably at least 20 $\mu$m. In short, the thickness of the base layers 5, 5' preferably falls between 10 $\mu$m and 500 $\mu$m (e.g., between 10 $\mu$m and 250 $\mu$m, between 10 $\mu$m and 100 $\mu$m, between 20 $\mu$m and 500 $\mu$m, between 20 $\mu$m and 250 $\mu$m, or between 20 $\mu$m and 100 $\mu$m).

In particular, when the base layers 5, 5' are formed of a resin film, the resin film may be a thermally-stretched resin film of polycarbonate as above, or it may be formed in a mode of solvent casting of resin. For example, the resin film for the base layers may have a thickness of from 10 $\mu$m (preferably from 20 $\mu$m) to 500 $\mu$m.

Preferably, the refractive index of the base layers 5, 5' is as near as possible to the refractive index of the core layer 3 and the cladding layer 2. This is because, if there is a significant difference in the refractive index between the base layers 5, 5' and the core layer 3 (or the cladding layer 2) that constitute the stacked structure, the output light (signal light) will reflect on the interface between the base layers 5, 5' and the stacked structure, and if so, the energy of the signal light (output light) will lower and the ratio S/N will thereby lower.

Accordingly, it is desirable that the difference in the refractive index between the core layer 3 (or the cladding layer 2) that constitute the stacked structure, and the material to form the base layers 5, 5' is at most 0.2. Precisely, it is desirable that the refractive index difference between the core layer 3 and the base layers 5, 5' is at most 0.2 and the refractive index difference between the cladding layer 2 and the base layers 5, 5' is also at most 0.2.

In fabricating the optical memory device 4 having the sandwich structure formed between the thin-film base layers 5, 5' as illustrated, the resinous cladding layers 2 and the resinous core layers 3 are alternately formed on the first thin-film base layer 5, and finally the stacked structure is covered with the second thin-film base layer 5'.

In this case, the stacked structure of the core layers and the cladding layers alternately stacked on the first thin-film base layer 5 is, before covered with the second thin-film base layer 5', asymmetric and is apt to warp in one direction. When the stacked structure has warped before it is covered with the second thin-film base layer 5' and when the thus-warped structure is covered with the second thin-film base layer 5' as it is, the warped condition will be kept as such.

If so, even if the stacked structure is formed to have a sandwich structure, the optical memory device 4 having the sandwich structure will be still warped.

In order to solve the problems as above, it is desirable that a stamper, for example, a transparent stamper is used in the process of fabricating the sandwich-structured optical memory device 4. However, the process of fabricating the optical memory device of the invention is not limited to that case of using such a stamper.

The constitution and the preparation method of the transparent stamper are described below with reference to FIG. 4 and FIG. 5.

As will be mentioned hereinunder, the transparent stamper 13 illustrated is used in fabricating the optical memory device 4 and is so designed that it may transmit light (e.g., UV ray) for curing the core resin and the cladding resin to constitute the device 4.

The transparent stamper (stamper for fabricating optical memory devices) 13 has a three-layered structure that comprises a cladding layer 10 which serves as a stamper layer having a stamper face with a desired concave and convex pattern (pits) formed on its surface in accordance with the information of the image to be reconstructed, a core layer 11 which serves as an adhesive layer, and a resin film (resin film layer, resinous base layer, base film layer) 12 which serves as a base (base layer), for example, as in FIG. 4. As illustrated, the resin film 12 is stuck to the cladding layer 10 via the core layer 11.

In this embodiment, the transparent stamper 13 is composed of the cladding layer 10, the core layer 11 and the resin film 12, and this is a flexible film stamper.

In this, the cladding layer 10, the core layer 11 and the resin film 12 are all transparent to the light for use in fabricating the optical memory device of the invention (precisely, to the light (e.g., UV ray) to which the core resin and the cladding resin are exposed to cure to form the optical memory device) or that is, they all transmit light. Therefore, the cladding layer 10 will be referred to as a transparent cladding layer (e.g., UV-transmitting cladding layer), the core layer 11 will be referred to as a transparent core layer (e.g., UV-transmitting core layer), and the resin film 12 will be referred to as a transparent resin film (e.g., UV-transmitting resin film).

Of those, the cladding material for the cladding layer 10 may be a UV-curable resin material (a type of photocurable resin material) that cures when exposed to UV rays. A metal stamper (e.g., nickel stamper) 1 is prepared, which has, on its surface, a desired concave and convex pattern (pits) that corresponds to the information of the image to be reconstructed. A UV-curable resin is applied onto the patterned surface of the metal stamper, and exposed to UV rays to be cured. Thus cured, this is the resinous cladding layer 10.

For the resin film (base film) 12, preferred are thermoplastic resin films having good optical properties, for example, polycarbonates, amorphous polyolefins such as ARTON™ (by JSR), as well as PET (polyethylene terephthalate) and PEN (polyethylene naphthalate). Of those, PEN has good heat resistance. In particular, PET and PEN are more preferred as they readily give good films of uniform thickness. PET and polycarbonates are preferred to ARTON, as stiffer.

In this embodiment, cut pieces of film are used for the resin film 12. Apart from these, a continuous film may also be used for it. Concretely, for example, a cladding resin and a core resin are applied onto the film with a die coater, a microgravure coater, a bar coater or the like, and then they are cured with a stamper applied thereto under pressure.

According to the combined process, the core layer and the cladding layer are laminated on the base film that serves as a base layer to thereby construct the transparent stamper 13.

The core layer 11 functions as an adhesive to bond the cladding layer 10 to the resin film 12, and this is formed of a UV-curable resin (a type of photocurable resin). This is because the core layer 11 may serve as it is in the optical memory device fabricated herein, and it is desirable that the same material is used in forming the core layer 11 in the stamper 13 and in forming the core layer 3 in the optical memory device 4. Another advantage of the core layer 11 formed of a photocurable resin or a thermosetting resin is that the core layer 11 is highly adhesive to the resin film 12.

In the transparent stamper 13, used are the terms of core layer (core resin) 11 and the cladding layer (cladding resin) 10. However, these terms are merely used so herein, since the same resin as that for the core layer (core resin) and the cladding layer (cladding resin) to constitute the optical memory device of the invention may be used for these layers and resins 10 and 11 and, in addition, these layers 10 and 11 can be formed in the same manner of forming and curing the core layer and the cladding layer of the optical memory device, and since the same equipment may be used in forming the layers 10 and 11 of the transparent stamper and in forming the layers 2 and 3 of the optical memory device. Accordingly, the terms of the core layer 11 and the cladding layer 10 that constitute the transparent stamper 13 are not whatsoever limited to those having a specific refractive index like the core layer (core resin) and the cladding layer (cladding resin) of the optical memory device.

In this embodiment, the concave and convex pattern of the metal stamper 1 is replicated onto the cladding layer 10, which is then stuck to the resin film 12 via the core layer 11 serving as an adhesive. However, this process is not limitative. Apart from it, other various processes may be employed herein. For example, the concave and convex pattern of the metal stamper 1 is replicated onto the cladding layer 10, and this is directly stuck to the resin film 12 (in this case, the cladding layer 10 serves as an adhesive, and the resulting transparent stamper has a two-layered structure of the cladding layer and the resin film); the concave and convex pattern of the metal stamper 1 is replicated onto the core layer, and this is then stuck to the resin film via the cladding layer that serves as an adhesive; or the concave and convex pattern of the metal stamper 1 is replicated onto the core layer, and this is directly stuck to the resin film (in this case, the core layer serves as an adhesive, and the resulting transparent stamper has a two-layered structure of the core layer and the resin film).

The resin for the core layer 11 and the cladding layer 10 may be any and every one that is liquid (fluid) while applied to a base substrate and then curable. It may be any curable resin, including, for example, photocurable resins except the above-mentioned UV-curable resin, and thermosetting resins that are curable when heated. If desired, hot-melting resins are also employable for these.

In particular, the resin for the cladding layer 10 that is to be pressed with the metal stamper 1 for pattern replication thereon is not required to have a specific refractive index. For it, for example, preferred are UV-curable resins mentioned above. More preferred are acrylic, epoxy or thiol resins.

Similarly, the resin for the core layer 11 that serves as an adhesive (adhesive layer) is not also required to have a specific refractive index. For it, usable is any and every one that is transparent in the wavelength range of the light for service and does not easily peel off after stuck to the resin film 12. For it, for example, employable are photocurable, thermosetting, cold-curable, hot-melting or two-pack adhesives, and the adhesives may be formed of any of acrylic, epoxy, cyanoacrylate, urethane or olefin resins. However, the resin for the core layer 11 is preferably so selected that its adhesiveness and compatibility with the resin film and the cladding layer to be combined with it is good.

The base layer to support the transparent stamper 13 is formed of the resin film 12. This is because the resin film 12 is readily attached to and detached from the metal stamper and is favorable in view of the productivity and the workability. However, the base layer is not limited to only the resin film 12. For it, for example, any of various curable resins may be applied to a base substrate and then cured thereon; or a resin is dissolved in a solvent, and the resulting resin solution may be applied to a base substrate and then dried thereon to form the resinous base layer.

The transparent stamper 13 that comprises the cladding layer 10, the core layer 11 and the resin film 12 has a filmy structure, but its structure is not limited to such a filmy one. For example, the stamper 13 may also be a plate stamper, and its thickness does not have any specific meaning.

As so mentioned hereinabove, the transparent stamper 13 is not specifically defined in point of its material and thickness, so far as it transmits light (e.g., UV ray) to which the core resin and the cladding resin are exposed for curing them in fabricating the optical memory device of the invention. For example, the material capable of transmitting UV rays to which the core resin and the cladding resin are exposed for curing them in fabricating the optical memory device of the invention includes resin, glass and quartz, and any of these may be used in constructing the transparent stamper 13. However, when the transparent stamper 13 must be laminated on a base substrate and therefore it must be flexible in the process of fabricating the optical memory device, or when the transparent stamper 13 is fabricated in the same manner as that for fabricating the optical memory device, it is desirable that the transparent stamper 13 is formed of resin.

In this embodiment, UV-curable resin is used for the core layer 11 and the cladding layer 10. Therefore, the transparent stamper 13 that comprises these layers 10 and 11 may be at least a UV-transmitting stamper capable of transmitting UV rays.

In this embodiment, the transparent stamper (film stamper, plate stamper) 13 is flat, but its shape is not limited to that illustrated herein. For example, a flexible, transparent film stamper may be wound around a roll to construct a roll stamper for use herein. The roll stamper is advantageous, as it increases the productivity in the replication process from the stamper.

Next described is a method for producing the transparent stamper 13 having the structure as above.

First referred to is FIG. 5A. As illustrated, a metal stamper (original hard stamper such as nickel stamper) 1 is processed to have a concave and convex pattern thereon. The concave and convex pattern formed on it corresponds to that of the image (information) to be reconstructed by the use of the optical memory device of the invention. On the patterned surface of the stamper 1, applied is a cladding resin (liquid cladding resin), and this is cured thereon to form a cladding layer having a predetermined thickness (e.g., about 6 $\mu$m). After thus cured, the concave and convex pattern of the metal stamper 1 is replicated on the cladding layer (stamper layer) 10, and the resinous cladding layer has the thus-replicated concave and convex pattern thereon (replication process). If desired, any other resin capable of functioning as the cladding layer 10 may be dissolved in a solvent, and the resulting resin solution may be applied onto the metal stamper and dried to form the intended cladding layer 10. In fact, the concave and convex pattern thus replicated on the cladding layer 10 scatters in the face of the layer like pits, for example, as in CD (compact disc).

Next, a core resin (liquid core resin, liquid photocurable resin) 11 of a UV-curable resin (a type of photocurable resin) that serves as an adhesive is applied onto the surface of the cladding layer 10 to form a core layer having a predetermined thickness (for example, about 1.8 $\mu$m after cured), as in FIG. 5B. If desired, any other resin capable of functioning as the core layer 11 may be dissolved in a solvent, and the resulting resin solution may be applied to the cladding layer 10 and dried thereon.

For forming the core layer 11 and the cladding layer 10, for example, herein employable is any coating method of spin coating, blade coating, gravure coating or die coating so far as it satisfies the desired film thickness and the film uniformity.

Next, the resin film (resin film layer, base film) 12 that serves as a base layer is attached to the surface of the core layer 11 with a laminate roll or the like so that no bubble is between the two, as in FIG. 5B. In short, this step is to laminate the resin film 12 to the cladding layer 10 via the core layer 11.

In this embodiment, when the resin film (filmy member) 12 is laminated on the core layer (resin layer) 11, the resin film 12 is pressed against the core layer 11 (with some pressure being applied to the two), for example, by the use of a roll (e.g., laminate roll). In this stage, the resin film (filmy member) 12 is preferably laminated onto the core layer 11 in such a controlled manner that the distance between the surface of the core layer (resin layer) 11 above the cladding layer 10 and the laminate roll is kept constant. This is for preventing the thickness of the core layer 11 from varying during the lamination process. Its details are described hereinunder.

Next, the thus-stacked structure is exposed to UV rays on the side of the resin film 12 (that is, on the side opposite to the metal stamper 1) to thereby cure the core resin 11 to give a resinous core layer 11, and the resin film 12 is thus laminated on the cladding layer 10 via the core layer 11, as in FIG. 5B. This is a laminating process in which the resin film 12 is laminated to the cladding layer with the concave and convex pattern replicated thereon.

Next, the stacked structure of the core layer 11, the cladding layer 10 and the resin film 12 is separated (released) from the metal stamper 1, as in FIG. 5C. This is a separating step. The process gives a transparent stamper (film stamper) 13 to be used in fabricating optical memory devices, which comprises the resin film 12 serving as a resinous base layer, the resinous core layer 11 formed thereon, and the resinous cladding layer 10 further formed thereon, as in FIG. 5D. In this, the resinous cladding layer 10 has the concave and convex pattern having been replicated (formed) from the metal stamper 1.

In this embodiment, the transparent stamper 13 is exposed to UV rays on the side of the resinous cladding layer 10 that has the concave and convex pattern having been replicated from the metal stamper 1, as in FIG. 5D. This is for further curing the resinous layers to thereby lower the adhesiveness of the concave and convex pattern (pits) formed in the cladding layer 10. This is overcure treatment. Thus overcured, the transparent stamper 13 is preferably heated at a high temperature of, for example, at about 120° C. Also preferably, the high-temperature treatment takes about 1 hour or so. This is to further lower the adhesiveness of the pattern. This treatment is also referred to as overcure. The overcure treatment is effective for improving the peelability of the transparent stamper 13 from the core resin and the cladding resin that constitute the optical memory device to be fabricated by the use of the stamper 13.

Next described is a process of using the thus-prepared transparent stamper 13 in fabricating an optical memory device in which the thin-film base layer is a resin film 5 (this is a process for fabricating optical memory devices).

The outline of the process of fabricating optical memory devices is as follows: In this process, first provided is a thin-film base layer 5 on a substrate (this differs from the base layer) of glass or the like. Next, a resinous core layer 3 and a resinous cladding layer 2 are alternately stacked on the base layer 5. Finally, another thin-film base layer 5 is applied to the stacked structure to complete a sandwich structure. Thus completed, the sandwich-structured optical memory device 4 formed between the thin-film base layers 5 is peeled away from the substrate.

The process of fabricating the optical memory device as above is described in more detail with reference to FIG. 6A to FIG. 6E.

First, a cladding resin (liquid cladding resin) 2X is applied onto a base substrate 21 for optical memory devices, to thereby form thereon a layer having a predetermined thickness (e.g., about 5 $\mu$m after cured), as in FIG. 6A.

In this embodiment, the cladding resin 2X is a UV-curable resin (a type of photocurable resin) that is curable when exposed to UV rays. This is applied on to the surface of the base substrate 21, and then exposed to UV rays to be cured. Thus cured, this forms a resinous cladding layer 2X. If desired, any other desired resin capable of functioning as the cladding layer 2X may be dissolved in a solvent, and the resulting resin solution may be applied to the substrate and dried thereon to form the cladding layer 2X.

In this embodiment, the base substrate 21 is a stiff substrate, for example, a glass substrate, a polycarbonate substrate or an amorphous polyolefin substrate of ARTON (by JSR) of the like having a thickness of a few mm. Concretely, it may have a thickness of from about 0.1 mm to about 3 mm or so, preferably about 1 mm or so.

One reason of using such a stiff substrate is as follows:

While resinous core layers 3 and resinous cladding layers 2 are stacked on the substrate 21, the internal stress inside the resin to form the core layers 3 and the cladding layers 2 will act to warp the substrate in one direction, as will be so mentioned hereinunder, since the stacked layers do not as yet have a sandwich structure.

In this stage, if the mechanical strength of the substrate 21 is unsatisfactory, the substrate 21 will warp, and if it warps too much, it could not be coated with further resin and could not be laminated with a resin film in the subsequent process.

On the other hand, if the warped substrate 21 with the constitutive layers stacked thereon is covered with a thin-film base layer 5 to finish the intended sandwich structure, and if it is peeled from the substrate 21, the sandwich-structured optical memory device 4 thus fabricated will be kept warped.

To overcome the problems noted above, the substrate 21 should be a stiff substrate in order that it is prevented from warping while the resinous core layers and the resinous cladding layers are stacked thereon.

Accordingly, since its mechanical strength is high, the stiff substrate 21 is prevented from warping (curving, curling) even though the UV-curable resins having been applied thereonto have shrunk after cured to form thereon the resinous cladding layers 2 and the resinous core layers 3.

One reason of being able to use the stiff substrate 21 as above is as follows:

The substrate is finally released from the optical memory device 4. Therefore, the thickness and the weight of the substrate do not have any influence on the thickness and the weight of the optical memory device 4. Accordingly, even if the substrate 21 is thick and heavy, the optical memory device 4 fabricated by the use of such a thick and heavy substrate does not lose its practicability. Therefore, the substrate to be used in this embodiment may be any one having a satisfactorily high strength enough to prevent it from warping.

In case where a metal stamper is used in fabricating the optical memory device, it is difficult to bend to the stamper. In this case, therefore, it is difficult to peel (release) the stacked structure that comprises the cladding layer and the core layer from the metal stamper, if the base substrate for the optical memory device is stiff. For this reason, a stiff base substrate could not be used in fabricating the optical memory device. As opposed to this, however, since a soft (flexible) transparent resin stamper (film stamper) 13 is used in this embodiment, the stamper 13 is easy to peel (release) from the stacked structure. Therefore in this embodiment, a stiff substrate may be used for the base substrate.

The base substrate 21 for fabricating optical memory devices may be any and every one that is resistant to shrinkage of the UV-curable resin cured through exposure to UV rays to form the cladding layers 2 and the core layers, and has a mechanical strength enough to prevent the cladding layers 2 and the core layers stacked thereon from warping.

Next, after the cladding resin 2X has been cured, a core resin (liquid core resin) 3Xa of a UV-curable resin (a type of photocurable resin) is applied thereon to form a layer having a predetermined thickness (e.g., about 1.8 $\mu$m or so after cured) as in FIG. 6A. If desired, any other resin capable of functioning as the core layer 3Xa may be dissolved in a solvent and the resulting resin solution may be applied onto the cladding layer 2X and dried to form thereon the intended core layer 3Xa.

Next, after the core layer 3Xa has been formed on the layer 2X, a resin film (resin film member, base film) 5 to be a thin-film base layer is laminated on the surface of the core layer 3Xa under pressure with a laminate roll or the like with no bubble being between the two, as in FIG. 6A. This is for laminating the resin film 5 on the cladding layer 2X via the core layer 3Xa.

In this embodiment, when the resin film (filmy member) 5 is laminated on the core layer (resin layer) 3Xa, the resin film 5 is pressed against the core layer 3Xa (with some pressure being applied to the two), for example, by the use of a roll (e.g., laminate roll). In this stage, the resin film (filmy member) 5 is preferably laminated onto the core layer 3Xa in such a controlled manner that the distance between the surface of the core layer (resin layer) 3Xa above the cladding layer 2X and the laminate roll is kept constant. This is for preventing the thickness of the core layer 3Xa from varying during the lamination process. Its details are described hereinunder.

In that condition, the thus-stacked structure is exposed to UV rays to thereby cure the core resin 3Xa to form the resinous core layer 3Xa, and the resin film 5 is adhered to the core layer 3Xa.

In this embodiment, it is desirable that the resin film 5 is transparent in the wavelength range of the light for use to the optical memory device (that is, in the wavelength range of the laser ray that passes through the core layer 3 of the device), therefore capable of transmitting scattered light, and is as thin as possible, so far as it has good optical properties, its thickness is uniform and its mechanical strength is high. This is in order that the light having scattered on the concave and convex pattern finally goes out of the device and that the optical memory device 4 finally fabricated herein could be as thin as possible. In this embodiment, in addition, the specific structure is in order that the core layer 3Xa between the resin film 5 and the cladding layer 2X receive few bubbles from the outside.

The advantage of the thin resin film 5 is as follows: When the resin film 5 is thin, it is soft and flexible. Therefore, in the step of laminating the thin resin film 5 onto the cladding layer 2X coated with the core layer 3Xa, the resin film 5 may be gradually kept in contact with the stacked structure while it is bent, and, as a result, the contact area between the two can be gradually increased. Accordingly, bubbles are prevented from entering the cladding layer 2X to have some negative influence on the layer 2X to thereby change the refractive index and the thickness of the layer 2X.

Therefore, for the resin film 5, preferred are thermoplastic resin films having good optical properties, for example, polycarbonates, amorphous polyolefins such as ARTON (by JSR), as well as PET (polyethylene terephthalate) and PEN (polyethylene naphthalate). Of those, PEN has good heat resistance. In particular, PET and PEN are more preferred as they readily give good films of uniform thickness. Any of these films may be formed through thermal stretching or solvent casting, and it is desirable that the resin film 5 has a thickness of, for example, at most 100 $\mu$m.

If the resin film 5 is thicker than the range, its softness (flexibility) will be poor, and some bubbles will enter the interface between the core layer 3Xa and the resin film 5 while the resin film 5 is laminated over the layer 3Xa. On the contrary, if the resin film 5 is extremely too thin, for example, its thickness is smaller than 1 $\mu$m, it is unfavorable since it could not support the stacked structure composed of the cladding layers 2 and the core layers 3 for the optical memory device of the invention when the stacked structure is peeled (released) from the base substrate 21.

In the process mentioned above, the cladding layer 2X is formed on the base substrate 21, and then the resin film 5 is laminated thereon via the core layer 3Xa therebetween, to which, however, the invention is not limited. Apart from this, a cladding layer 2X may be formed on the base substrate 21, and then a resin film 5 may be directly laminated on the cladding layer 2X that serves as an adhesive. In this case, the resin film 5 is laminated on base substrate 21 via the cladding layer.

In still another modification, a core layer is first formed on the base substrate 21, and then a resin film 5 maybe laminated thereon via a cladding resin that functions as an adhesive. In this case, the resin film 5 is laminated on the base substrate 21 via the core layer and the cladding layer.

In still another modification, a core layer is formed on the base substrate 21, and a resin film 5 may be laminated on the core layer that serves as an adhesive. In this case, the resin film 5 is laminated on the base substrate via the core layer.

All these are for laminating the resin film 5 that serves as a base layer on the base substrate for optical memory devices. Therefore, the process of fabricating these is for base layer lamination.

In this embodiment, the core resin (core layer) and the cladding resin (cladding layer) for the adhesive (adhesive layer) are not always required to have a specific refractive index, and any materials may be suitably combined for these of better adhesion affinity, especially in consideration of the properties of the materials for the resin film 5 and the base substrate 21. For this, for example, various types of adhesives such as photocurable, thermosetting, cold-curable, hot-melting or two-pack adhesives may be used. Concretely, acrylic, epoxy, cyanoacrylate, urethane or olefin adhesives are employable.

Next, a core resin (liquid core resin) 3Xb of a UV-curable resin is applied onto the resin film 5 to thereby form thereon a layer having a predetermined thickness (e.g., about 1.8 $\mu$m after cured), and then this is exposed to UV rays to be cured into a resinous core layer 3Xb, as in FIG. 6B.

The two core layers 3Xa, 3Xb differ from the core layer 3 to be mentioned hereinunder in that they do not have a concave and convex pattern, and serve exclusively as an adhesive for the cladding layer 2X and the resin film 5. These do not have a function for information reconstruction. Similarly, the cladding layer 2X also differs from the cladding layer 2 mentioned hereinunder. Not functioning as a waveguide, the cladding layer 2X serves exclusively as an adhesive for bonding the core layer 3Xa to the glass substrate 21, a type of base substrate for optical memory devices.

Next, a cladding resin (liquid cladding resin) 2 is applied onto the surface of the core layer 3Xb to form a layer thereon having a predetermined thickness (e.g., from about 15 to about 20 $\mu$m after cured), as in FIG. 6C. In this embodiment, a UV-curable resin capable of curing through exposure to UV rays is used for the cladding resin, and after this has been applied onto the surface of the core layer 3Xb, this is exposed to UV rays to be cured into a resinous cladding layer 2. If desired, any other resin capable of functioning as the cladding layer 2 may be dissolved in a solvent and the resulting resin solution may be applied onto the core layer 3Xb and dried to form the intended cladding layer thereon.

After the cladding resin 2 has been cured in that manner, a core resin (liquid core resin) 3 of a UV-curable resin, of which the refractive index is larger than that of the cladding layer 2, is applied onto the cladding layer 2 to form thereon a layer having a predetermined thickness (e.g., about 1.8 $\mu$m after cured), as in FIG. 6C. If desired, any other resin capable of functioning as the core layer 3 may be dissolved in a solvent and the resulting resin solution maybe applied onto the cladding layer 2 and dried to form the intended core layer 3 thereon.

Next, after the core resin 3 has been formed in the manner as above, a transparent stamper (film stamper, resinous stamper) 13 is laminated on the core layer 3, as in FIG. 6C. The transparent stamper 13 is processed to have a desired concave and convex pattern (pits) on its surface, corresponding to the image (information) to be reconstructed in the device.

In this embodiment, when the transparent stamper (filmy member) 13 is laminated on the core layer (resin layer) 3, the transparent stamper 13 is pressed against the core layer 3 (with some pressure being applied to the two), for example, by the use of a roll (e.g., laminate roll). In this stage, the transparent stamper (filmy member) 13 is preferably laminated on to the core layer 3 in such a controlled manner that the distance between the surface of the core layer (resin layer) 3 above the cladding layer 2 and the laminate roll is kept constant. This is for preventing the thickness of the core layer 3 from varying during the lamination process. Its details are described hereinunder.

In that condition, the stacked structure is exposed to UV rays on the side of surface of the transparent resinous stamper 13 (concretely, on the side of the resin film 12 of the stamper 13, or that is on the side opposite to the side of the concave and convex-patterned surface of the stamper 13) to thereby partly imperfectly cure the core resin 3 by the action of the UV rays having passed through the transparent stamper 13, as in FIG. 6D.

In this embodiment, partly imperfectly curing the core resin 3 means that the core resin 3 is only partly and imperfectly (or that is, not completely) cured. Concretely, for example, the edges of the core layer that are kept in contact with air are poorly cured as compared with the other part of the layer, and only the edges of the core layer are imperfectly (that is, not completely) cured through exposure to UV rays.

In this embodiment, the core layer 3 is not completely cured but is partly incompletely cured in the manner as above. This is because if the core layer 3 laminated with the transparent stamper 13 is completely cured, the stamper 13 could not peeled off from the core layer 3.

Next, the transparent resinous stamper 13 is peeled (released) from the core layer 3 of the stacked structure formed on the base substrate 21, as in FIG. 6E. After that, the resinous core layer 3 with the concave and convex pattern replicated (formed) on its surface from the transparent resinous stamper 13 is exposed to UV rays by which the core layer 3 is thereby finally cured. According to the process, the resinous cladding layer 2 is formed on the base substrate 21, and the resinous core layer (recording layer, waveguide) 3 is laminated on the cladding layer 2. In the thus stacked structure, the resinous core layer 3 has the concave and convex pattern replicated from the transparent resinous stamper 13. Thus replicated, the concave and convex pattern is in the plane as pits, for example, like in CD (compact disc).

Next, a cladding resin (liquid cladding resin) 2 of a UV-curable resin, of which the refractive index is smaller than that of the core layer 3, is applied onto the surface of the core layer 3 to thereby form a layer having a predetermined thickness (e.g., from about 15 to about 20 $\mu$m after cured), and then exposed to UV rays to be cured into a resinous cladding layer 2.

After this, the same process as above (comprising the steps of FIG. 6C to FIG. 6E) is repeated, whereby a desired number of core layers 3 and cladding layers 2 are alternately stacked (for example, up to around 100 layers each) on the base substrate 21, with no resin film interposed between the stacked layers.

The process of alternately stacking the cladding layers 2 and the core layers 3 on the resin film (base layer) 5 until a desired number of these layers are stacked up thereon in the manner as above is referred to as a process of forming a stacked structure.

In this embodiment, after the desired number of the layers have been stacked up in the manner as above, a core resin (liquid core resin) 3Xc of a UV-curable resin is finally applied to the surface of the last-stacked cladding layer 2 (the uppermost cladding layer) to form thereon a layer having a predetermined thickness (e.g., about 1.8 $\mu$m after cured), as in FIG. 7A.

Next, after the core layer 3Xc has been formed in the manner as above, the resin film (resinous film member, base film) 5' to be a base layer is laminated on the surface of the core layer 3Xc by pressing them with a roll or the like, as in FIG. 7A. In this step, the operation is so controlled that no bubble is between the laminated layers.

In this embodiment, when the resin film (filmy member) 5' is laminated on the core layer (resin layer) 3Xc, the resin film 5' is pressed against the core layer 3Xc (with some pressure being applied to the two), for example, by the use of a roll (e.g., laminate roll). In this stage, the resin film (filmy member) 5' is preferably laminated onto the core layer 3Xc in such a controlled manner that the distance between the surface of the core layer (resin layer) 3Xc above the cladding layer 2 and the laminate roll is kept constant. This is for preventing the thickness of the core layer 3Xc from varying during the lamination process. Its details are described hereinunder.

After thus laminated, this is exposed to UV rays whereby the core layer 3Xc is cured. According to the process, the resinous core layer 3Xc is formed and, at the same time, the resin film 5' is stuck to the core layer 3Xc.

Next, the thus-fabricated optical memory device (concretely, this has a stacked structure of the cladding layers 2 and the core layers 3 of a UV-curable resin sandwiched between the resin films 5, 5') is peeled (released) from the base substrate 21, as in FIG. 7B. Concretely, the stacked structure sandwiched and integrated between the resin films 5, 5' is peeled from the base substrate 21, while being supported by the resin films 5, 5'. This process of separating the stacked structure sandwiched and integrated between the resin films (base layers) 5, 5' from the base substrate 21 is referred to as a process of separating a stacked structure from the substrate.

Thus separated from the base substrate 21, the optical memory device 4 is processed to form an end, and a protective film is attached thereto, or a resin coat is formed on it. Thus processed, the optical memory device is modified into various optical memory media such as optical memory cards, etc.

As so described hereinabove, the core resin 3 may be any and every type of resin so far as it is liquid when used for coating and then it is curable. For the core resin, for example, preferred are curable resins such as UV-curable or photocurable resins or thermosetting resins. However, in case where a pattern is replicated on the resin layer by the use of a stamper as in the above, preferred for the layer are photocurable resins. For example, acrylic photocurable resins (a type of acrylic curable resins), epoxy photocurable resins (a type of epoxy curable resins), and thiol photocurable resins (a type of thiol curable resins) are preferred for the layer.

On the other hand, the cladding resin 2 may be also any and every type of resin, so far as it is transparent and its refractive index is smaller in some degree than that of the core resin 3. Anyhow, resinous cladding layers 2 are preferred as convenient in various aspects. For example, the cladding layer 2 formed of a curable resin, such as a UV-curable or photocurable resin or a thermosetting resin is highly adhesive to the resin film 5, and is therefore favorable to the invention. In particular, photocurable resins are especially preferred for the cladding layer 2. For example, for it, preferred are acrylic photocurable resins (a type of acrylic curable resins), epoxy photocurable resins (a type of epoxy curable resins), and thiol photocurable resins (a type of thiol curable resins).

For forming the core layer 3 and the cladding layer 2, for example, known are various coating methods of spin coating, blade coating, gravure coating or die coating. Any of such coating methods is applicable to the invention so far as it forms even and uniform films.

As so mentioned hereinabove, the number of the cladding layer 2 may be one or may be two or more for further stabilizing the thickness of the device fabricated.

In this embodiment, the stacked core layers 3 and cladding layers 2 are all of resin, and, in addition, the core layer 3 to be processed to have a concave and convex pattern on its surface is formed of a curable resin that may be cured by light or heat, as so mentioned hereinabove. Accordingly, the desired concave and convex pattern 6 may be formed in the interface between the core layer 3 and the cladding layer 2 through replication from a stamper, not requiring a complicated process of exposure and development of photoresist as in conventional techniques.

Thus fabricated as in the above, the optical memory device 4 is then processed to have an end (light-receiving end) via which incident ray (reference beam) applied to the device is led into the resinous core layer 3 therein. Using the light which is led to the core layer 3 in the device, the information recorded in the information-recording area (that is, in the area in which the concave and convex pattern 6 for information is formed in the interface between the resinous core layer 3 and the resinous cladding layer 2) is read.

In this embodiment, the optical memory device 4 fabricated by the use of a circular stamper is cut into individual optical memory devices 4 having a desired size, and the end of every device is cut at 90 degrees (90-degree end). Concretely, the angle formed by the face of the waveguide block 323 and the end of the device 4 is 90 degrees.

The end through which the incident ray is led into the resinous core layer 3 of the device 4 is not limited to that type, but may be in any other various forms. For example, one end of the optical memory device 4 may be cut at an angle of 45 degrees (the angle formed by the face of the waveguide block and the end is 45 degrees), and if desired, a reflective film may be formed on the end face to be a mirror end (inclined end, micromirror). This mirror face may serve as the end (45-degree end) that receive the incident ray applied to the device. In this case, the incident ray is directed toward the 45-degree inclined end of the optical memory device 4 in the direction vertical to the face of the device 4, and it is reflected on the 45-degree inclined end of the device and then led into the resinous core layer 3 thereof.

For example, when incident ray is introduced into the core layer 3 of the thus-fabricated optical memory device 4 via the end of the device 4, the light having entered the device 4 runs through it while scattering in the concave and convex pattern in the interface of the constituent layers of the device. In this stage, the scattered light passes (runs) in the vertical direction relative to the running direction of the incident ray (or that is, the scattered light crosses the incident ray), and finally it is led out through the two ends of the optical memory device to thereby reconstruct the image in accordance with the concave and convex pattern formed in the device.

Regarding the thickness of the core layer 3 and the cladding layer 2, the layers are not specifically defined in point of their thickness so far as they function as waveguides. For example, when visible light is used for the device, the thickness of the core layer 3 may be approximately from 0.5 to 3.0 $\mu$m or so. In this case, the thickness of the cladding layer 2 is not specifically defined. For reducing the overall thickness of the device, the thickness of the cladding layer 2 is preferably at most 100 $\mu$m. Though not specifically defined, the lowermost limit of the thickness of the cladding layer may be at least 0.1 $\mu$m.

Preferably, the thickness of the optical memory device 4 is at least about 0.3 mm in order that the mechanical strength of the device 4 is good. More preferably, it is at least about 0.5 mm. However, in view of the portability of the device for optical memories (information-recording media) such as optical cards, the thickness of the device is preferably at most about 5 mm, more preferably at most about 3 mm.

Regarding the number of the core layers 3 to be staked up, it is desirable that a larger number of core layers 3 are stacked up for increasing the recording capacity of the optical memory device 4. For example, the number of the core layers to be stacked up is preferably at least 10. However, too many core layers are stacked up, the device fabricated will readily warp. Therefore, for example, at most 200 core layers may be stacked up for practical use.

In the embodiment illustrated herein, cut sheets of film are used for the resin film (thin-film base layer) 5. Apart from these, a continuous film may also be used. In this embodiment where the core layers and the cladding layers are formed on the film in a mode of die coating, microgravure coating, bar coating or the like and the thus-formed core layers and cladding layers are processed with a stamper under pressure and cured, a stacked structure of cladding layers and core layers formed on a support is fabricated. When a roll stamper capable of winding up into a roll is used, the productivity in the replication process from the stamper is further improved.

In this embodiment described hereinabove, the transparent stamper 13 is laminated on the core layer 3 to thereby replicate the concave and convex pattern of the stamper to the core layer (this is referred to as core replication, or core layer replication process), to which, however, the invention is not limited. Apart from it, for example, a transparent stamper (resin stamper, film stamper) may be laminated on the cladding layer 2 to thereby replicate the concave and convex pattern of the stamper to the cladding layer (this is referred to as cladding replication, or cladding layer replication process).

When the image to be outputted from the optical memory device fabricated according to the cladding layer replication process is compared with that to be outputted from the optical memory device fabricated according to the core layer replication process, the former does not have a virtual image of holography (for example, it is not doubled) and its quality is high. In this embodiment, the core layer is thinner than the cladding layer. In this case, therefore, the core layer replication process is preferred to the cladding layer replication process since the film thickness fluctuates little in lamination and the latitude for the lamination condition is broadened.

However, so far as the condition for lamination is optimized, the cladding layer replication process may be favorable also to the embodiment mentioned herein.

Accordingly, so far as the condition for lamination is suitably controlled, good pattern replication is possible irrespective of the thickness of the cladding layer (or that is, even if the cladding layer is thin or thick). For this reason, the cladding layer may be thick while patterned with a stamper. If desired, a first cladding layer is cured to have a predetermined thickness, and a second cladding layer that is thin for pattern replication is formed on the first cladding layer, and the intended pattern may re replicated on the thin second cladding layer.

The method of fabricating the optical memory device of the invention is not limited to the embodiment described hereinabove. In the embodiment mentioned above for fabricating the optical memory device of the invention, a base layer (resin film) is first stuck to a substrate, and then cladding layers and core layers are alternatively stacked up on the base layer (resin film) to complete a stacked structure having a predetermined number of core layers and cladding layers. However, the invention is not limited to this embodiment. Apart from this, for example, cladding layers and core layers may be alternately stacked up directly on a substrate, with no base layer (resin film) being stuck to the substrate, and a stacked structure having a predetermined number of core layers and cladding layers directly formed on the substrate may constructed.

In the embodiment mentioned in the above, the degree of inclination of each core layer 3 at the end 7 of the device and relative to the standard face of the information area in which the concave and convex pattern 6 for information is formed satisfies the condition of formula (5). In this, in addition, even when the core layer 3 is not only inclined but also warped or bent, the degree of warping or bending of the core layer 3 is prevented from being over a predetermined level. For this, a thin-film base layer 5 is provided on both surfaces (upper and lower surfaces) of the stacked structure (waveguide block 232) that comprises resinous core layers 3 and resinous cladding layers 2 stacked up to be the optical memory device 4, and, accordingly, the thus-constructed optical memory device 4 has a sandwich structure in which the stacked structure of the constituent layers is sandwiched by the thin-film base layers 5.

As so mentioned hereinabove, the sandwich structure of the optical memory device 4 that is sandwiched between thin-film base layers 5 is effective for reducing the degree of warping and bending of the constitutive core layers of the structure, and therefore the degree of bending of the core layer 3 at the end 7 of the information area in which the concave and convex pattern 6 for information is formed may satisfy the condition of the formula (1) mentioned below (see also FIG. 1). For these reasons, the sandwiched structure of the optical memory device 4 of the invention is favorable.

$$\Delta t \leq d - t \qquad (1)$$

in which $\Delta t$ indicates the degree of bending of the core layer 3 at the end 7 of the information area, d indicates the vertical width of the reference beam which the device receives (reference beam width), and t indicates the thickness of the core layer 3 in the information area (core thickness).

The degree of bending of the core layer may be measured, for example, by observing the end of the optical memory device 4 with a microscope. As so mentioned hereinabove, the process of fabricating the optical memory device 4 (optical memory fabrication process) includes a step of laminating a base layer of resin film (filmy member) 5, 5' on the core or cladding layer (of resin), and a step of laminating a transparent stamper (filmy member) 13 on the core or cladding layer (of resin). Further, the process of fabricating the transparent stamper 13 to be used in fabricating the optical memory device of the invention (optical stamper fabrication process) also includes a step of laminating a resin film (filmy member) 12 onto a core or cladding layer (of resin).

Various methods maybe employed for lamination with a filmy member of, for example, resin films 5, 5', 12 and transparent stamper 13. Typically two different methods may be employed, depending on the type of the filmy member of resin films 5, 5', 12 and transparent stamper 13 for lamination. In one method, a long filmy member is laminated onto a base substrate to be laminated with it. This method is suitable to the case where the long filmy member to be used for lamination has a broad margin before and after the area for lamination. In other method, cut sheets of film are used for lamination. This method is suitable to a case where the sheet for lamination does not have plenty of margin before and after the area for lamination.

Figure 9:
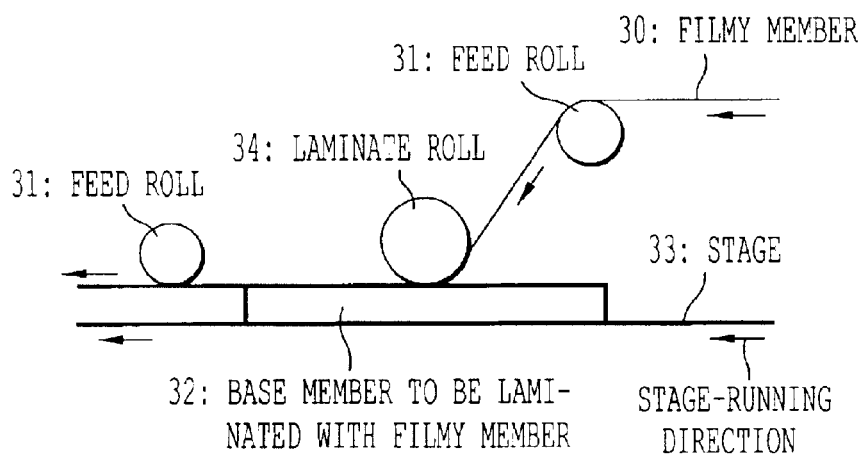
FIG. 9 is a schematic view showing one example of a process of lamination for fabrication of an optical memory device of one embodiment of the invention.

One example of the former method for laminating a long filmy member on a substrate is described. A filmy member 30 is conveyed with a feed roll 31 while its motion is synchronized with the motion of the stage 33 on which a base member 32 to be laminated with the filmy member (in this case, a stacked structure of cladding layers 2 and core layers 3) is mounted, as shown in FIG. 9. An adhesive (of resin) is previously applied to the surface of the base member 32 or the filmy member 30 to form an adhesive layer (resin layer) thereon. While the filmy member 30 and the base member 32 are moved, the filmy member 30 is pressed against the base member 32 with a laminate roll 34 applied to the back of the filmy member 30, whereby the filmy member 30 is laminated on the base member 32.

Figure 10:
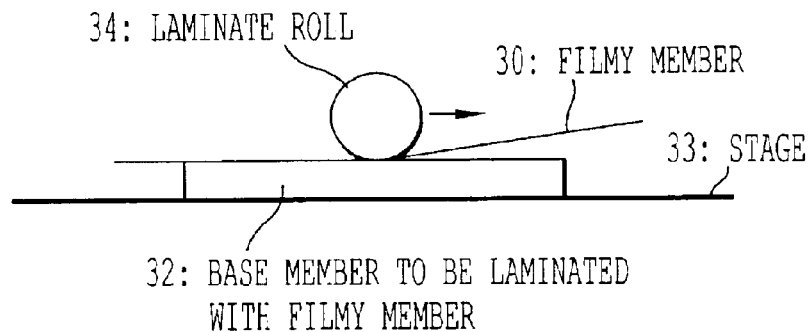
FIG. 10 is a schematic view showing another example of a process of lamination for fabrication of an optical memory device of one embodiment of the invention.

One example of the latter method for laminating a cut sheet of filmy member 30 to a base member 32 is described. As shown in FIG. 10, the filmy member 30 is kept spaced by a predetermined distance from the base member 32 by means of a holder such as a vacuum suction holder. An adhesive (of resin) is previously applied to the surface of the base member 32 or the filmy member 30 to from an adhesive layer (resin layer) thereon. The filmy member 30 is pressed against the base member 32 by a laminate roll 34 set on the filmy member 30, whereby the filmy member 30 is laminated onto the base member 32.

Figure 11A:
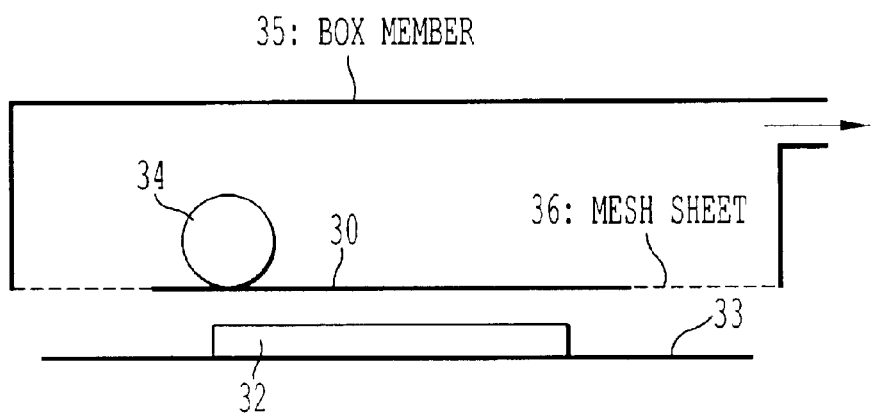
FIG. 11A and FIG. 11B are schematic view showing other examples of a process of lamination for fabrication of an optical memory device of one embodiment of the invention.
Figure 11B:
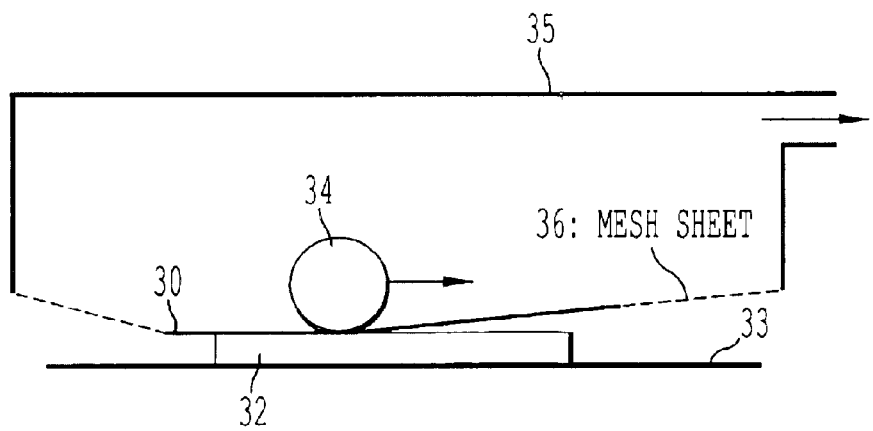

One example of the method for holding a cut sheet of filmy member 30 during the lamination process is described. As shown in FIG. 11A, a mesh sheet is fitted to the bottom of a box member 35, and the box member 35 is degassed by a pump, whereby the filmy member 30 set below the box member is attracted by the mesh sheet 36 by vacuum suction. In that condition, the filmy member 30 is fitted to the mesh sheet 36. Next, as in FIG. 11B, the laminate roll 34 is moved in the direction illustrated, whereby the filmy member 30 is pressed against the base member 32 over the mesh sheet 36 and is thus laminated on the base member 32.

Figure 12A:
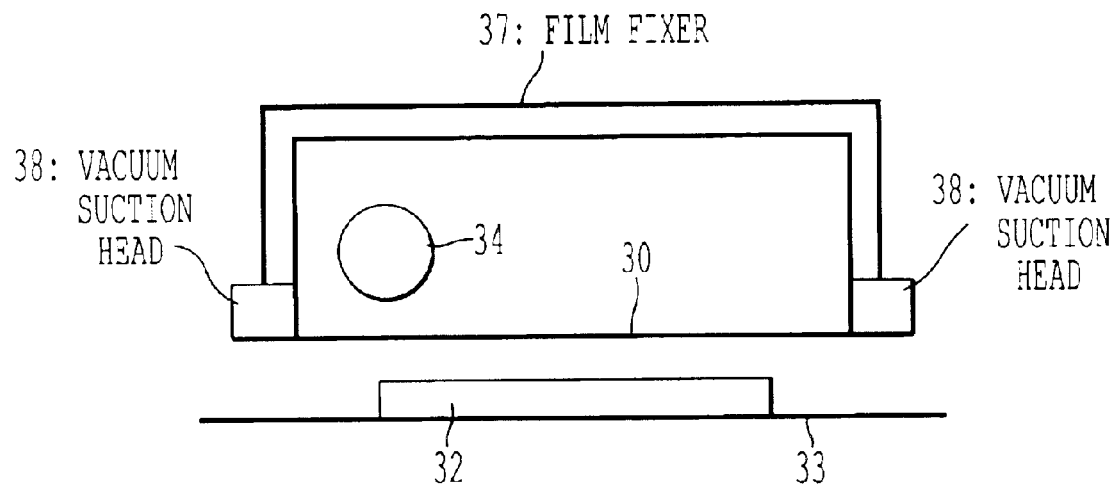
FIG. 12A and FIG. 12B are schematic view showing still other examples of a process of lamination for fabrication of an optical memory device of one embodiment of the invention.
Figure 12B:
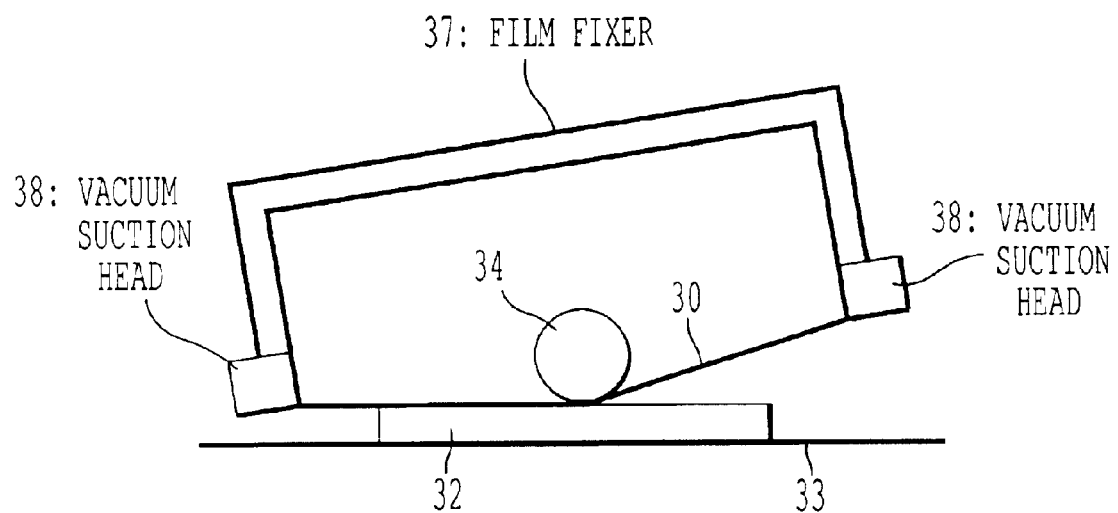

Still another example of the method for laminating a cut sheet of filmy member 30 to the base member 32 is described. As shown in FIG. 12A, the edges of the filmy member 30 are kept in vacuum contact with the vacuum suction heads 38 at the ends of a film fixer 37, whereby the filmy member 30 is fixed to the film fixer 37. As seen in FIG. 12B, the film fixer 37 is moved so as to vary its inclination, and the laminate roll 34 therein is moved. With that, the filmy member 30 is pressed against the base member 32 by the laminate roll 34, and the filmy member 30 is thus laminated on the base member 32.

The lamination must satisfy the following requirements: (1) No bubble enter the interface between the members laminated; (2) the resin layer is uniformly formed on the members to be laminated; and (3) the resin (or the resin layer) does not protrude out through the interface between the laminated members, resin films 5, 5', 12 and transparent stamper 13.

In general, the thickness of the resin layer to be formed on the members to be laminated is controlled in the step of forming the resin layer. Therefore, when the resin films 5, 5', 12 and the transparent stamper 13 are laminated, their thickness should not change.

Figure 13:
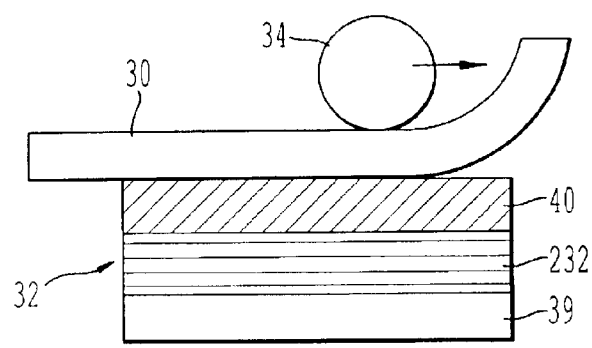
FIG. 13 is a schematic view showing still another example of a process of lamination for fabrication of an optical memory device of one embodiment of the invention.

However, in the lamination process, the filmy member 30 (e.g., resin films 5, 5', 12, transparent stamper 13) is pressed against the base member 32 (in the illustrated case, this comprises a stacked structure 232 of cladding layers 2 and core layers 3 formed on a base substrate 39 and he stacked structure 232 is covered with an adhesive layer (resin layer) 40) with the laminate roll 34 fitted to the back of the filmy member 32, while the laminate roll 34 is moved in the illustrated direction, or that is, the filmy member 30 is laminated on the base member 32 under pressure by the laminate roll 34, as so mentioned hereinabove and as shown in FIG. 13. Concretely, while the laminate roll 34 is moved in the illustrated direction from one side of the filmy member 30 (e.g., resin films 5, 5', 12, and transparent stamper 13) to the other side thereof, the filmy member 30 is pressed against the base member 32 and is thus laminated thereon. In this process, it is difficult to keep the pressure level of the moving laminate roll 34 all the time constant, and therefore, the thickness of the resin layer 40 becomes uneven. The uneven thickness results in one cause of inclination of the core layer 3.

In addition, since the resin films 5, 5', 12 and the transparent stamper 13 are laminated while the laminate roll 34 is moved thereon as so mentioned hereinabove, the resin layer formed on these is often extruded out by the pressure force of the laminate roll 34, and, as a result, the thickness of the resin layer will become uneven, or that is, only one end of the layer will be thicker than the other area thereof. If so, or that is, if only one end of the resin layer is thicker than the other area thereof, the stacked core layers 3 will incline differently. In particular, when the number of the stacked layers is increased for the purpose of increasing the recording capacity of the optical memory device 4, the thickness of one side of the stacked structure will gradually increase and, as a result, the degree of inclination of the stacked cores greatly increases with the increase in the number of the stacked layers.

To solve the problems, in general, the pressure level (pressure force, roll pressure) of the laminate roll 34 as well as the system driving speed (running speed, roll speed) is controlled, and the material of the laminate roll 34 is modified so as to control the hardness of the laminate roll 34. These are for optimizing the lamination condition to thereby prevent the thickness of the resin layer (adhesive layer) from varying in the lamination process.

However, controlling the roll pressure and the roll speed is unsatisfactory for well preventing the thickness of the resin layer from varying in the lamination process. In particular, it is still difficult to fabricate the optical memory device 4 that satisfies the condition of formula (5) even though the lamination is optimized in the manner as above. Therefore, for fabricating the optical memory device 4 that satisfies the condition of formula (5), not only controlling the roll pressure and the roll speed but also optimizing the distance between the laminate roll 34 and the resin layer (adhesive layer) is a matter of importance.

In this embodiment, therefore, the lamination process is so controlled that the filmy member 30 (e.g., resin films 5, 5', 12, and transparent stamper 13) is laminated to the base member 32 while the distance between the laminate roll 34 and the surface of the base member 32 coated with the resin layer 40 (upper face of the stacked structure 232) is substantially all the time kept constant (to be a constant value).

Accordingly, the thickness of the resin layer 40 is prevented from varying during lamination. In the optical memory device 4 thus fabricated according to such controlled lamination, the inclination of the individual core layers can be reduced within a predetermined range (that is, the thickness of the core layers is kept constant). In addition, in the transparent stamper 13 fabricated according to such controlled lamination, the thickness of the constitutive layers is prevented from varying over a predetermined range.

Various methods may be employed for keeping constant the distance between the laminate roll 34 and the face of the base member 32 coated with the resin layer 40 (upper face of the stacked structure 232). For example, the filmy member-laminating apparatus (for fabricating optical memory devices) to be employed in the invention for laminating the filmy member 30 (e.g., resin films 5, 5', 12, and transparent stamper 13) with the base member 32 (e.g., stacked structure 232 with substrate 39, core layers 3, cladding layers 2) via the resin layer 40 between the two is so designed that it is provided with an alignment controller for controlling the height of the laminate roll 34 from the stage 33 so that the distance between the stage 33 and the laminate roll 34 is not lower than a predetermined level.

In this embodiment, the alignment controller may be so designed that (1) it is fitted to the support to support the laminate roll 34, and it moves in the direction of the height of the laminate roll 34 (roll height-moving mechanism); or (2) it is provided with a spacer (spacer part) to support the laminate roll 34 on the stage 33 so that the distance between the stage 33 and the laminate roll 34 is not lower than a predetermined level (that is, the spacer is to control the motion of the laminate roll in order that the laminate roll 34 does not move over a predetermined height), and the height of the laminate roll is controlled by means of the spacer.

Figure 14:
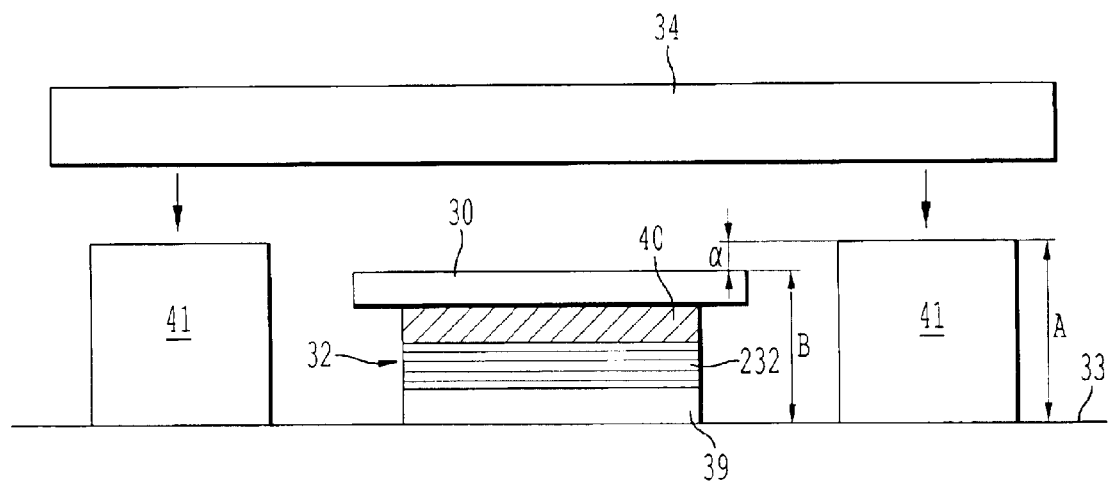
FIG. 14 is a schematic view showing the constitution of an apparatus for lamination with a filmy member in one embodiment of the invention.

In particular, the filmy member lamination apparatus (for fabricating optical memory devices) of such a type that the height of the laminate roll is controlled by means of the spacer provided therein comprises, for example, the stage (substrate member holder, stacked structure holder) 33 for holding the substrate member 32 (e.g., stacked structure 232 that comprises substrate 39, core layer 3 and cladding layer 2) to which the filmy member 30 is laminated; the laminate roll 34 for laminating the filmy member (laminating member) 30 onto the resin layer (adhesive layer) 40 formed on the surface of the substrate member 32; and the spacer 41 that controls the motion of the laminate roll 34 so that the distance between the stage 33 and the laminate 34 is not lower than a predetermined distance (predetermined level) as shown in FIG. 14. In this, the spacer 41 is for keeping the distance between the stage 33 and the laminate roll 34 not lower than a predetermined level, and it is referred to as a distance keeper.

Naturally, the filmy member laminating apparatus (for fabricating optical memory devices) is so designed that it has a moving mechanism for moving the laminate roll 34 along the back of the filmy member 30 while the filmy member 30 is laminated onto the base member. The mode of lamination may be any and every one mentioned hereinabove, and the necessary mechanisms shall be selected in accordance with the mode of lamination to be employed.

The lamination apparatus of this embodiment is so constructed that the height, A, of the spacer (since the spacer 41 is on the stage 33 on which the base member 32 to be laminated is put, the height A is the height of the spacer from the surface (standard face) of the stage 33) is larger than (or equal to) the thickness, B, of the base member 32 laminated with the filmy member 30 (e.g., resin films 5, 5', 12, transparent stamper 13) as in FIG. 14. Concretely, the thickness B is an ideal height which is calculated from the constitution after the lamination process is finished (in other words, after the filmy member 30 is laminated onto the base member 32). It corresponds to the height (the highest height) to the surface of the filmy member 30 laminated onto the base member 32 and spaced most from the standard face (the surface of the stage 33), or that is, this B corresponds to the highest height of the base member 32 laminated with the filmy member 30. In the thus-controlled lamination apparatus, the distance between the laminate roll 34, of which the motion is controlled by the spacer 41, and the stage 33 is not larger than a predetermined level.

In this embodiment, the spacer 41 is disposed at the positions corresponding to the opposite ends of the laminate roll 34 (in the illustrated case, it is disposed in two positions in the right-hand and left-hand ends) so as to be able to control the two opposite ends of the laminate roll 34, as in FIG. 14. Each spacer 41 extends to cover the overall length of the base member 32 that is mounted on the stage 33 and is laminated with the filmy member 30.

One example of this embodiment is now described. In a case where a stacked structure 232 with cladding layers and core layers 3 stacked on a substrate 39 such as a glass substrate (this 232 is abase member 32) is coated with an adhesive (resin) layer 40 and is laminated with a resin film (filmy member 30), the overall thickness of the total of the thickness of the substrate 39, the thickness of the stacked structure (stacked film) 232, the thickness of the adhesive layer 40 and the thickness of the resin film (filmy member 30) [stacked structure thickness (including substrate thickness)+adhesive layer thickness+resin film thickness] is equal to the thickness B of the base member 32 laminated with the filmy member 30.

Another example of this embodiment is now described. In case where a transparent stamper (filmy member 30) is laminated on a cladding layer 3 or a core layer 3 (resin layer) while cladding layers 2 and core layers 3 are alternately stacked on a substrate 30 such as a glass substrate, the overall thickness of the total of the thickness of the substrate 39, the thickness of the stacked structure 232 (this is the thickness of the stacked structure with the layers having been stacked up at the time when the transparent stamper is just laminated on it) and the thickness of the transparent stamper (filmy member 30) [stacked structure thickness (including substrate thickness)+transparent stamper thickness] is equal to the thickness B of the base member 32 laminated with the filmy member 30.

Concretely, the filmy member lamination apparatus (for fabricating optical memory devices) is preferably so designed that the height (thickness), A, of the spacer 41 therein is equal to the thickness, B, of the base member 32 laminated with the filmy member 30 via the resin layer 40 (this B corresponds to the height from the surface of the stage 33 to the top face of the filmy member 30); or that height A is equal to the sum of the thickness B of the base member 32 laminated with the filmy member 30 via the resin layer 40 and a predetermined value $\alpha(\alpha \geq 0)$ added thereto, as so represented by the following formula:

$$A = B + \alpha (\alpha \geq 0).$$

This is because, if the height A of the spacer 41 is smaller than the height B of the base member 32 laminated with the filmy member 30 (A<B), the laminate roll 34 will press out the resin layer (core layer, cladding layer, adhesive layer) 40 while the two members are laminated under pressure by the laminate roll 34, and, if so, the thickness of the resin layer 40 will thereby vary and the resin layer 40 will be after all uneven.

The optimum predetermined value $\alpha$ varies, depending on the thickness of the resin layer (core layer, cladding layer, adhesive layer) 40, the viscosity of the resin for the layer 40 (e.g., the resin for core layer, cladding layer, adhesive layer), the hardness of the laminate roll 34, etc. Preferably, however, the predetermined value $\alpha$ is 0 or more, more preferably at least 10 $\mu$m. On the other hand, the predetermined value $\alpha$ is also preferably at most 2 mm, more preferably at most 0.5 mm. This means that the difference, $\alpha$, between the height A of the spacer and the height B of the base member 32 laminated with the filmy member 30 via the resin layer 40 (or that is, the height B from the surface of the stage 33 to the top face of the laminated filmy member 30) preferably falls between 0 mm and 2 mm. Regarding the material of the laminate roll 34, the roll 34 may be made of metal, ceramics, resin, rubber or the like. Above all, the roll 34 is a rubber roll.

Especially when the optical memory device 4 is fabricated, the thickness of the base member 32 (stacked structure 232) to be laminated with the filmy member 30 varies in a broad range. For example, in the filmy member lamination apparatus (transparent stamper lamination apparatus) for laminating a transparent stamper 13 (a type of the filmy substrate 30) to a stacked structure of cladding layers and core layers, the thickness of the stacked structure 232 varies every time when the cladding layer 2 and the core layer are additionally stacked.

Accordingly, it is desirable that the filmy member lamination apparatus (for fabricating optical memory devices) is provided with a spacer height controller for controlling the height A of the spacer 41, with which the height A of the spacer 41 in the apparatus can be therefore controlled and changed in accordance with the thickness of the stacked structure 232 to be processed therein. In particular, the spacer height controller is preferably so designed it can monitor the thickness of the stacked structure 232 and can automatically control and change the height of the spacer 41 on the basis of the thus-monitored data of the thickness of the stacked structure 232.

In this embodiment specifically described herein, the height of the laminate roll 34 is controlled by the use of the spacer 41, and the same shall apply to the other case where a roll height controller is provided for the support of the laminate roll 34 to thereby control the height of the laminate roll 34 by means of it. For this case, the filmy member lamination apparatus (for fabricating optical memory devices) shall be so designed that the height of the laminate roll 34 [that is, the height from the surface (standard face) of the stage 33 to the lowermost face of the roll] is equal to the thickness, B, of the base member 32 laminated with the filmy member 30 via the resin layer 40, or is equal to the sum of the thickness B of the base member 32 laminated with the filmy member 30 via the resin layer 40 and a predetermined value $\alpha$ ($\alpha \geq 0$) added thereto.

Accordingly, the optical memory device and the method for fabricating it according to this embodiment of the invention have the advantages that the entire information region of the core layer 3 of the device can uniformly receive the reference beam applied to the device and the information recorded in the device can be correctly and accurately reconstructed.

In particular, another advantage of this embodiment is that the information recorded in the device can be correctly and accurately reconstructed by simple control in reading operation, not requiring any complicated reading device. Still another advantage thereof is that the device is suitable to reading automation.

On the other hand, the advantage of the method and the apparatus for lamination with a filmy member according the invention is that, when the number of the layers to be stacked up is increased so as to increase the recording capacity of the optical memory device that comprises the stacked structure, the stacked layers are prevented from being inclined as much as possible. In this connection, it is a matter of importance that the optical memory devices fabricated in the manner as herein do not require reference beam alignment for every core layer 3 therein, for simplifying the reading device (drive) for the optical memory device.

In general, the optical memory device 4 having a stacked structure is vertically cut with a dicing saw or the like, and the thus vertically-cut face of the device 4 is the end 7. Accordingly, the thus-cut device is free from the problem of misalignment relative to the direction (Y-direction) of the reference beam (incident ray) to be applied to the device.

Figure 15:
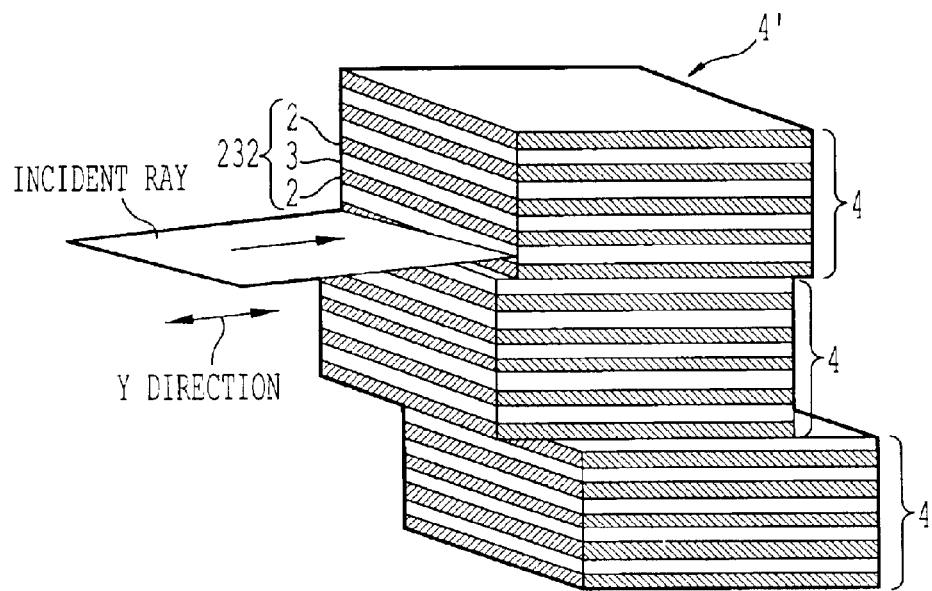
FIG. 15 is a schematic view for explaining a method of stacking multiple units in fabricating an optical memory device of one embodiment of the invention.
Figure 16:
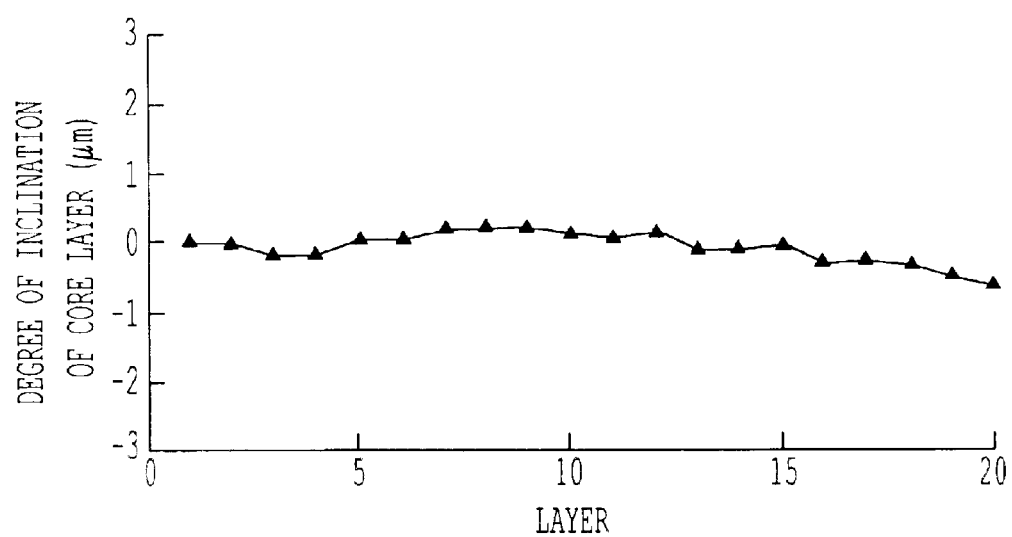
FIG. 16 is a graph showing the data of the degree of inclination of individual core layers that constitute the optical memory device of one example of the invention.
Figure 17:
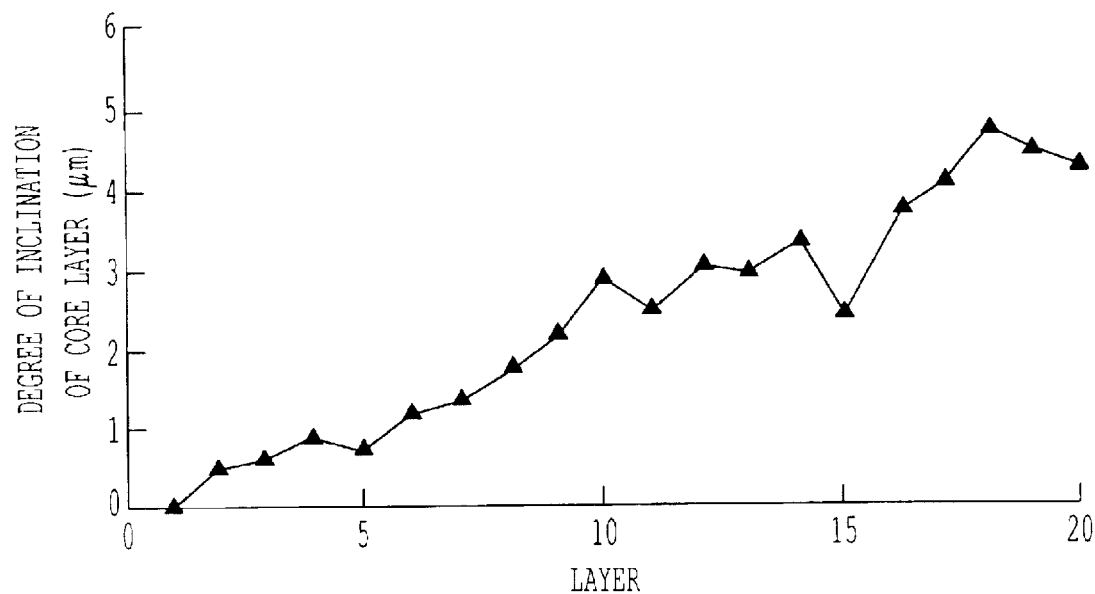
FIG. 17 is a graph showing the data of the degree of inclination of individual core layers that constitute the optical memory device of a comparative example for the invention.
Figure 18:
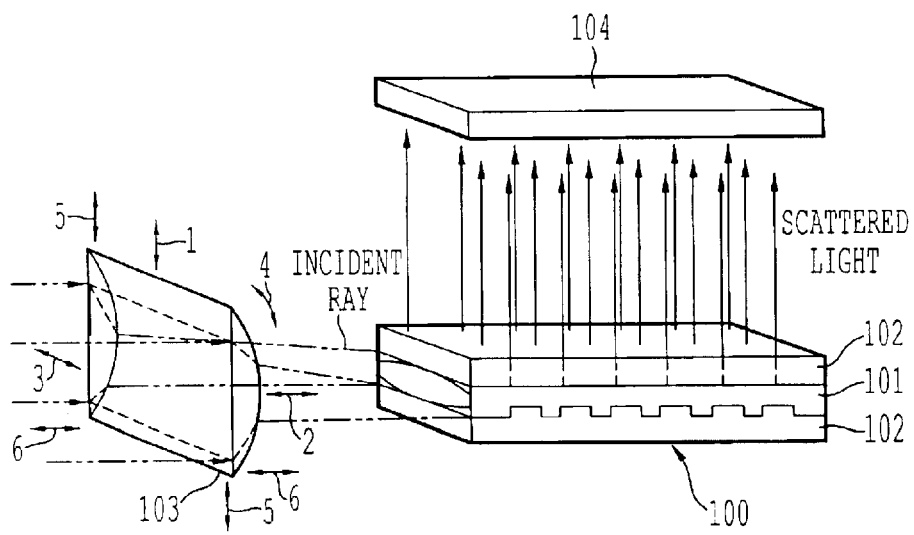
FIG. 18 is a schematic perspective view for explaining the principle of the motion of a conventional optical memory device.
Figure 19:
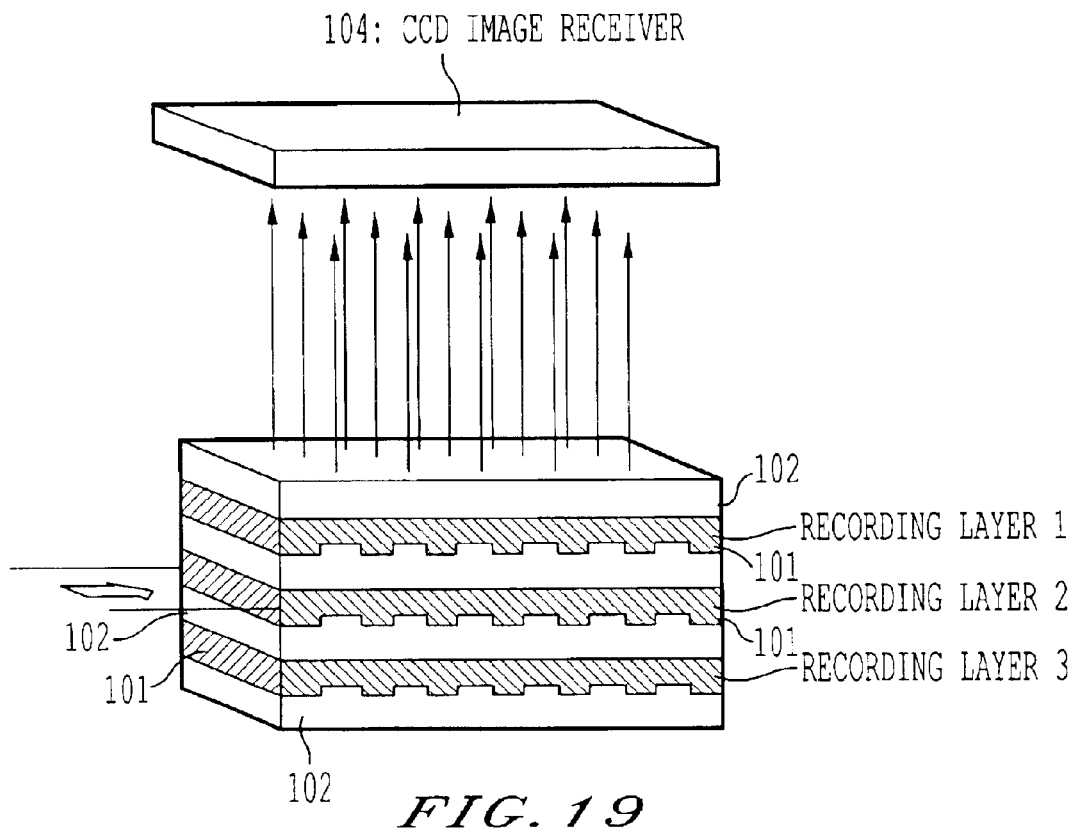
FIG. 19 is a schematic perspective view for explaining the principle of the motion of another conventional optical memory device.
Figure 20:
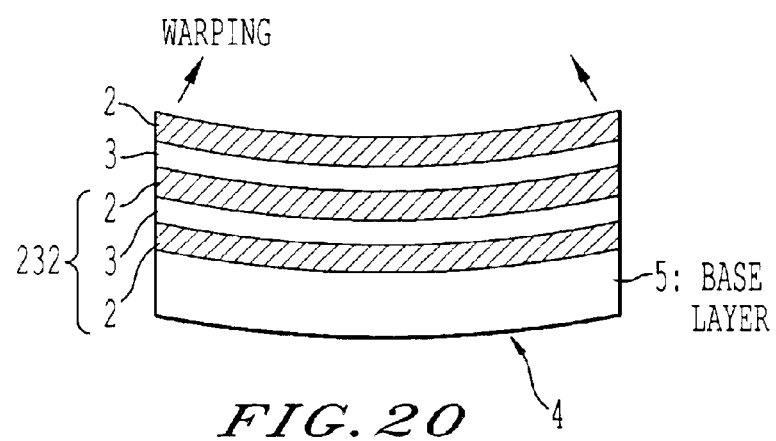
FIG. 20 is a schematic view for explaining the problem in fabricating an optical memory device of resin.

However, when multiple optical memory units 4 each having been cut in a predetermined size are stacked up and integrated for further increasing the recording capacity into a high-density unit, and multiple such units are further stacked up into a stacked optical memory device 4' (recording medium), each optical memory device 4 in the stacked structure may have a 90-degree end. In such a case, alignment error, if any, in the stacked units 4 will result in reference beam misalignment (Y-direction misalignment) for the optimum direction of the reference beam to be applied to the stacked layers, as shown in FIG. 15.

In this case, therefore, it is desirable that the layers are stacked up in such a controlled manner that the degree of misalignment relative to the direction of the reference beam directed to each unit 4 may fall within a predetermined level.

For example, it is desirable that the misalignment of other units 4 relative to one unit 4 falls within a range of +/−100 $\mu$m. This means that the misalignment between the most shifted units 4 is preferably at most 200 $\mu$m. The predetermined level may be defined as the degree of misalignment for the necessary quantity of incident ray for information reconstruction in each core layer 3 of the waveguide block 232 to form every unit 4, not requiring the position alignment (focal depth alignment) for the incident ray to every unit 4.

Accordingly, alignment for the reference beam (incident ray) direction for every unit 4 maybe omitted in this embodiment of the invention, and, as a result, the information recorded in each unit 4 can be read out within a short period of time. In that manner, since the reference beam (incident ray) alignment for every unit 4 is not needed in reconstructing the information recorded in the optical memory device 4, the constitution of the reading device (drive) for the optical memory device of the invention may be simplified.

In the embodiment described herein, the specific technique of the invention is applied to the process of replicating the concave and convex pattern from the transparent stamper 13 onto the core layer 3 so that the core layer 3 is not inclined in the replication process. However, the invention is not limited to this embodiment. Apart from it, the invention broadly applies to any and every process of laminating a film to a substrate in fabricating the optical memory device 4. For example, even when a concave and convex pattern is replicated from an ordinary metal stamper onto a core layer, a base layer such as a resin film or the like is to be laminated onto the substrate. In this case, therefore, the core layer may be inclined. To solve the problem, if the invention is applied to the case, then the core layer is prevented from being inclined.

Third Embodiment of the Invention

Next described is the third embodiment of the invention. In this section, the matters that are the same as those in the first and second embodiments mentioned hereinabove are omitted, for which, therefore, the corresponding description in the sections of the first and second embodiments is referred to.

The optical memory element [stacked (flat) optical memory element, stacked waveguide hologram device, MWH device] of this embodiment basically comprises a resinous core layer 3 and a resinous cladding layer 2 laminated on both surfaces of the resinous core layer 3 and comprises one or more waveguide blocks (in the illustrated embodiment, two waveguide blocks) 232 each having a concave and convex pattern 6 for information for image reconstruction formed in at least one interface between the resinous core layer 3 and the resinous cladding layer 2, and in which the stacked structure of the waveguide blocks is sandwiched between thin-film base layers 5, 5' to form a sandwich structure, as shown in FIG. 3.

The sandwich structure of the optical memory device 4 is so designed that the stacked structure (waveguide block 232) of the resinous core layers 3 and the resinous cladding layers 2 alternately stacked to fabricate the optical memory device 4 is sandwiched between thin-film base layers 5, 5' formed on both surfaces (upper and lower surfaces) of the stacked structure. The sandwich structure of the optical memory device 4 of the type sandwiched between the thin-film base layers 5, 5' has the advantage that the degree of warping and bending of the core layer 3 is kept lower than a predetermined level.

Concretely, the degree of bending of the core layer 3 at the end 7 of the information area in which the concave and convex pattern 6 for information is formed shall satisfy the condition represented by the following formula (1):

$$\Delta t \leq d - t \qquad (1)$$

in which $\Delta t$ indicates the degree of bending of the core layer 3 at the end 7 of the information area, d indicates the vertical width of the reference beam (reference beam width), and t indicates the thickness of the core layer 3 in the information area, as shown in FIG. 1.

More preferably, it shall satisfy the condition represented by the following formula (2):

$$\Delta t \leq (d-t) \times 0.9 \qquad (2)$$

even more preferably, the condition represented by the following formula (3):

$$\Delta t \leq (d-t) \times 0.8 \qquad (3)$$

The optical memory device 4 shall satisfy the condition of formula (1) as above at least while it is clamped on a reconstruction device (drive), but preferably, satisfies the condition of formula (1) while it is statically mounted on the horizontal surface of the drive with no clamping force or the like applied thereto.

The process of fabricating the optical memory device by the use of a transparent stamper preferably applies also to this embodiment. Regarding the constitution and the fabrication process of the transparent stamper, and the fabrication process of the optical memory device 4 by the use of the transparent stamper, referred to are those described hereinabove in the sections of the first and second embodiments of the invention. Thus fabricated, the optical memory device 4 of this embodiment is so designed that the stacked structure of one or more waveguide blocks 232 is sandwiched between base layers of resin film 5, 5'. Naturally, therefore, every optical memory device 4 having been prepared by cutting its block is so constructed that the stacked structure of one or more waveguide blocks 232 of the devices 4 is sandwiched, on both surfaces (upper and lower surfaces) thereof, between base layers of resin film 5, 5'.

Figure 21:
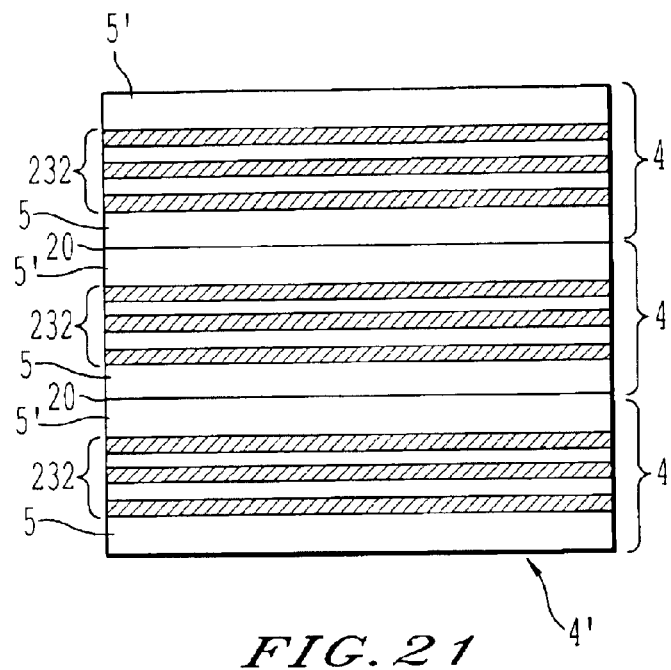
FIG. 21 is a schematic view showing the overall structure of an optical memory device of one embodiment of the invention.

In this embodiment, the thus-cut, every optical memory device 4 are integrated into one unit (one block), as shown in FIG. 21, and two or more these units (blocks) of optical memory devices 4 are stacked up to give an optical memory device 4' that is used as a recording medium (optical memory) such as optical memory cards, etc.

In FIG. 21, three units (optical memory devices 4) are stacked up into an optical memory device 4'. Further in FIG. 21, every optical memory device 4 is designed to have one waveguide block 232. This is for simplifying the description of the structure. In fact, however, each unit (optical memory device 4) is a stacked structure that comprises one or more waveguide blocks 232.

In one example of this embodiment, an optical memory device 4 having a stacked structure of 25 waveguide blocks (layers) 232 is fabricated, this is cut into a unit having a predetermined size. Thus cut, the unit is a 25-layered stacked unit. Four of these units are stacked up to finish an optical memory device 4' (100-layered medium) that comprises 100 waveguide blocks (layers) 232.

In this case, the number of the layers to be stacked up on a base substrate may be up to 25. Its advantages are that the stacked structure warps little while it is fabricated, and a thin substrate (e.g., glass substrate) having a thickness of from 1 to 2 mm or so may be used.

Four such units (optical memory devices 4), each of which is a stacked structure of 25 waveguide layers 232, are prepared, and these are stacked up to give a recording medium (optical memory device 4') having 100 waveguide layers 232. The advantage of this process is that its productivity is high as compared with the other case where 100 waveguide layers 232 are directly stacked up to give the same recording medium (optical memory device 4').

In this embodiment, the thickness of the stacked structure of the waveguide layers 232 in each unit 4 (that is, the thickness of the stacked structure sandwiched between resin films 5, 5') is preferably at most 2 mm, more preferably at most 1.5 mm. This is because of the problem with the process of fabricating the device. Specifically, the device will warp more with the increase in the number of the stacked layers, but so far as the thickness of the stacked structure is at most 2 mm, but more preferably at most 1.5 mm, the degree of warping of the device being fabricated may be within an acceptable range. Specifically controlling the degree of warping of the stacked structure for the device to fall within such an acceptable range enables correct and accurate reading of information recorded in every unit 4 when the optical memory device 4' is set on a drive and its information is reconstructed.

The problem in stacking 2 or more units 4 to construct the optical memory device 4' is discussed. If the number of the units to be stacked up is too large, the overall thickness of the thus-constructed optical memory unit 4' shall increase since every unit 4 includes the base layers of resin film 5, 5'. In this case, if the stacked structures that constitute every unit 4 are too thin (or that is, if the number of the waveguide layers 232 to form each stacked structure is too small), the thickness of the optical memory device 4' will uselessly increase though the recording capacity of each unit 4 does not increase (and, after all, though the overall recording capacity of the optical memory device 4' finished by stacking up all the units 4 is not large).

Accordingly, it is desirable that the thickness of the stacked structure of the waveguide layers 232 (that is, the thickness of the stacked structure sandwiched between the base layers of resin film 5, 5') in each unit 4 is at least 0.1 mm. Regarding the thickness of the core layer 3 and the cladding layer 2, the layers are not specifically defined in point of their thickness so far as they function as waveguides. For example, when visible light is used for the device, the thickness of the core layer 3 may be approximately from 0.5 to 3.0 μm or so. In this case, the thickness of the cladding layer 2 is not specifically defined. For reducing the overall thickness of the device, the thickness of the cladding layer 2 is preferably at most 100 μm. Though not specifically defined, the lowermost limit of the thickness of the cladding layer may be at least 0.1 μm.

The base layers are preferably thinner. Concretely, the thickness of each base layer is preferably at most 500 μm, more preferably at most 250 μm, even more preferably at most 100 μm. Base layers having such a small thickness are referred to as thin-film base layers.

The thin-film base layers are favorable to the invention because of the reasons mentioned below. When the signal (information) recorded in the optical memory device 4 is read out, it is desirable that a detector such as CCD is as near as possible to the core layer 3 from which the information is reconstructed. Concretely, for example, the distance between the two must be 5 mm or less. If the distance is too long, the detectable signal will be weak and the S/N ratio will be small.

In this embodiment, each unit (optical memory device 4) is so designed that it is sandwiched between base layers. Therefore, when the information (signal) recorded in the optical memory device 4' is read out is read out through its upper face, the signal from the lowermost unit in the device 4' shall be spaced from the detector such as CCD more than the thickness (distance) to be computed according to the formula mentioned below, even though only the thickness of the base layers in each unit is taken into consideration.

(number of units−1)×base layer thickness×2+base layer thickness

For example, when the thickness of each base layer is 1 mm and when 6 units are stacked up, then the detector such as CCD shall be spaced from the core layer (from which the information is to be reconstructed) of the lowermost unit by at least 1 cm or more. In that condition, the S/N ratio of the optical memory device system is not on a practicable level. Therefore, so as not to reduce the S/N ratio and so as to obtain the S/N ratio on a practicable level, the thickness of each base layer is preferably at most 500 μm, more preferably at most 250 μm, even more preferably at most 100 μm, as so mentioned hereinabove.

On the other hand, the thickness of each base layer is preferably at least 10 μm.

Accordingly, the thickness of each base layer preferably falls between 10 μm and 500 μm (e.g., between 10 μm and 250 μm, or between 10 μm and 100 μm). In particular, when the base layers are of resin films 5, 5', their thickness may be controlled to fall within the range as above, for example, between 10 μm and 500 μm (but preferably up to 100 μm), for example, by thermally stretching a resin film of polycarbonate or the like as above or by preparing such a resin film in a mode of solvent casting.

In general, the strength in the bending direction (bending strength) of the base layers for use herein is not so important, but the strength thereof in the compression or tensile direction (tensile strength, compression strength) is a matter of importance. Accordingly, the base layers for use herein preferably have an elastic coefficient (Young's modulus) of at least $9.8 \times 10^7$ Pa, more preferably at least $4.9 \times 10^8$ Pa. Concrete examples of the material for these are polycarbonate films and ARTON films.

Also preferably, the refractive index of each base layer is as near as possible to the refractive index of the core layer and the cladding layer. This is because, if there is a great difference in the refractive index between the base layer and the core layer 3 (or cladding layer 2) in the stacked structure, the output light (signal light) will reflect on the interface between the base layer and the stacked structure whereby the quantity of the signal light (output light) is lowered and the S/N ratio is also lowered.

For these reasons, it is desirable that the difference between the refractive index of the core layers (or cladding layers) to constitute the stacked structure and the refractive index of the material of the base layer is at most 0.2 each. Precisely, the refractive index difference between the core layer and the base layer is preferably at most 0.2; and that between the cladding layer and the base layer is also preferably at most 0.2.

In this embodiment, at least two units 4 are stacked to construct the recording medium (optical memory device 4'). Concretely, the overall surface of one unit 4 is uniformly coated with an adhesive, and another unit 4 is stuck thereto. This is repeated to construct the stacked structure of 2 or more units 4.

In this case, an adhesive layer 20 is formed between the neighboring units 4, as shown in FIG. 21. In other words, the neighboring units are adhered to each other via the adhesive layer 20.

In this case, if the difference between the refractive index of the adhesive layer 20 formed between the neighboring units 4, or that is, the refractive index of the adhesive (after cured) applied to each unit 4, and the refractive index of the core layer (or the cladding layer) is too large, the signal light (output light, going-out light) will reflect on the interface between the adhesive layer 20 and the core layer 3 or the cladding layer 2, whereby the quantity of the signal light (output light) is lowered and the S/N ratio is also lowered.

To solve the problems, it is desirable that the difference between the refractive index of the adhesive used for bonding the units 4 (refractive index thereof after cured) and that of the core layer and the cladding layer is at most 0.2 each.

Preferably, the UV-curable resin used for the core layer and the cladding layer is directly used also for the adhesive. In this case, the refractive index of the adhesive is extremely near to (or is equal to) that of the core layer and the cladding layer, and therefore the signal light is prevented from reflecting on the interface between the adhesive layer 20 and the core layer 3 or the cladding layer 2. Accordingly, in this case, the quantity of the signal light reduces little.

In particular, the adhesive layer 20 to be formed between the neighboring units 4 is preferably almost uniform. In more particular, the adhesive layer is so formed that its thickness is almost uniform in the overall area that corresponds to the information area in which the concave and convex pattern 6 for information is formed in the respective waveguide layers 232 to constitute each unit. So fabricated, the quality of the optical memory device 4' is higher than that of other devices in which the adhesive layer is formed only in the region (non-information-recording area, non-information area) except the region corresponding to the information area (information-recording area, data area, hologram area), as will be so mentioned hereinunder.

In fact, however, it is often extremely difficult to uniformly apply an adhesive to the surface of one unit 4 and to laminate other units 4 to that adhesive-coated unit as in the above, with no bubble being between them. This is because every unit is thick in some degree, and often loses its flexibility necessary for lamination.

For these reasons, some bubbles often enter the interface between the bonded units 4, and they cause light scattering. As a result, the stray light around the adhesive layer 20 forms noises in reconstructed images, therefore having some negative influences on the data reading (image reconstruction).

Figure 22:
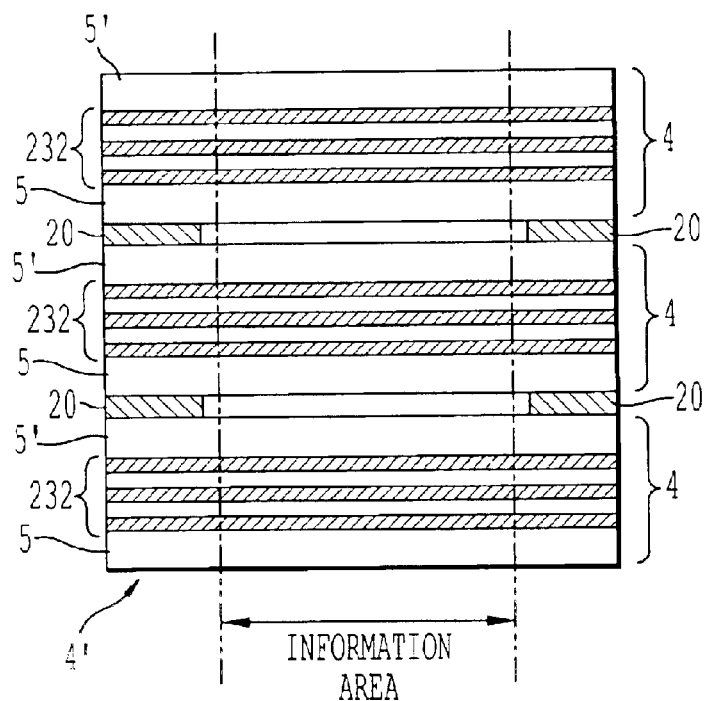
FIG. 22 is a schematic view for explaining a process of stacking multiple units to construct an optical memory device of one embodiment of the invention.

Taking the matters into consideration, it is desirable that an adhesive is applied to the region (site) except the region that corresponds to the information area of the waveguides 232 to construct each unit 4, thereby bonding the units to each other as in FIG. 22. Specifically, it is desirable that the adhesive layer 20 is formed in the region except the region that corresponds to the information region of each unit 4.

For this, various patterns maybe taken into consideration for the site in which the adhesive layer 20 is to be formed (that is, the site to be coated with the adhesive).

Figure 23:
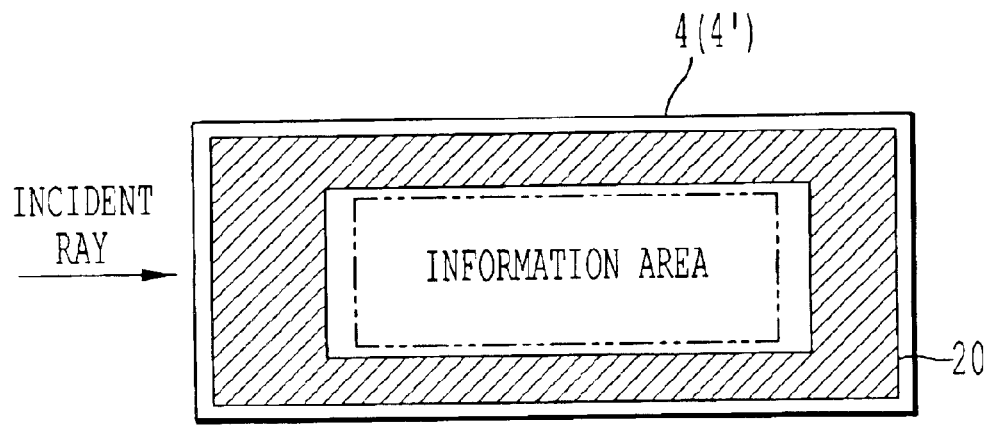
FIG. 23 is a schematic view for explaining one example of the position of the adhesive layer for adhering multiple units to construct an optical memory device of one embodiment of the invention.
Figure 24:
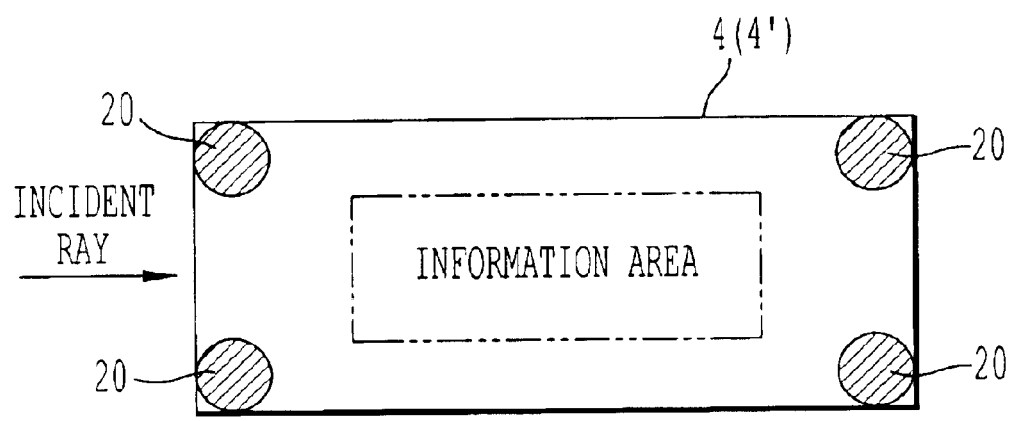
FIG. 24 is a schematic view for explaining another example of the position of the adhesive layer for adhering multiple units to construct an optical memory device of one embodiment of the invention.

For example, the adhesive layer 20 may be formed in the overall region around the region that corresponds to the information area of the waveguides 232 to construct each unit 4, as shown in FIG. 23; or the adhesive layer may be spotwise formed at the four edges of the surface of each unit 4 in the region around the region that corresponds to the information area of the waveguides 232 to construct each unit, as in FIG. 24. However, the site in which the adhesive layer 20 is to be formed is not limited to the patterns illustrated as above.

In this embodiment, the signal light (reading light) does not pass through the adhesive layer 20 formed between the neighboring units 4. Therefore, the adhesive is not required to have the optical properties mentioned hereinabove. For example, it is unnecessary to specifically define the refractive index of the adhesive, and any light-scattering substance may be in the adhesive with no problem. Accordingly, for example, epoxy adhesive and any others are employable. As in the illustrated cases, forming the adhesive layer 20 only in the region except the region that corresponds to the information area of the waveguides 232 to construct each unit 4 is simple and is therefore preferred to the other case where the adhesive layer 20 having a uniform thickness is formed within the information area, and in addition, it facilitates the fabrication of the optical memory device 4'.

In the illustrated cases, no adhesive is applied to the region that corresponds to the information area of the waveguides 232 to construct each unit 4, and therefore the adhesive layer 20 is not formed in that region but air exists therein. Accordingly, the quantity of signal light (reading light) from each unit 4 may reduce owing to the light reflection in the air layer existing between the units 4. This will not be so much problematic when the number of the stacked units is small, but its problem will become serious when the number of the stacked units becomes larger.

For example, to simplify the calculation, the same number of 1.52 is used for the refractive index of the core layer, the cladding layer and the base layer, in the following calculation. In this case, the output signal light reduces to 0.975 times after the light has once reflected on one air layer. When 11 units 4 are stacked up, the signal light to be outputted from the lowermost unit 4 will be about 0.64 times that from the uppermost unit 4. This means that the signal light output from the stacked units 4 differs when such an air layer exist between the neighboring units, and the output difference between the units 4 is unfavorable to the memory device.

For the reasons as above, the uppermost limit of the number of the units to be stacked up will be up to 10 for practical use. In other words, the number of the units to be stacked up is preferably at most 10.

In case where the concave and convex pattern 6 for information of the optical memory device 4 (waveguide 232) is so designed that the it reconstruct the intended image at a predetermined magnification (for magnified image reconstruction), or that is, in case where the optical memory device 4 is designed for magnified image reconstruction, it is desirable that the adhesive layer 20 is formed in the region in which the magnified reconstructed image from the concave and convex pattern 6 for information of the optical memory device 4 (waveguide 232) does not appear (for example, in the region around the magnified image reconstruction area).

This is because of the following reasons: When the optical memory device 4 is for magnified image reconstruction, its region in which the image is reconstructed from the intrinsic scattered light from the concave and convex pattern 6 for information is broad. Therefore, the adhesive is applied to the region in which the magnified reconstructed image does not appear, and, if so, the scattered light from the resulting adhesive layer 20 does not form a noise for the magnified reconstructed image and does not have any negative influence on the image. The size of the reconstructed image from the information in the concave and convex pattern 6 depends on the shape of the concave and convex pattern 6 for the information but not on the image-reconstructing apparatus used.

For example, in case where the concave and convex pattern 6 for information is a 4-time magnified image reconstruction of such that a 4-time magnified image is reconstructed from the information of that pattern 6, the region in which the magnified reconstructed image appears is 4 times the area of the region of the concave and convex pattern 6. In this case, therefore, an adhesive is applied in the periphery around that region to form the adhesive layer 20 around it.

In case where multiple units 4 are so stacked that one face (uppermost face or lowermost face) of one unit 4 is parallel to one face (lowermost face or uppermost face) of the other opposite unit 4, then the core layer 3 to be in each unit 4 does not incline. In that case, however, when an adhesive layer 20 is formed between the neighboring units 4 so as to bond the units 4 as so mentioned hereinabove, but if the thickness of the adhesive layer 20 is not even, the units are stacked while they are inclined, and, as a result, the cores 3 to form the waveguide layers 232 that constitute each unit 4 will be thereby inclined.

If the core layers 3 are inclined in the manner as above, the entire information area of the core layer 3 could not uniformly receive the reference beam all at a time, and only a part of the recorded information could be reconstructed. In such a case, the inclination fluctuation of each unit 4 must fall within a predetermined region (within an acceptable region) in order that the recorded information can be read with no necessity of controlling the vertical inclination θ of the incident ray in every unit 4

Concretely, the degree of inclination of the standard face of the unit 4 relative to the standard face of the optical memory device 4 in the width of the information area in which the concave and convex pattern 6 for information of the resinous core layer 3 (in the waveguide 232) is formed shall satisfy the condition represented by the following formula (see FIG. 25):

$$|x| \leq d-t$$

in which x indicates the degree of inclination of the standard face of the unit 4 relative to the standard face of the optical memory device 4' in the information area width, d indicates the vertical width of the reference beam, and t indicates the thickness of the core layer 3 in the information area.

In this, the standard face of the optical memory device 4' is meant to indicate the face that is used for defining the degree of inclination of the standard face of each unit 4 that constitutes the optical memory device 4' is defined. The standard face of each unit 4 is the face thereof that is used for defining the degree of inclination of the core layer 3 in formula (5) (see FIG. 8).

The "degree of inclination" of the standard face of each unit 4 is as follows: When each unit 4 has inclined, how much and to what degree the standard face inclines in the width of the information area (data-recording area, information-recording area, image-recording area), and how much and to what degree the standard face of each unit 4 is shifted from the standard face of the optical memory device 4'. The standard face of the optical memory device 4' may be any and every face defined in a three-dimensional coordinate system, and it is not always required that the standard face should be the actual face of the optical memory device 4'. However, the optical memory device 4' may actually have the standard face, or it may be the uppermost face (top face) or the lowermost face (back face) of the optical memory device 4'.

Figure 25:
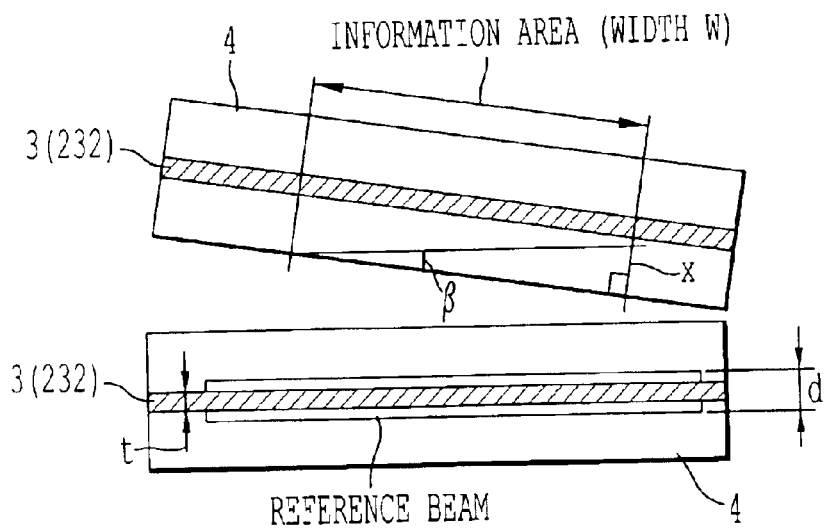
FIG. 25 is a schematic view for explaining the acceptable range of the degree of inclination of individual units that constitute an optical memory device of one embodiment of the invention.

Concretely, when the inclination angle of the unit 4 to the standard face (or the face parallel to the standard face—this is a horizontal face in this case) is represented by β and when the width of the information area is represented by w, as in FIG. 25, then the degree of inclination x is represented by the following formula:

$$x = w \times \tan \beta.$$

In this embodiment, when the upper unit 4 clockwise rotates relative to the face parallel to the surface (outermost face), the standard face, of the lower unit 4, or that is, when the unit 4 so inclines that its left-side edge is higher than its right-side edge, then the degree of inclination is plus.

In this case, the reference beam shall have a thickness in the direction vertical to the standard face. Therefore, the thickness of the reference beam in that vertical direction is herein defined as the vertical width of the reference beam. The vertical width, d, of the reference beam may be, for example, the half-value width of the reference beam intensity distribution.

In order that the adhesive layer 20 may have a uniform thickness and may satisfy the condition of the above-mentioned formula, other units 4 shall be laminated to one unit 4 in such a controlled condition that the distance between the laminate roll used and the adhesive layer-coated face of the unit 4 is kept constant (to a predetermined level).

Various methods may be employed for keeping constant the distance between the laminate roll and the adhesive layer. For example, the lamination apparatus (for fabricating optical memory devices) to be employed for laminating one unit 4 to the surface of another unit 4 via an adhesive layer is so designed that it is provided with an alignment controller for controlling the height of the laminate roll from the stage so that the distance between the stage and the laminate roll is not lower than a predetermined level.

In this embodiment, the alignment controller may be so designed that (1) it is fitted to the support to support the laminate roll, and it moves in the direction of the height of the laminate roll (roll height-moving mechanism); or (2) it is provided with a spacer (spacer part) to support the laminate roll on the stage so that the distance between the stage and the laminate roll is not lower than a predetermined level (that is, the spacer is to control the motion of the laminate roll in order that the laminate roll does not move over a predetermined height), and the height of the laminate roll is controlled by means of the spacer.

For realizing more practicable optical memory device 4', the width of the information area in the device is preferably broader in order that the quantity of data that can be read all at a time may increase. However, the increase in the width in the information area may increase the degree of inclination of each unit 4. Accordingly, it is desirable that the width of the information area falls between 2 mm and 100 mm at the end of the resinous core layer 3 and the degree of inclination of each unit 4 satisfies the condition of the above-mentioned formula.

So far as each unit 4 satisfies the condition of the above-mentioned formula, the inclination of each unit 4 falls within an acceptable range. Therefore, when the information recorded in each unit is reconstructed, the inclination control for every unit 4 is unnecessary. This means that the information reading operation is simplified and may be effected within a short period of time, and the structure of the reading device (drive) for the unit 4 is simplified.

In the embodiment illustrated herein, the adhesive layer 20 is formed between the neighboring units 4 to laminate them, to which, however, the invention is not limited. Apart from it, for example, the units 4 may be simply stacked up with no adhesive therebetween, and an adhesive such as curable resin is applied to both side faces of the thus stacked-up units 4 so that the side faces of the stacked structure are coated with the adhesive (resin layer 24) and the stacked-up units 4 are thereby bonded with the resin layer 24, as in FIG. 26. In this case, it is especially desirable that the adhesive layer 20 is formed on the side faces except the end of each unit through which incident ray enters the device. This is effective for preventing the reduction in the quantity of reference beam (incident ray) to be consumed in reconstructing the information recorded in the optical memory device 4', or that is, for preventing the reduction in the light intensity for image reconstruction in the device 4'.

Figure 26:
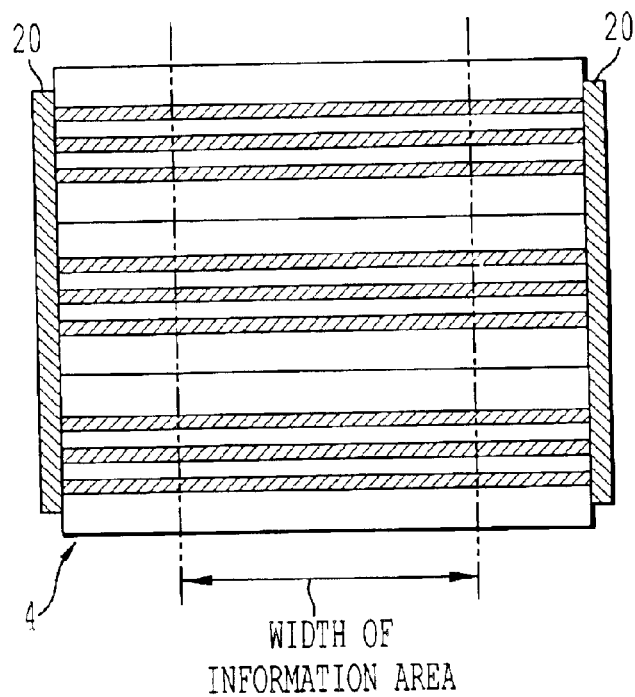
FIG. 26 is a schematic view for explaining a modification of a process of stacking individual units to construct an optical memory device of one embodiment of the invention.
Figure 27:
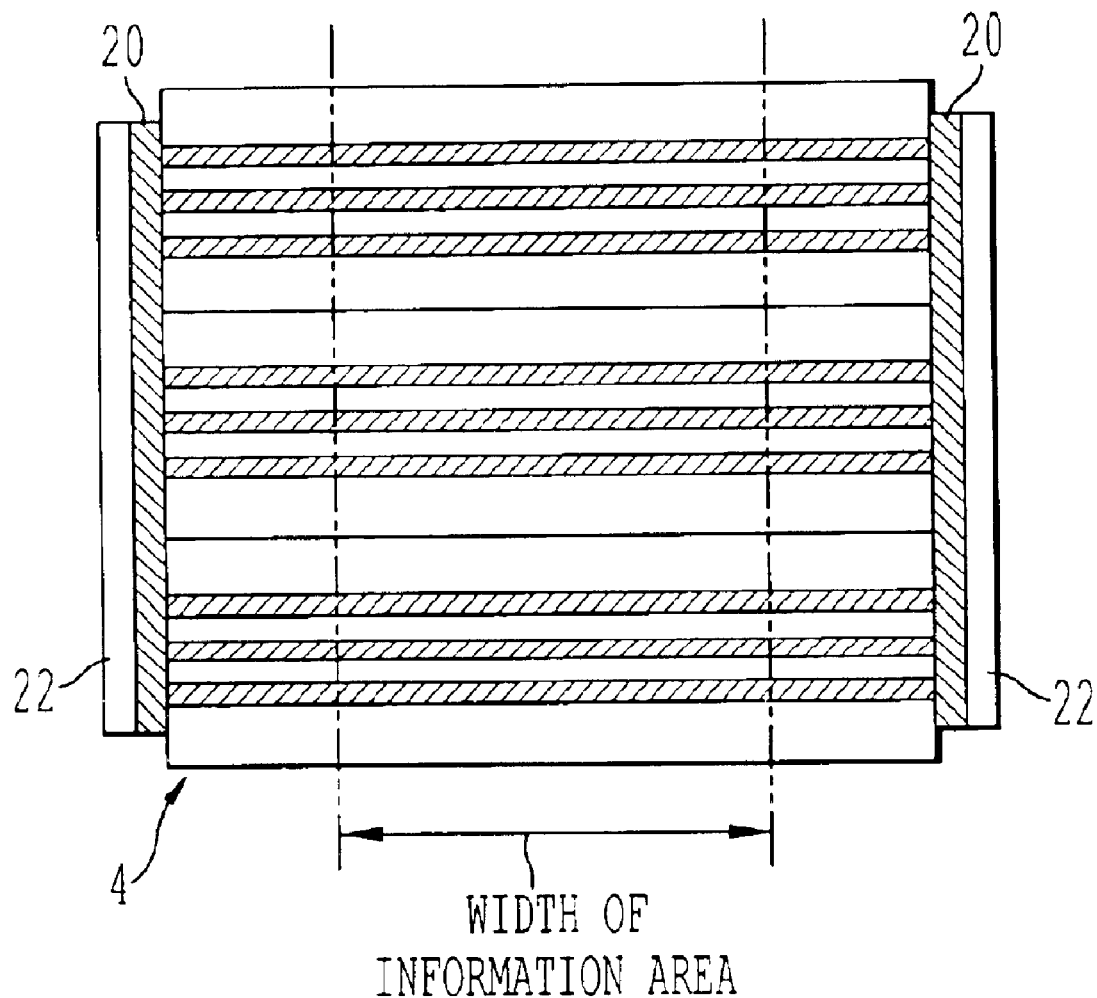
FIG. 27 is a schematic view for explaining another modification of a process of stacking (combining) individual units to construct an optical memory device of one embodiment of the invention.

The advantage of the embodiment of FIG. 26 in which no adhesive is applied to the interface between the stacked units 4 is that it is free from signal light scattering and signal light quantity reduction because of the absence of the adhesive layer 20 in the interface between the stacked units 4.

In addition, in this embodiment, the units 4 are merely stacked up and no adhesive layer 20 is formed in the interface between the units 4. Therefore, this embodiment is free from the problem of uneven thickness of the adhesive layer 20 and the problem of the inclination of the units 4. Accordingly, the other advantages of this embodiment are that incident ray inclination control for every unit 4 is unnecessary in reconstructing the information recorded in each unit 4, the information reading operation can be simplified and can be effected within a short period of time, and the reading device (drive) for the memory device is simplified.

Still another example of this embodiment is described. The units 4 are merely stacked up with no adhesive therebetween, then an adhesive such as curable resin is applied to the side faces of the thus-stacked up units 4 to cover each side face thereof (accordingly, this forms an adhesive layer on each side face of the stacked units 4), and a flat member of, for example, resin film (filmy member, tabular member, joint member) 22 is stuck to both side faces of the stacked structure to thereby laminate (bond) the units via the tabular member 22, as in FIG. 27. Also in this case, the units 4 are laminated.

Especially preferably, the tabular member 22 is formed in the side face except the end of each unit through which incident ray enters the device. This is effective for preventing the reduction in the quantity of reference beam (incident ray) to be consumed in reconstructing the information recorded in the optical memory device 4', or that is, for preventing the reduction in the light intensity for image reconstruction in the device 4'.

In particular, when multiple optical memory devices (units) 4 each having been cut in a predetermined size are stacked up and integrated for further increasing the recording capacity into a high-density unit, and multiple such units are further stacked up into a stacked optical memory device 4' (recording medium), and when each optical memory device 4 in the stacked structure has a 90-degree end as so mentioned hereinabove, it is desirable that the alignment error in the reference beam running direction in each unit 4 (alignment error in each unit 4) is controlled to fall within a predetermined range.

For example, it is desirable that the alignment error of other units 4 relative to one standard unit 4 is within a range of +/−100 μm. This means that the misalignment between the most shifted units 4 is preferably at most 200 μm.

The predetermined level may be defined as the degree of misalignment for the necessary quantity of incident ray for information reconstruction in each core layer 3 of the waveguide block 232 to form every unit 4, not requiring the position alignment (focal depth alignment) for the incident ray to every unit 4.

Accordingly, alignment for the reference beam (incident ray) direction for every unit 4 may be omitted in this embodiment of the invention, and, as a result, the information recorded in each unit 4 can be read out within a short period of time. In that manner, since the reference beam (incident ay) alignment for every unit 4 is not needed in reconstructing the information recorded in the optical memory device 4, the constitution of the reading device (drive) for the optical memory device of the invention may be simplified.

Accordingly, the technique relating to the optical memory device 4 of this embodiment enables fabrication of practicable multi-layered optical memory devices. In other words, when the number of the layers of the optical memory device of this embodiment is increased so as to increase the recording capacity of the device, the resulting device is prevented from warping and, in addition, the information recorded in the device can be correctly and accurately reconstructed. Another advantage of this embodiment is that the productivity of the device is high.

Still another advantage of this embodiment is that the device is prevented from warping through the number of the layers constituting the device increases, and therefore the substrate for the device may be thin. Accordingly, the costs for constructing the optical memory device fabrication apparatus (recording media fabrication apparatus) for fabricating the optical memory device 4 of this embodiment may be reduced.

EXAMPLES

Example 1

A cladding resin, UV-curable acrylic resin (having a refractive index, n of 1.49) was applied onto a nickel stamper having, on its surface, a concave and convex pattern that corresponds to an image information. Then, this was cured through exposure to UV rays at 800 mJ/cm² to form a cladding layer of 5 μm thick. To the cladding layer, applied was a core resin, UV-curable acrylic resin (having a refractive index, n of 1.49). Then, a 100-μm thick ARTON film member (by JSR, having a refractive index, n of 1.51) was gradually laminated on it, while pressed by a rubber roll. This was then cured through exposure to UV rays at 800 mJ/cm² to form a core layer of 1.8 μm thick. Through the process, the filmy member was laminated to the core/cladding layers. Next, the integrated structure of the cladding layer/core layer/ARTON film was peeled from the metal stamper. Thus fabricated, this is a transparent stamper.

Next, a cladding resin, UV-curable acrylic resin (having a refractive index, n of 1.49) was applied to a glass substrate of 1.6 mm thick, and then cured through exposure to UV rays at 800 mJ/cm² to form a cladding layer of 5 μm thick. Onto the cladding layer, a core resin, UV-curable acrylic resin (having a refractive index, n of 1.49) was applied, and then this was gradually laminated with a 100-μm thick ARTON filmy member (by JSR) while pressed by a rubber roll. Then, this was exposed to UV rays at 800 mJ/cm² whereby the filmy member was laminated to the core/cladding layers.

To the filmy member, applied was a core resin, UV-curable acrylic resin (having a refractive index, n of 1.49), and then cured through exposure to UV rays at 2400 mJ/cm² to form a core layer of 1.8 μm thick. A cladding resin, UV-curable acrylic resin (having a refractive index, n of 1.49) was further applied onto it, and then the transparent stamper prepared in the above was gradually laminated on it, while pressed by a rubber roll. The patterning face of the stamper faces the cladding resin. In this stage, the roll was so controlled that the distance between the roll and the glass substrate was kept constant to thereby make the thickness of the cladding layer uniform. With that, this was exposed to UV rays at 10 mJ/cm² to thereby partly imperfectly cure the cladding layer (partly imperfectly curing step). Next, only the transparent stamper was peeled off. Then, this was exposed to UV rays at 800 mJ/cm² to thereby cure the cladding layer. As a result, a cladding layer of 15 μm thick was formed. Onto the cladding layer, a core resin, UV-curable acrylic resin (having a refractive index, n of 1.49) was applied, and then cured through exposure to UV rays at 2400 mJ/cm² to form a core layer of 1.8 μm thick. The refractive index of the core layer and the cladding layer formed was 1.52 and 1.51, respectively. This step was repeated 25 times and a multi-layered structure comprising 25 core layers and 25 cladding layers was fabricated.

Next, a cladding resin, UV-curable acrylic resin (having a refractive index, n of 1.49) was applied to the structure and then cured through exposure to UV rays at 800 mJ/cm² to form a cladding layer of 15 μm thick. Onto the cladding layer, applied was a core resin, UV-curable acrylic resin (having a refractive index, n of 1.49), and then this was gradually laminated with a 100-μm thick ARTON film member (by JSR), while pressed by a rubber roll. With that, this was exposed to UV rays at 800 mJ/cm² to thereby laminate the filmy member onto the core/cladding layers. Finally, the 25-layered structure sandwiched between the ARTON films was peeled from the glass substrate to obtain an optical memory device.

Using a dicing saw, this was cut into a sample piece having a length of about 2 cm and a width of about 3 cm. A laser ray was introduced into the sample in a predetermined direction, and the sample was thus evaluated. In this test, no clamp for sample alignment was used. The laser ray used is from a semiconductor laser, having a wavelength of 680 nm and an intensity of about 5 mW. This was combined with a lens so that its beam was focused to have a length of 4 μm and a width of about 1 cm. Thus controlled, the beam was applied to one core layer of the sample. The width of the region in which the data are reconstructed in the layer was 6.5 mm.

As a result, the laser ray passed through the core layer, while scattering a little on the concave and convex pattern of the layer. The scattered light ran in the vertical direction and reconstructed an image. The image was directly projected on CCD and observed. It was confirmed that the projected image was just the predetermined image (test pattern). The core layer to receive the laser ray was changed, and all the 25 core layers were tested in the same manner as above. The results confirmed that the image reconstructed in each layer has no influence on the other images reconstructed in the other layers, and the image can be independently read out. Once controlled for one layer, the laser inclination did not require any additional control for all the other layers. With no additional laser control, the information was correctly read out from all the other layers.

The degree of bending of the core layer was measured, and it was 1.2 µm. The incident laser width is 4 µm, and the core thickness is 1.8 µm. Therefore, the acceptable level of core layer bending is 2.2 µm. The test data confirm that the degree of bending of the core layer is within the acceptable range. In addition, the degree of bending of the lowermost face of the sample was measured, and it was 1.2 µm.

Next, the degree of inclination of each layer was measured by controlling the inclination of the incident layer. As a result, the maximum degree of inclination of the core layer was 0.5 µm. For this, the face of the lowermost core layer (first core layer) is defined as the standard face. The incident laser width is 4 µm and the core thickness is 1.8 µm. Therefore, the acceptable maximum degree of inclination of the core layer is 2.2 µm. The test data confirm that the degree of inclination of each layer is within the acceptable range.

Next, the degree of inclination of the lowermost core layer face (this is the standard face for measurement) and that of the lowermost sample face were measured, and they were both 0.1 µm. Accordingly, it is understood that even when the lowermost face of the device is defined as the standard face, 25 layers constituting the device are all within the acceptable range. This means that the information reading from this device is possible with no inclination control.

Comparative Example 1

A cladding resin, UV-curable acrylic resin (having a refractive index, n of 1.49) was applied onto a nickel stamper having, on its surface, a concave and convex pattern that corresponds to an image information. Then, this was cured through exposure to UV rays at 800 mJ/cm² to form a cladding layer of 5 µm thick. To the cladding layer, applied was a core resin, UV-curable acrylic resin (having a refractive index, n of 1.49). Then, a 100-µm thick ARTON film member (by JSR) was gradually laminated on it, while pressed by a rubber roll. This was then cured through exposure to UV rays at 800 mJ/cm² to form a core layer of 1.8 µm thick. Through the process, the filmy member was laminated to the core/cladding layers. Next, the integrated structure of the cladding layer/core layer/ARTON film was peeled from the metal stamper. Thus fabricated, this is a transparent stamper.

Next, a cladding resin, UV-curable acrylic resin (having a refractive index, n of 1.49) was applied to a glass substrate of 1.6 mm thick, and then cured through exposure to UV rays at 800 mJ/cm² to form a cladding layer of 5 µm thick. Onto the cladding layer, a core resin, UV-curable acrylic resin (having a refractive index, n of 1.49) was applied, and then this was gradually laminated with a 100 µm thick ARTON filmy member (by JSR) while pressed by a rubber roll. Then, this was exposed to UV rays at 800 mJ/cm² whereby the filmy member was laminated to the core/cladding layers.

To the filmy member, applied was a core resin, UV-curable acrylic resin (having a refractive index, n of 1.49), and then cured through exposure to UV rays at 2400 mJ/cm² to form a core layer of 1.8 µm thick. A cladding resin, UV-curable acrylic resin (having a refractive index, n of 1.49) was applied onto it, and cured through exposure to UV rays at 800 mJ/cm² to form a cladding layer of 5 µm thick. Then, a cladding resin, UV-curable acrylic resin (having a refractive index, n of 1.49) was further applied onto it, and the transparent stamper prepared in the above was gradually laminated on it, while pressed by a rubber roll. The patterning face of the stamper faces the cladding resin. With that, this was exposed to UV rays at 10 mJ/cm² to thereby partly imperfectly cure the cladding layer (partly imperfectly curing step). Next, only the transparent stamper was peeled off. Then, this was exposed to UV rays at 800 mJ/cm² to thereby cure the cladding layer. As a result, a cladding layer of 12 µm thick was formed. Onto the cladding layer, a core resin, UV-curable acrylic resin (having a refractive index, n of 1.49) was applied, and then cured through exposure to UV rays at 2400 mJ/cm² to form a core layer of 1.8 µm thick. The refractive index of the core layer and the cladding layer formed was 1.52 and 1.51, respectively.

Next, a cladding resin, UV-curable acrylic resin (having a refractive index, n of 1.49) was applied onto it and cured through exposure to UV rays at 800 mJ/cm² to a cladding layer of 12 µm thick. Finally, the one-layered structure formed on the ARTON film was peeled from the glass substrate to obtain an optical memory device.

Using a dicing saw, this was cut into a sample piece having a length of about 2 cm and a width of about 3 cm. A laser ray was introduced into the sample in a predetermined direction, and the sample was thus evaluated. In this test, no clamp for sample alignment was used. The laser ray used is from a semiconductor laser, having a wavelength of 680 nm and an intensity of about 4 mW. This was combined with a lens so that its beam was focused to have a length of 4 µm and a width of about 1 cm. Thus controlled, the beam was applied to the core layer of the sample. The width of the region in which the data are reconstructed in the layer was 6.5 mm.

As a result, the sample warped too much, and the laser could not introduce into the entire region of the data-recorded area of the core layer. Accordingly, only a part of the image that corresponds to the area having received the laser ray (a part of the intended image) could be observed.

The degree of bending of the core layer was measured, and it was 2300 µm. The incident laser width is 4 µm, and the core thickness is 1.8 µm. Therefore, the acceptable level of core layer bending is 2.2 µm. The test data confirm that the degree of bending of the core layer is outside the acceptable range. In addition, the degree of bending of the lowermost face of the sample was measured, and it was 2300 µm.

Next, measuring the degree of inclination of each layer was tried by controlling the inclination of the incident layer. However, since the sample was bent too much, and the test was impossible.

Example 2

A cladding resin, UV-curable acrylic resin (having a refractive index, n of 1.49) was applied onto a nickel stamper having, on its surface, a concave and convex pattern that corresponds to an image information. Then, this was cured through exposure to UV rays at 800 mJ/cm² to form a cladding layer of 5 µm thick.

To the cladding layer, applied was a core resin, UV-curable acrylic resin (having a refractive index, n of 1.49). Then, a 100-µm thick ARTON film member (by JSR) was gradually laminated on it, while pressed by a rubber roll.

This was then cured through exposure to UV rays at 800 mJ/cm² to form a core layer of 1.8 µm thick. Through the process, the filmy member was laminated to the core/cladding layers. Next, the integrated structure of the cladding layer/core layer/ARTON film was peeled from the metal stamper. Thus fabricated, this is a transparent stamper.

Next, a cladding resin, UV-curable acrylic resin (having a refractive index, n of 1.49) was applied to a glass substrate, and then cured through exposure to UV rays at 800 mJ/cm² to form a cladding layer of 5 µm thick. Onto the cladding layer, a core resin, UV-curable acrylic resin (having a refractive index, n of 1.49) was applied, and then this was gradually laminated with a 100-µm thick ARTON filmy member (by JSR) while pressed by a rubber roll. Then, this was exposed to UV rays at 800 mJ/cm² whereby the filmy member was laminated to the core/cladding layers.

To the filmy member, applied was a core resin, UV-curable acrylic resin (having a refractive index, n of 1.49), and then cured through exposure to UV rays at 2400 mJ/cm² to form a core layer of 1.8 µm thick. A cladding resin, UV-curable acrylic resin (having a refractive index, n of 1.49) was further applied onto it, and then the transparent stamper prepared in the above was gradually laminated on it, while pressed by a rubber roll. The patterning face of the stamper faces the cladding resin.

Prior to the lamination, a spacer was provided between the roll and the base stage of laminating apparatus so as to keep constant the distance between the roll and the glass substrate. The spacer was so controlled that its height is higher by from 50 µm to 100 µm than the top face of the transparent stamper laminated to the layers.

With that, this was exposed to UV rays at 10 mJ/cm² to thereby partly imperfectly cure the cladding layer (partly imperfectly curing step). Next, only the transparent stamper was peeled off. Then, this was exposed to UV rays at 800 mJ/cm² to thereby cure the cladding layer.

As a result, a cladding layer of 15 µm thick was formed. Onto the cladding layer, a core resin, UV-curable acrylic resin (having a refractive index, n of 1.49) was applied, and then cured through exposure to UV rays at 2400 mJ/cm² to form a core layer of 1.8 µm thick. The refractive index of the core layer and the cladding layer formed was 1.52 and 1.51, respectively. This step was repeated 20 times and a multi-layered structure comprising 20 core layers and 20 cladding layers was fabricated.

Next, a cladding resin, UV-curable acrylic resin (having a refractive index, n of 1.49) was applied to the structure and then cured through exposure to UV rays at 800 mJ/cm² to form a cladding layer of 15 µm thick. Onto the cladding layer, applied was a core resin, UV-curable acrylic resin (having a refractive index, n of 1.49), and then this was gradually laminated with a 100-µm thick ARTON film member (by JSR), while pressed by a rubber roll. With that, this was exposed to UV rays at 800 mJ/cm² to thereby laminate the filmy member onto the core/cladding layers. Finally, the 20-layered structure sandwiched between the ARTON films was peeled from the glass substrate to obtain an optical memory device.

Using a dicing saw, this was cut into a sample piece having a length of about 2 cm and a width of about 3 cm. A laser ray was introduced into the sample in a predetermined direction, and the sample was thus evaluated. In this test, no clamp for sample alignment was used. The laser ray used is from a semiconductor laser, having a wavelength of 680 nm and an intensity of about 5 mW. This was combined with a lens so that its beam was focused to have a length of 4 µm and a width of about 1 cm. Thus controlled, the beam was applied to one core layer of the sample. The width of the region in which the data are reconstructed (information area) in the layer was 2.7 mm.

As a result, the laser ray passed through the core layer, while scattering a little on the concave and convex pattern of the layer. The scattered light ran in the vertical direction and reconstructed an image. The image was directly projected on CCD and observed. It was confirmed that the projected image was just the predetermined image (test pattern). The core layer to receive the laser ray was changed, and all the 20 core layers were tested in the same manner as above. The results confirmed that the image reconstructed in each layer has no influence on the other images reconstructed in the other layers, and the image can be independently read out. Once controlled for one layer, the laser inclination did not require any additional control for all the other layers. With no additional laser control, the information was correctly read out from all the other layers.

The degree of inclination of each layer was measured by controlling the inclination of the incident layer. The data are plotted as in FIG. 16. In this Example, the face of the lowermost core layer (first core layer) is defined as the standard face. The incident laser width is 4 µm and the core thickness is 1.8 µm. Therefore, the acceptable maximum degree of inclination of the core layer is 2.2 µm. The test data confirm that the degree of inclination of each layer is within the acceptable range.

Next, the degree of inclination of the lowermost core layer face (this is the standard face for measurement) and that of the lowermost sample face were measured, and they were both 0.1 µm. Accordingly, it is understood that even when the lowermost face of the device is the standard face, 20 layers constituting the device are all within the acceptable range. This means that the information reading from this device is possible with no inclination control.

In addition, the degree of bending of the core layer was measured, and it was 1.2 µm. The incident laser width is 4 µm, and the core thickness is 1.8 µm. Therefore, the acceptable level of core layer bending is 2.2 µm. The test data confirm that the degree of bending of the core layer is within the acceptable range. Further, the degree of bending of the lowermost face of the sample was measured, and it was 1.2 µm.

Comparative Example 2

A cladding resin, UV-curable acrylic resin (having a refractive index, n of 1.49) was applied onto a nickel stamper having, on its surface, a concave and convex pattern that corresponds to an image information. Then, this was cured through exposure to UV rays at 800 mJ/cm² to form a cladding layer of 5 µm thick. To the cladding layer, applied was a core resin, UV-curable acrylic resin (having a refractive index, n of 1.49). Then, a 100-µm thick ARTON film member (by JSR) was gradually laminated on it, while pressed by a rubber roll. This was then cured through exposure to UV rays at 800 mJ/cm² to form a core layer of 1.8 µm thick. Through the process, the filmy member was laminated to the core/cladding layers. Next, the integrated structure of the cladding layer/core layer/ARTON film was peeled from the metal stamper. Thus fabricated, this is a transparent stamper.

Next, a cladding resin, UV-curable acrylic resin (having a refractive index, n of 1.49) was applied to a glass substrate, and then cured through exposure to UV rays at 800 mJ/cm² to form a cladding layer of 5 µm thick. Onto the cladding layer, a core resin, UV-curable acrylic resin (having a refractive index, n of 1.49) was applied, and then this was gradually laminated with a 100-μm thick ARTON filmy member (by JSR) while pressed by a rubber roll. Then, this was exposed to UV rays at 800 mJ/cm$^2$ whereby the filmy member was laminated to the core/cladding layers.

To the filmy member, applied was a core resin, UV-curable acrylic resin (having a refractive index, n of 1.49), and then cured through exposure to UV rays at 2400 mJ/cm$^2$ to form a core layer of 1.8 μm thick. A cladding resin, UV-curable acrylic resin (having a refractive index, n of 1.49) was applied onto it, and the transparent stamper prepared in the above was gradually laminated on it, while pressed by a rubber roll. The patterning face of the stamper faces the cladding resin. In this stage, the distance between the roll and the glass substrate was not specifically controlled, and no spacer was provided between the roll and the base stage of laminating apparatus.

This was exposed to UV rays at 10 mJ/cm$^2$ to thereby partly imperfectly cure the cladding layer (partly imperfectly curing step). Next, only the transparent stamper was peeled off. Then, this was exposed to UV rays at 800 mJ/cm$^2$ to thereby cure the cladding layer. As a result, a cladding layer of 15 μm thick was formed. Onto the cladding layer, a core resin, UV-curable acrylic resin (having a refractive index, n of 1.49) was applied, and then cured through exposure to UV rays at 2400 mJ/cm$^2$ to form a core layer of 1.8 μm thick. The refractive index of the core layer and the cladding layer formed was 1.52 and 1.51, respectively. This step was repeated 20 times and a multi-layered structure comprising 20 core layers and 20 cladding layers was fabricated.

Next, a cladding resin, UV-curable acrylic resin (having a refractive index, n of 1.49) was applied to the structure and then cured through exposure to UV rays at 800 mJ/cm$^2$ to form a cladding layer of 15 μm thick. Onto the cladding layer, applied was a core resin, UV-curable acrylic resin (having a refractive index, n of 1.49), and then this was gradually laminated with a 100-μm thick ARTON film member (by JSR), while pressed by a rubber roll. With that, this was exposed to UV rays at 800 mJ/cm$^2$ to thereby laminate the filmy member onto the core/cladding layers. Finally, the 20-layered structure sandwiched between the ARTON films was peeled from the glass substrate to obtain an optical memory device.

Using a dicing saw, this was cut into a sample piece having a length of about 2 cm and a width of about 3 cm. A laser ray was introduced into the sample in a predetermined direction, and the sample was thus evaluated. The laser ray used is from a semiconductor laser, having a wavelength of 680 nm and an intensity of about 5 mW. This was combined with a lens so that its beam was focused to have a length of 4 μm and a width of about 1 cm. Thus controlled, the beam was applied to one core layer of the sample. The width of the region in which the data are reconstructed (information area) in the layer was 2.7 mm.

As a result, the laser ray passed through the core layer, while scattering a little on the concave and convex pattern of the layer. The scattered light ran in the vertical direction and reconstructed an image. The image was directly projected on CCD and observed. It was confirmed that the projected image was just the predetermined image (test pattern). The core layer to receive the laser ray was changed, and all the 20 core layers were tested in the same manner as above. The results confirmed that the image reconstructed in each layer has no influence on the other images reconstructed in the other layers, and the image can be independently read out.

However, even though once controlled for one layer, the laser inclination further required additional control for all the other layers. With no additional laser control, the information could not correctly readout from all the other layers. The degree of inclination of each layer was measured by controlling the inclination of the incident layer. The data are plotted as in FIG. 17.

In this Example, the face of the lower most core layer (first core layer) is defined as the standard face. The incident laser width is 4 μm and the core thickness is 1.8 μm. Therefore, the acceptable maximum degree of inclination of the core layer is 2.2 μm. The test data confirm that the degree of inclination of each layer is not within the acceptable range based on the standard face The degree of bending of the core layer measured was 1.2 μm; and the degree of bending of the lowermost sample face was 1.2 μm.

Example 3

A cladding resin, UV-curable acrylic resin (having a refractive index, n of 1.49) was applied onto a nickel stamper having, on its surface, a concave and convex pattern that corresponds to an image information. Then, this was cured through exposure to UV rays at 800 mJ/cm$^2$ to form a cladding layer of 5 μm thick. To the cladding layer, applied was a core resin, UV-curable acrylic resin (having a refractive index, n of 1.49). Then, a 100-μm thick ARTON film member (by JSR, having a refractive index, n of 1.51) was gradually laminated on it, while pressed by a rubber roll. This was then cured through exposure to UV rays at 800 mJ/cm$^2$ to form a core layer of 1.8 μm thick. Through the process, the filmy member was laminated to the core/cladding layers. The integrated structure of the cladding layer/core layer/ARTON film was peeled from the metal stamper. Thus fabricated, this is a transparent stamper.

Next, a cladding resin, UV-curable acrylic resin (having a refractive index, n of 1.49) was applied to a 1.6-mm thick glass substrate, and then cured through exposure to UV rays at 800 mJ/cm$^2$ to form a cladding layer of 5 μm thick. Onto the cladding layer, a core resin, UV-curable acrylic resin (having a refractive index, n of 1.49) was applied, and then this was gradually laminated with a 100-μm thick ARTON filmy member (by JSR) while pressed by a rubber roll. Then, this was exposed to UV rays at 800 mJ/cm$^2$ whereby the filmy member was laminated to the core/cladding layers.

To the filmy member, applied was a core resin, UV-curable acrylic resin (having a refractive index, n of 1.49), and then cured through exposure to UV rays at 2400 mJ/cm$^2$ to form a core layer of 1.8 μm thick. A cladding resin, UV-curable acrylic resin (having a refractive index, n of 1.49) was further applied onto it, and then the transparent stamper prepared in the above was gradually laminated on it, while pressed by a rubber roll. The patterning face of the stamper faces the cladding resin. In this stage, the roll was so controlled that the distance between the roll and the glass substrate was kept constant to thereby make the thickness of the cladding layer uniform. With that, this was exposed to UV rays at 10 mJ/cm$^2$ to thereby partly imperfectly cure the cladding layer (partly imperfectly curing step). Next, only the transparent stamper was peeled off. Then, this was exposed to UV rays at 800 mJ/cm$^2$ to thereby cure the cladding layer. As a result, a cladding layer of 15 μm thick was formed. Onto the cladding layer, a core resin, UV-curable acrylic resin (having a refractive index, n of 1.49) was applied, and then cured through exposure to UV rays at 2400 mJ/cm$^2$ to form a core layer of 1.8 μm thick. The refractive index of the core layer and the cladding layer formed was 1.52 and 1.51, respectively. This step was repeated 25 times and a multi-layered structure comprising 25 core layers and 25 cladding layers was fabricated.

Next, a cladding resin, UV-curable acrylic resin (having a refractive index, n of 1.49) was applied to the structure and then cured through exposure to UV rays at 800 mJ/cm$^2$ to form a cladding layer of 15 $\mu$m thick. Onto the cladding layer, applied was a core resin, UV-curable acrylic resin (having a refractive index, n of 1.49), and then this was gradually laminated with a 100-$\mu$m thick ARTON film member (by JSR), while pressed by a rubber roll. With that, this was exposed to UV rays at 800 mJ/cm$^2$ to thereby laminate the filmy member onto the core/cladding layers. Finally, the 25-layered structure sandwiched between the ARTON films was peeled from the glass substrate. The process gave an optical memory device of the 25-layered stacked structure sandwiched between ARTON films.

Using a dicing saw, the thus-fabricated optical memory device was cut into a sample piece having a length of about 1.5 cm and a width of about 2.5 cm. Four and the same samples were thus prepared. The same quantity of an epoxy adhesive was applied to four edges of each sample, not covering the information-recording area thereof, and these four samples (units) were stacked up under pressure uniformly applied to the top of the stacked structure. The optical memory device thus fabricated has a 100-layered structure.

A laser ray was introduced into the sample in a predetermined direction, and the sample was thus evaluated. In this test, no clamp for sample alignment was used. The laser ray used is from a semiconductor laser, having a wavelength of 680 nm and an intensity of about 5 mW. This was combined with a lens so that its beam was focused to have a length of 4 $\mu$m and a width of about 1 cm. Thus controlled, the beam was applied to one core layer of the sample. The width of the region in which the data are reconstructed in the layer (information area) was 6.5 mm.

As a result, the laser ray passed through the core layer, while scattering a little on the concave and convex pattern of the layer. The scattered light ran in the vertical direction and reconstructed an image. The image was directly projected on CCD and observed. It was confirmed that the projected image was just the predetermined image (test pattern). The core layer to receive the laser ray was changed, and all the 100 core layers were tested in the same manner as above. The results confirmed that the image reconstructed in each layer has no influence on the other images reconstructed in the other layers, and the image can be independently read out. Once controlled for one layer, the laser inclination did not require any additional control for all the other layers. With no additional laser control, the information was correctly read out from all the other layers.

The degree of inclination of each layer was measured by controlling the inclination of the incident layer. As a result, the maximum degree of inclination of the core layer was 0.5 $\mu$m. For this, the face of the lowermost core layer (first core layer) is defined as the standard face. The incident laser width is 4 $\mu$m and the core thickness is 1.8 $\mu$m. Therefore, the acceptable maximum degree of inclination of the core layer is 2.2 $\mu$m. The test data confirm that the degree of inclination of each layer is within the acceptable range.

Next, the degree of inclination of the lowermost core layer face (this is the standard face for measurement) and that of the lowermost sample face were measured, and they were both 0.1 $\mu$m. Accordingly, it is understood that even when the lowermost face of the device is defined as the standard face, 100 layers constituting the device are all within the acceptable range. This means that the information reading from this device is possible with no inclination control.

Further, the degree of bending of the core layer was measured, and it was 1.2 $\mu$m. The incident laser width is 4 $\mu$m, and the core thickness is 1.8 $\mu$m. Therefore, the acceptable level of core layer bending is 2.2 $\mu$m. The test data confirm that the degree of bending of the core layer is within the acceptable range. In addition, the degree of bending of the lowermost face of the sample was measured, and it was 1.2 $\mu$m.

Next, the degree of inclination of the standard face of each block was measured. The lowermost core layer face of each block is defined as the standard face of the block. And the standard face of the lowermost block is defined as the standard face of the optical memory device. Using these standard faces, the degree of inclination of each block was measured.

The degree of inclination of the each block was 0 $\mu$m, 0 $\mu$m, +0.9 $\mu$m and +0.9 $\mu$m in that order from the lowermost block. The incident laser width (the vertical width of the reference beam irradiation area) is 4 $\mu$m and the core thickness is 1.8 $\mu$m. Therefore, the acceptable degree of inclination, computed according to the formula $x \leq d-t$ (where x indicates the degree of inclination of information area, d indicates the vertical width of reference beam irradiation area, and t indicates the thickness of resinous core layer) is 2.2 $\mu$m. Accordingly, it is understood that the degree of inclination of every unit falls within the acceptable range.

As described in detail hereinabove, the optical memory of the present invention has the advantages that the entire information area of the core layer thereof can uniformly receive the reference beam applied thereto and therefore the device can reconstruct a correct image.

Other advantages of the optical memory device having a stacked structure and its fabrication method of the invention are that the entire information area of every core layer can uniformly receive the reference beam applied thereto, not requiring specific control of the incident lay (reference beam) inclination θ for every core layer, and that the device can therefore correctly and accurately reconstruct the information recorded therein.

Still other advantages of the optical memory device of the invention are that the information recorded therein can be correctly and accurately reconstructed through simple control in reading operation, not requiring any complicated reading device and that the device is suitable to reading automation.

Further advantages of the invention that provides a method and an apparatus for filmy member lamination are that the inclination of the laminated layers is reduced as much as possible when the number of the layers to be stacked up is increased for increasing the recording capacity of the memory device of the stacked structure.

Still further advantages of the optical memory device of the invention are that the device is prevented from warping as much as possible when the number of the constitutive layers is increased for increasing the recording capacity of the device, and that the information recorded in the device can be correctly and accurately reconstructed. In addition, the productivity of the device of the invention is high.

Obviously, numerous modifications and variations of the present invention are possible in light of the above teachings. It is therefore to be understood that within the scope of the appended claims, the invention may be practiced otherwise than as specifically described herein.

This document contains subject matter relating to and claims priority to JP 2002-028605, 2002-028686, and 2002-

031471. The entire content of each of these documents is incorporated herein by reference.

What is claimed is:

1. An optical memory device comprising:
   a core layer;
   a first cladding layer laminated on a first surface of the core layer;
   and a second cladding layer laminated on a second surface of the core layer opposing the first surface to form a waveguide;
   an information area formed on at least one interface between the core layer and the cladding layers and having a concave and convex pattern of information, wherein
   when a reference beam is introduced into the core layer through an end of the waveguide, the information recorded in the concave and convex pattern is reconstructed,
   said information area has a width of at least 2 mm, and a degree of bending of the core layer at the end of the information area in which the concave and convex pattern for information is formed satisfies the condition represented by the following formula:

$$\Delta t \leq d - t$$

where $\Delta t$ indicates the degree of bending of the core layer at the end of the information area,
   d indicates the vertical width of the reference beam, and
   t indicates the thickness of the core layer in the information area.

2. An optical memory device comprising:
   a core layer;
   a cladding layer laminated on a first surface of the core layer;
   and a second cladding layer laminated on a second surface of the core layer opposing the first surface to form a waveguide;
   an information area formed on at least one interface between the core layer and the cladding layers and having a concave and convex pattern of information, wherein
   when a reference beam is introduced into the core layer through an end of the waveguide, the information recorded in the concave and convex pattern is reconstructed,
   said information area has a width of at least 2 mm, and a degree of bending at an end of the device and within a width that corresponds to the width of the information area in which the concave and convex pattern for information is formed satisfies the condition represented by the following formula:

$$\Delta tx \leq d - t$$

where
   $\Delta tx$ indicates the degree of bending, at the end of the device, of the width that corresponds to the width of the information area in an uppermost face or a lowermost face of the device,
   d indicates the vertical width of the reference beam, and
   t indicates the thickness of the core layer in the information area.

3. The optical memory device as claimed in claim 1, wherein the information area width falls between 5 mm and 100 mm.

4. The optical memory device as claimed in claim 1, wherein the core layer and the cladding layer are formed of a curable resin.

5. The optical memory device as claimed in claim 4, wherein the curable resin comprises an acrylic curable resin.

6. The optical memory device as claimed in claim 1 wherein the core layer comprises a resinous core and the first and second cladding layers each comprise resinous cladding layers laminated on both surfaces of the resinous core layer to form the waveguide, said waveguide being one of a plurality of waveguides in a stacked structure that is sandwiched between thin-film base layers.

7. The optical memory device as claimed in claim 6, wherein the width of the information area with the concave and convex pattern for information formed therein falls between 5 mm and 100 mm at the end of the device through which the reference beam is introduced into the resinous core layer.

8. The optical memory device as claimed in claim 6, wherein the resin for the resinous core layer and the resinous cladding layers comprises a curable resin.

9. The optical memory device as claimed in claim 8, wherein the curable resin comprises an acrylic curable resin.

10. The optical memory device as claimed in claim 6, wherein a thickness of each of the thin-film base layers falls between 10 $\mu$m and 500 $\mu$m.

11. The optical memory device as claimed in claim 6, wherein a refractive index difference between the thin-film base layer and the resinous cladding layer and a refractive index difference between the thin-film base layer and the resinous core layer are both at most 0.2.

12. The optical memory device as claimed in claim 1 wherein the core layer and a cladding layer laminated on both surfaces of the core layer forms a waveguide member, said device having at least five of said waveguide members stacked and each having a respective information area with a concave and convex pattern for information formed in at least one interface between the waveguide member's respective core layer and the cladding layer, wherein the stacked structure of the waveguide members has an end through which the reference beam is introduced into each core layer for reconstructing the information recorded in the respective core layer's concave and convex pattern for information, and
   a degree of inclination of the core layer at the end of the device and relative to a standard face of one of the information areas in which the concave and convex pattern for information is formed satisfies the condition represented by the following formula:

$$|a| \leq d - t$$

where
   a indicates the degree of inclination of the core layer at the end of the device and relative to the standard face of the information area,
   d indicates the vertical width of the reference beam, and
   t indicates the thickness of the core layer in the information area.

13. The optical memory device as claimed in claim 12, wherein the standard face is an uppermost face or a lowermost face of the device.

14. The optical memory device as claimed in claim 12, wherein the standard face is a top face or a back face of an outermost core layer of the device.

15. The optical memory device as claimed in claim 12, wherein an incident direction shift of the reference beam between the at least five core layers is at most 200 $\mu$m.

16. The optical memory device as claimed in claim 12, wherein the width of each information area falls between 5 mm and 100 mm.

17. The optical memory device as claimed in claim 12, wherein each core layer and each cladding layer comprises a curable resin.

18. The optical memory device as claimed in claim 17, wherein the curable resin comprises an acrylic curable resin.

19. The optical memory device as claimed in claim 1 wherein the core layer comprises a resinous core layer and the cladding layers comprise resinous cladding layers laminated on both surfaces of the resinous core layer, which forms a waveguide member, said device having at least two stacked structure units, wherein each stacked structure unit comprises one or more waveguide members sandwiched between base layers and each waveguide member has a respective information area having a concave and convex pattern for information formed in at least one interface between the resinous core layer and the resinous cladding layers of the respective waveguide member.

20. The optical memory device as claimed in claim 19, wherein a thickness of the stacked structure sandwiched between the base layers is at most 2 mm.

21. The optical memory device as claimed in claim 19, wherein each of the base layers has a thickness of from 10 μm to 500 μm.

22. The optical memory device as claimed in claim 19, wherein a refractive index difference between any base layer and resinous cladding layer, and a refractive index difference between any base layer and resinous core layer is at most 0.2.

23. The optical memory device as claimed in claim 19, wherein the resinous core layers and the resinous cladding layers each comprise a curable resin.

24. The optical memory device as claimed in claim 23, wherein the curable resin comprises an acrylic curable resin.

25. The optical memory device as claimed in claim 19, further comprising an adhesive layer for bonding the units, wherein the adhesive layer is formed between neighboring units.

26. The optical memory device as claimed in claim 25, wherein the adhesive layer is formed in an entire area that corresponds to one of the information areas with the concave and convex pattern for information formed therein.

27. The optical memory device as claimed in claim 25, wherein a refractive index difference between any adhesive layer and resinous cladding layer and a refractive index difference between any adhesive layer and resinous core layer is at most 0.2.

28. The optical memory device as claimed in claim 25, wherein the adhesive layer is formed in a region outside a region corresponding to one of the information areas with the concave and convex pattern for information formed therein.

29. The optical memory device as claimed in claim 25, wherein at least one concave and convex pattern for information in a waveguide member is designed for magnified image reconstruction and the adhesive layer is formed in a region that shall not have the magnified reconstructed image to be formed from the concave and convex pattern for information.

30. The optical memory device as claimed in claim 19, further comprising an adhesive layer for bonding the units, wherein the adhesive layer is formed to cover an end of each unit.

31. The optical memory device as claimed in claim 30, wherein the adhesive layer is formed at an end of the device not being an end of the device through which the reference beam is introduced into the resinous core layers of each unit.

32. The optical memory device as claimed in claim 19, further comprising a joint member for joining the units, wherein the joint member is formed to cover an end of each unit.

33. The optical memory device as claimed in claim 19, wherein a number of the units is at most 10.

34. The optical memory device as claimed in claim 19, wherein an incident direction shift of the reference beam between the units is at most 200 μm.

35. The optical memory device as claimed in claim 19, wherein a degree of inclination of a standard face of a unit relative to the standard face of the optical memory device in the width of the information area in which the concave and convex pattern for information of the resinous core layer is formed satisfies the condition represented by the following formula:

$$|x| \leq d - t$$

where x indicates the degree of inclination of the standard face of the unit relative to the standard face of the device in the information area width, d indicates the vertical width of the reference beam irradiation area, and t indicates the thickness of the core layer in the information area.

36. The optical memory device as claimed in claim 35, wherein the width of the information area falls between 5 mm and 100 mm.

37. A method for fabricating an optical memory device by stacking a core layer and a cladding layer, the method comprising:

a coating step of coating a base substrate with a photocurable resin to form thereon a core layer or a cladding layer; and a laminating step of laminating the core resin or the cladding resin with a transparent stamper that has a concave and convex pattern formed on its surface and which transmits light for curing the photocurable resin, by the use of a laminate roll applied to the transparent stamper wherein the transparent stamper is laminated onto the core resin or the cladding resin while a distance between the surface of the base substrate coated with the core resin or the cladding resin and the laminate roll is kept constant in the laminating step.

38. The method for fabricating an optical memory device as claimed in claim 37, further comprising:

after the laminating step, performing a step of exposing the transparent stamper to light through its back to thereby partly imperfectly cure the core resin or the cladding resin on the base substrate; and a step of peeling the transparent stamper from the partly imperfectly cured core resin or cladding resin and thereafter further curing the core resin or the cladding resin thus having a concave and convex pattern transferred there onto.

39. A method for fabricating an optical memory device by stacking a core layer and a cladding layer, the method comprising:

a coating step of coating a base substrate with a resin to form thereon a core layer or a cladding layer; and a laminating step of laminating the core resin or the cladding resin with a resin film by the use of a laminate roll, wherein the resin film is laminated onto the core resin or the cladding resin while a distance between the core resin or the cladding resin and the laminate roll is kept constant in the laminating step.

40. A method of lamination with a filmy member, comprising:
- a step of coating a base substrate with a layer of resin material; and
- a step of laminating the resin layer with a filmy member by the use of a roll, wherein the filmy member is laminated onto the resin-coated base substrate while a distance between the resin-coated surface of the base substrate and the roll is kept constant in the laminating step.

41. An apparatus for laminating a base substrate with a filmy member via a resin layer therebetween, comprising:
- a stage for mounting thereon the base substrate to be laminated with the filmy member;
- a laminate roll by which the filmy member is laminated onto the resin layer formed on the surface of the base substrate to be laminated with the filmy member; and
- an alignment controller configured to control the height of the laminate roll from the stage so that a distance between the stage and the laminate roll is not lower than a predetermined level.

42. The apparatus of lamination with a filmy member as claimed in claim 41, wherein the alignment controller comprises a spacer mounted on the stage and the spacer is for controlling the laminate roll and the stage so that the distance between the two is not lower than a predetermined level.

43. The apparatus of lamination with a filmy member as claimed in claim 42, wherein the spacer is positioned at opposite ends of the laminate roll so as to be able to control the two ends of the laminate roll.

44. The apparatus of lamination with a filmy member as claimed in claim 42, wherein a height A of the spacer is larger than a height B between a surface of the stage and a surface of the filmy member laminated to the base substrate via the resin layer therebetween.

45. The apparatus of lamination with a filmy member as claimed in claim 44, wherein a difference, α, between the height A of the spacer and the height B is from 0 mm to 2 mm.

46. The optical memory device as claimed in claim 2, wherein the information area width falls between 5 mm and 100 mm.

47. The optical memory device as claimed in claim 2, wherein the core layer and the cladding layer are formed of a curable resin.

48. The optical memory device as claimed in claim 47, wherein the curable resin comprises an acrylic curable resin.

49. The optical memory device as claimed in claim 2 wherein the core layer comprises a resinous core and the first and second cladding layers each comprise resinous cladding layers laminated on both surfaces of the resinous core layer to form the waveguide, said waveguide being one of a plurality of waveguides in a stacked structure that is sandwiched between thin-film base layers.

50. The optical memory device as claimed in claim 49, wherein the width of the information area with the concave and convex pattern for information formed therein falls between 5 mm and 100 mm at the end of the device through which the reference beam is introduced into the resinous core layer.

51. The optical memory device as claimed in claim 49, wherein the resin for the resinous core layer and the resinous cladding layers comprises a curable resin.

52. The optical memory device as claimed in claim 51, wherein the curable resin comprises an acrylic curable resin.

53. The optical memory device as claimed in claim 49, wherein a thickness of each of the thin-film base layers falls between 10 $\mu$m and 500 $\mu$m.

54. The optical memory device as claimed in claim 49, where in a refractive index difference between the thin-film base layer and the resinous cladding layer and a refractive index difference between the thin-film base layer and the resinous core layer are both at most 0.2.

55. The optical memory device as claimed in claim 2 wherein the core layer and a cladding layer laminated on both surfaces of the core layer forms a waveguide member, said device having at least five of said waveguide members stacked and each having a respective information area with a concave and convex pattern for information formed in at least one interface between the waveguide member's respective core layer and the cladding layer, wherein the stacked structure of the waveguide members has an end through which the reference beam is introduced into each core layer for reconstructing the information recorded in the respective core layer's concave and convex pattern for information, and
- a degree of inclination of the core layer at the end of the device and relative to a standard face of one of the information areas in which the concave and convex pattern for information is formed satisfies the condition represented by the following formula:

$$|a| \leq d-t$$

where
- a indicates the degree of inclination of the core layer at the end of the device and relative to the standard face of the information area,
- d indicates the vertical width of the reference beam, and
- t indicates the thickness of the core layer in the information area.

56. The optical memory device as claimed in claim 55, wherein the standard face is an uppermost face or a lowermost face of the device.

57. The optical memory device as claimed in claim 55, wherein the standard face is a top face or a back face of an outermost core layer of the device.

58. The optical memory device as claimed in claim 55, wherein an incident direction shift of the reference beam between the at least five core layers is at most 200 $\mu$m.

59. The optical memory device as claimed in claim 55, wherein the width of each information area falls between 5 mm and 100 mm.

60. The optical memory device as claimed in claim 55, wherein each core layer and each cladding layer comprises a curable resin.

61. The optical memory device as claimed in claim 60, wherein the curable resin comprises an acrylic curable resin.

62. The optical memory device as claimed in claim 2 wherein the core layer comprises a resinous core layer and the cladding layers comprise resinous cladding layers laminated on both surfaces of the resinous core layer, which forms a waveguide member, said device having at least two stacked structure units, wherein each stacked structure unit comprises one or more waveguide members sandwiched between base layers and each waveguide member has a respective information area having a concave and convex pattern for information formed in at least one interface between the resinous core layer and the resinous cladding layers of the respective waveguide member.

63. The optical memory device as claimed in claim 62, wherein a thickness of the stacked structure sandwiched between the base layers is at most 2 mm.

64. The optical memory device as claimed in claim 62, wherein each of the base layers has a thickness of from 10 μm to 500 μm.

65. The optical memory device as claimed in claim 62, wherein a refractive index difference between any base layer and resinous cladding layer, and a refractive index difference between any base layer and resinous core layer is at most 0.2.

66. The optical memory device as claimed in claim 62, wherein the resinous core layers and the resinous cladding layers each comprise a curable resin.

67. The optical memory device as claimed in claim 66, wherein the curable resin comprises an acrylic curable resin.

68. The optical memory device as claimed in claim 62, further comprising an adhesive layer for bonding the units, wherein the adhesive layer is formed between neighboring units.

69. The optical memory device as claimed in claim 68, wherein the adhesive layer is formed in an entire area that corresponds to one of the information areas with the concave and convex pattern for information formed therein.

70. The optical memory device as claimed in claim 68, wherein a refractive index difference between any adhesive layer and resinous cladding layer and a refractive index difference between any adhesive layer and resinous core layer is at most 0.2.

71. The optical memory device as claimed in claim 68, wherein the adhesive layer is formed in a region outside a region corresponding to one of the information areas with the concave and convex pattern for information formed therein.

72. The optical memory device as claimed in claim 68, wherein at least one concave and convex pattern for information in a waveguide member is designed for magnified image reconstruction and the adhesive layer is formed in a region that shall not have the magnified reconstructed image to be formed from the concave and convex pattern for information.

73. The optical memory device as claimed in claim 62, further comprising an adhesive layer for bonding the units, wherein the adhesive layer is formed to cover an end of each unit.

74. The optical memory device as claimed in claim 73, wherein the adhesive layer is formed at an end of the device not being an end of the device through which the reference beam is introduced into the resinous core layers of each unit.

75. The optical memory device as claimed in claim 62, further comprising a joint member for joining the units, wherein the joint member is formed to cover an end of each unit.

76. The optical memory device as claimed in claim 62, wherein a number of the units is at most 10.

77. The optical memory device as claimed in claim 62, wherein an incident direction shift of the reference beam between the units is at most 200 μm.

78. The optical memory device as claimed in claim 62, wherein a degree of inclination of a standard face of a unit relative to the standard face of the optical memory device in the width of the information area in which the concave and convex pattern for information of the resinous core layer is formed satisfies the condition represented by the following formula:

$$|x| \leq d - t$$

where x indicates the degree of inclination of the standard face of the unit relative to the standard face of the device in the information area width, d indicates the vertical width of the reference beam irradiation area, and t indicates the thickness of the core layer in the information area.

79. The optical memory device as claimed in claim 78, wherein the width of the information area falls between 5 mm and 100 mm.

80. A method of fabricating an optical memory device by stacking a core layer and a cladding layer, comprising:

step for coating a base substrate with a photocurable resin to form thereon a core layer or a cladding layer; and step for laminating the core resin or the cladding resin with a transparent stamper that has a concave and convex pattern formed on its surface and that transmits light of curing the photocurable resin, by use of a laminate roll applied to the transparent stamper; and step for keeping a constant distance between the surface of the base substrate coated with the core resin or the cladding resin and the laminate roll during the step for laminating.

81. An optical memory device comprising:

a core layer;

a first cladding layer laminated on a first surface of the core layer; and a second cladding layer laminated on a second surface of the core layer opposing the first surface to form a waveguide;

means for storing information on at least one interface between the core layer and the cladding layers, wherein when a reference beam is introduced into the core layer through an end of the waveguide, the information recorded in the means for recording information is reconstructed, said means for recording information has a width of at least 2 mm, and a degree of bending of the core layer at an end of the means for recording information satisfies the condition represented by the following formula:

$$\Delta t \leq d - t$$

where $\Delta t$ indicates the degree of bending of the core layer at the end of the means for recording information, d indicates the vertical width of the reference beam, and t indicates the thickness of the core layer in the means for recording information.

* * * * *